(12) United States Patent
Iida et al.

(10) Patent No.: US 9,349,961 B2
(45) Date of Patent: May 24, 2016

(54) ORGANIC ELECTROLUMINESCENT ELEMENT MATERIAL, ORGANIC ELECTROLUMINESCENT ELEMENT COMPOSITION, ORGANIC ELECTROLUMINESCENT ELEMENT, DISPLAY DEVICE, AND LIGHTING DEVICE

(75) Inventors: Koichiro Iida, Kanagawa (JP); Hideki Gorohmaru, Kanagawa (JP); Yanjun Li, Kanagawa (JP); Tatsushi Baba, Kanagawa (JP); Tomomi Okamoto, Kanagawa (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 209 days.

(21) Appl. No.: 13/571,442

(22) Filed: Aug. 10, 2012

(65) Prior Publication Data

US 2013/0200337 A1 Aug. 8, 2013

Related U.S. Application Data

(63) Continuation of application No. PCT/JP2011/052776, filed on Feb. 9, 2011.

(30) Foreign Application Priority Data

Feb. 10, 2010 (JP) ................................ 2010-027585

(51) Int. Cl.
| | | |
|---|---|---|
| H01L 51/54 | (2006.01) | |
| H01L 51/00 | (2006.01) | |
| C08G 73/02 | (2006.01) | |
| H01L 51/50 | (2006.01) | |

(52) U.S. Cl.
CPC .......... H01L 51/0039 (2013.01); C08G 73/026 (2013.01); H01L 51/0035 (2013.01); H01L 51/5016 (2013.01)

(58) Field of Classification Search
None
See application file for complete search history.

(56) References Cited

U.S. PATENT DOCUMENTS

| | | | |
|---|---|---|---|
| 6,034,206 A | 3/2000 | Yamamoto et al. | |
| 2005/0164034 A1* | 7/2005 | Park et al. | 428/690 |
| 2007/0228364 A1* | 10/2007 | Radu et al. | 257/40 |
| 2009/0036622 A1* | 2/2009 | Marrocco et al. | 526/241 |
| 2011/0042661 A1* | 2/2011 | Endo et al. | 257/40 |
| 2011/0192464 A1 | 8/2011 | Urano et al. | |
| 2014/0051827 A1 | 2/2014 | Endo et al. | |

FOREIGN PATENT DOCUMENTS

| | | |
|---|---|---|
| EP | 0052961 A1 | 6/1982 |
| JP | 50-88200 A | 7/1975 |
| JP | 57-154248 A | 9/1982 |
| JP | 11-80347 A | 3/1999 |
| JP | 2001-64642 A | 3/2001 |
| JP | 2003-316043 A | 11/2003 |
| JP | 2004-224766 A | 8/2004 |
| JP | 2009-74074 A | 4/2009 |
| JP | 2009-117800 A | 5/2009 |
| JP | 2009-287000 A | 12/2009 |
| JP | 2010118653 A * | 5/2010 |
| TW | 200942564 A1 | 10/2009 |
| WO | WO 99/32926 A1 | 7/1999 |
| WO | WO 2008/032843 A1 | 3/2008 |
| WO | WO 2008/038747 A1 | 4/2008 |
| WO | WO 2009/102027 A1 | 8/2009 |
| WO | WO 2009102027 A1 * | 8/2009 .............. H01L 51/00 |

OTHER PUBLICATIONS

Machine translation of JP2009-074074. Date of publication: Apr. 9, 2009.*
Machine of translation of JP2010-118653. Date of publication: May 27, 2010.*
Office Action Issued Jun. 10, 2014 in Japanese Patent Application No. 2011-021430 (with English language translation).
International Search Report issued May 17, 2011 in PCT/JP2011/052776.
Steffen Jungermann, et al. "Novel Photo-Cross-Linkable Hole-Transporting Polymers: Synthesis, Characterization, and Application in Organic Light Emitting Diodes", Macromolecules, vol. 39, No. 26, 2006, pp. 8911-8919.
Chinese Office Action issued Aug. 30, 2013, in China Patent Application No. 201180008737.2 (with English Translation).
Office Action issued on May 7, 2014 in the corresponding Chinese Patent Application No. 201180008737.2 (with English Translation).
Taiwan Office Action issued Dec. 29, 2014, in Taiwanese Patent Application No. 100104376 filed Feb. 10, 2011 (with English translation).

(Continued)

*Primary Examiner* — Andrew K Bohaty

(74) *Attorney, Agent, or Firm* — Oblon, McClelland, Maier & Neustadt, L.L.P

(57) ABSTRACT

A polymer comprising a repeating unit represented by the following formula (1) and a cross-linkable group

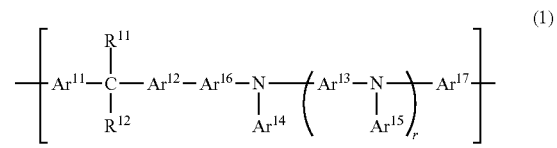

wherein $Ar^{11}$ to $Ar^{17}$, $R^{11}$, $R^{12}$ and r are as defined; and an organic electroluminescent element containing at least one organic layer containing a network polymer formed by cross-linking the polymer, the layer being a hole injection layer or a hole transporting layer.

15 Claims, 1 Drawing Sheet

(56) References Cited

OTHER PUBLICATIONS

Office Action issued Sep. 30, 2014, in Chinese Patent Application No. 201180008737.2 filed Feb. 9, 2011 (with English translation).

Japanese Office Action issued in corresponding Japanese Patent Application No. 2011-021430 mailed Feb. 24, 2015 with English translation.

Decision of Rejection issued Sep. 11, 2015, in Taiwanese Patent Application No. 100104376 filed Feb. 10, 2011 (with English translation).

* cited by examiner

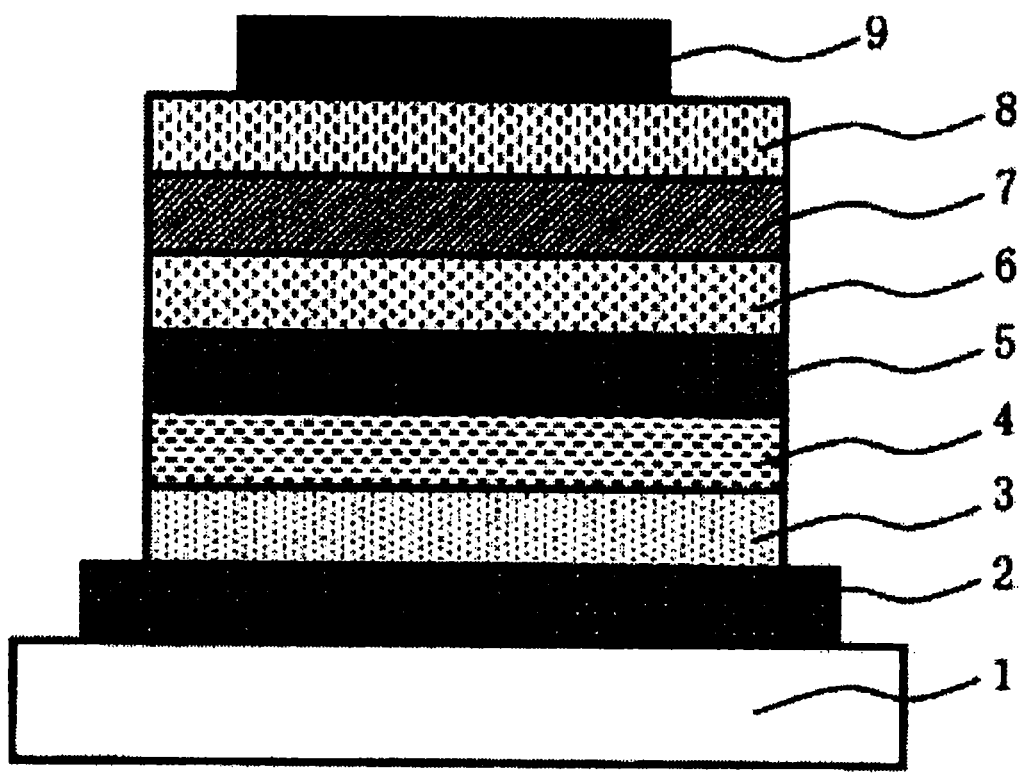

ORGANIC ELECTROLUMINESCENT ELEMENT MATERIAL, ORGANIC ELECTROLUMINESCENT ELEMENT COMPOSITION, ORGANIC ELECTROLUMINESCENT ELEMENT, DISPLAY DEVICE, AND LIGHTING DEVICE

TECHNICAL FIELD

The present invention relates to a polymer and, particularly, to a polymer useful for a hole injection layer and a hole-transporting layer, an organic electroluminescent element material, an organic electroluminescent element composition and an organic electroluminescent element containing the polymer, and a display device and a lighting device which each have the organic electroluminescent element.

BACKGROUND ART

In recent years, development of an electroluminescent element using an organic thin film (i.e., organic electroluminescent element) has been made. As a method for forming an organic thin film in the organic electroluminescent element, there are illustrated, for example, a vacuum deposition method and a wet film formation method.

The wet film formation method has such advantages as that it does not require a vacuum process, that it facilitates increase in size, and that a plurality of materials having various functions can be incorporated in one layer or in a coating solution for forming the layer. However, the wet film formation method has a difficulty in forming multiple layers. Therefore, elements produced by the wet film formation method are inferior to elements produced by the vacuum deposition method in driving stability, and have not reached a practical level with a few exceptions. In particular, although formation of two layers is possible by using, for example, an organic solvent and an aqueous solvent, formation of three or more layers has been difficult.

In order to solve such problem in forming multiple layers, patent documents 1 and 2 have proposed polymers (Q-1) and (Q-2) having fluorene rings and cross-linkable groups, wherein it is disclosed that multiple layers are formed by utilizing the fact that a network polymer obtained when these cross-linkable groups are reacted is insoluble in an organic solvent.

[Ka 1]

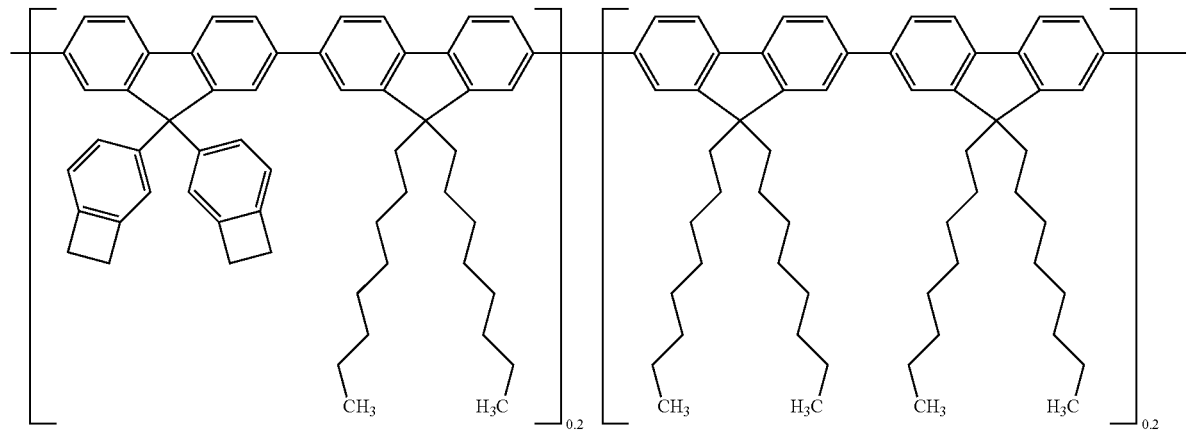

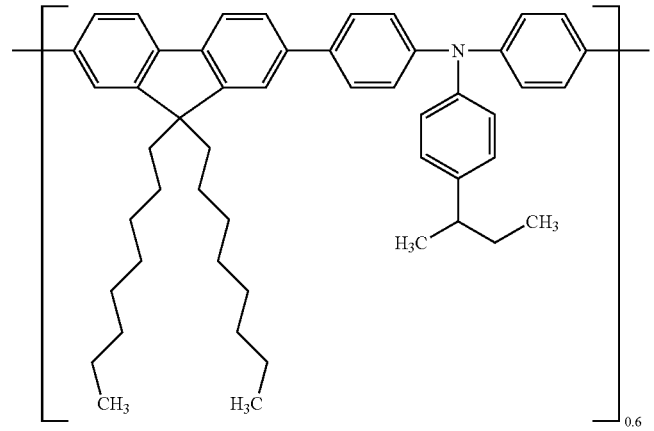

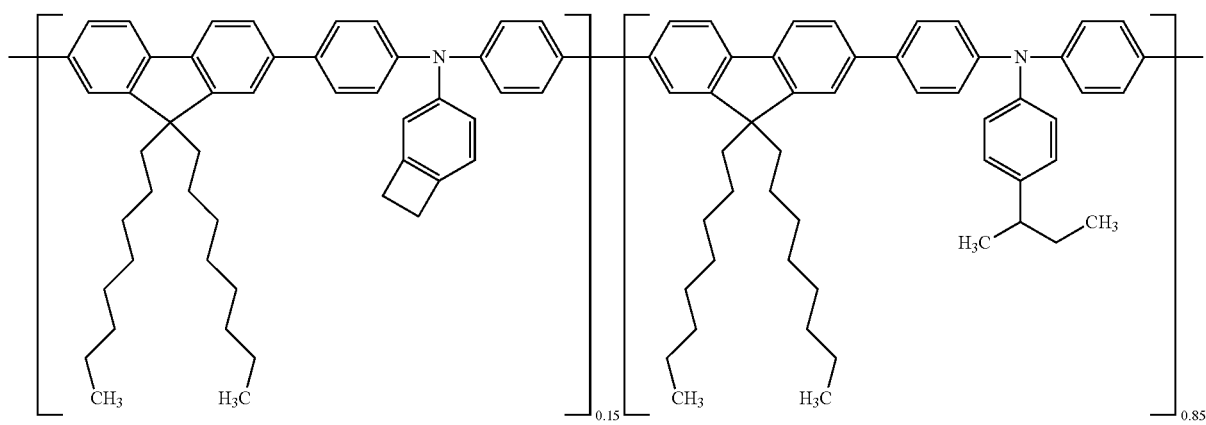

Also, patent documents 3 to 5 have proposed to use a triarylamine-containing polymer having a methylene group in the main chain thereof for an electrochromic element, an electroluminescent element, or for an electrophotographic photoconductor. In particular, patent document 4 discloses to use a polymer (Q-3) for a hole-transporting material in an organic electroluminescent element.

[Ka 2]

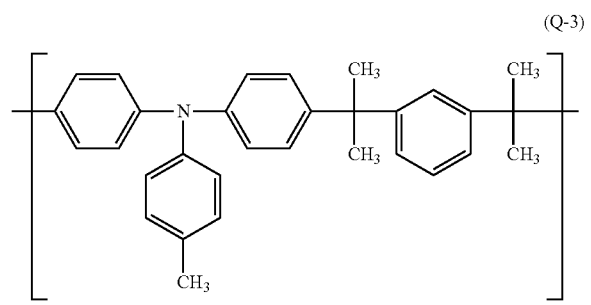

RELATED ART DOCUMENTS

Patent Documents

Patent Document 1: WO2008/032843
Patent Document 2: WO2008/038747
Patent Document 3: WO1999/032926
Patent Document 4: JP-A-2001-064642
Patent Document 5: JP-A-2003-316043

SUMMARY OF THE INVENTION

Problems to be Solved by the Invention

When the aforesaid polymers (Q-1) and (Q-2) undergo crosslinking to form a network polymer, their essentially rigid main chain structure will be bent or twisted to suffer serious reduction in charge transporting ability and oxidation-reduction stability. Further, π-conjugation systems in the main chain structure of the polymer will aggregate and form J-aggregate to produce a new markedly low excited singlet level and a new markedly low excited triplet level. The markedly low excited singlet level and markedly low excited triplet level respectively deactivate an excited singlet state and an excited triplet state, thus causing reduction in light-emitting efficiency of a fluorescent light-emitting element and a phosphorescent light-emitting element.

Therefore, the organic electroluminescent elements obtained by the techniques described in patent documents 1 and 2 have the problems that the operating voltage is high, that the light-emitting efficiency is low, and that the drivable life is short.

Further, patent documents 3 to 5 illustrate triarylamine-containing polymers having a methylene group in the main chain thereof, but they do not describe cross-linkable groups for making them insoluble after coating. Thus, according to the techniques described in patent documents 3 to 5, formation of multiple layers by the coating method has been difficult.

Also, polymers such as the foregoing polymer (Q-3) described in patent document 4 have two alkylene groups (quaternary carbon) in the main chain in the repeating unit, with an arylene group existing between the alkylene group (quaternary carbon) and the alkylene group (quaternary carbon) difficulty participating in hole transportation. Thus, there has been the problem that driving voltage for the organic electroluminescent element obtained by the technique described in patent document 4 is high.

The invention has been made with the above-described problems in mind, and an object thereof is to provide a polymer which shows a high excited singlet level and a high excited triplet level, which has excellent charge transporting ability and excellent electrochemical stability, which enables formation of multiple layers, which is scarcely decomposed by energization, and which can provide a uniform film quality, and to provide an organic electroluminescent element containing the polymer, and an organic electroluminescent element composition.

In addition, another object of the invention is to provide an organic electroluminescent element which shows high light-emitting efficiency and high driving stability, and a display device and a lighting device which each have the electroluminescent element.

Means for Solving the Problems

As a result of intensive investigations in order to solve the above-described problems, the inventors have found that a polymer having a specific structure of having an alkylene group (quaternary carbon) in the main chain thereof and having a cross-linkable group enables formation of multiple layers by the wet film formation method, shows a high excited singlet level and a high excited triplet level after being made insoluble in an organic solvent by cross-linking, and has a high hole transporting ability and a high electrochemical stability, and that an organic electroluminescent element obtained by using the polymer has a high light-emitting efficiency, is drivable at a low voltage, and has a high driving stability, thus having completed the invention.

That is, the gist of the invention resides in the following (1) to (11).

(1) A polymer comprising a repeating unit represented by the following general formula (1) and a cross-linkable group:

[Ka 3]

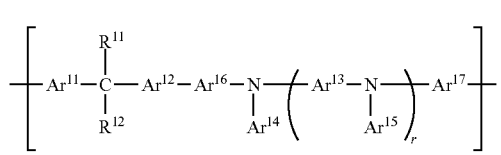

(wherein
$Ar^{11}$ to $Ar^{13}$ each independently represents a divalent aromatic group which may have a substituent,
$Ar^{14}$ and $Ar^{15}$ each independently represents an aromatic group which may have a substituent,
$Ar^{16}$ and $Ar^{17}$ each independently represents a direct bond or a divalent aromatic group which may have a substituent,
$R^{11}$ and $R^{12}$ each independently represents a hydrogen atom, an alkyl group which may have a substituent, an alkoxy group which may have a substituent, or an aromatic group which may have a substituent,
r represents an integer of from 0 to 5, and
$R^{11}$ and $R^{12}$ may be connected to each other to form a ring structure,
in which the repeating unit represented by the above-described general formula (1) may contain the cross-linking group.).

(2) The polymer according to the item (1) above, wherein the cross-linkable group is at least one group selected from the group T of the following cross-linkable groups:
<Cross-Linkable Groups T>

[Ka 4]

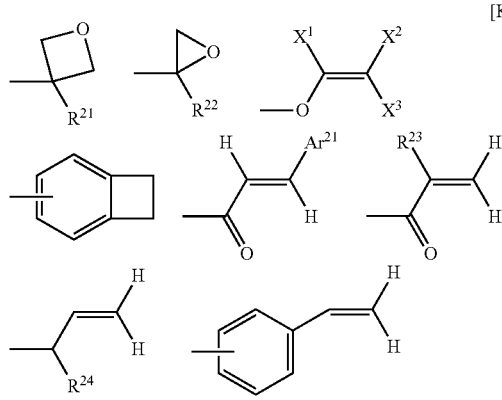

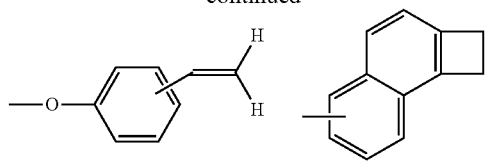

(wherein
$R^{21}$ to $R^{23}$ each independently represents a hydrogen atom or an alkyl group which may have a substituent,
$Ar^{21}$ represents an aromatic group which may have a substituent,
$X^1$, $X^2$, and $X^3$ each independently represents a hydrogen atom or a halogen atom, and
$R^{24}$ represents a hydrogen atom or a vinyl group,
in which the benzocyclobutene ring may have substituent(s), and the substituents may be connected to each other to form a ring.)

(3) The polymer according to the item (1) or (2) above, which has a weight-average molecular weight (Mw) of 20,000 or more and a degree of dispersion (Mw/Mn) of 2.5 or less.

(4) An organic electroluminescent element material comprising the polymer described in any one of the items (1) to (3) above.

(5) An organic electroluminescent element composition comprising the polymer described in any one of the items (1) to (3) above.

(6) An organic electroluminescent element comprising, on a substrate, an anode, a cathode, and one or more organic layers provided between these two electrodes, wherein at least one of the organic layers contains a network polymer formed by cross-linking the polymer described in any one of the items (1) to (3) above.

(7) The organic electroluminescent element according to the item (6) above, wherein the layer containing the network polymer is a hole injection layer or a hole-transporting layer.

(8) The organic electroluminescent element according to the item (6) or (7) above, wherein the layer containing the network polymer is a hole-transporting layer.

(9) The organic electroluminescent element according to the item (7) or (8) above, which further comprises a luminescent layer, and all of the hole injection layer, the hole-transporting layer, and the luminescent layer are formed by a wet film formation method.

(10) A display device comprising the organic electroluminescent element described in any one of the items (6) to (9) above.

(11) A lighting device comprising the organic electroluminescent element described in any one of the items (6) to (9) above.

Advantage of the Invention

The polymer of the present invention enables formation of multiple layers by the wet film formation method, shows a high excited singlet level and a high excited triplet level after being made insoluble in an organic solvent by cross-linking, and has a high hole transporting ability and a high electrochemical stability, thus being useful as a material for an organic electroluminescent element, and the organic electroluminescent element obtained by using the polymer shows a high light-emitting efficiency, can be driven at a low voltage, and shows a driving stability, thus being useful for a display device and a lighting device.

BRIEF DESCRIPTION OF THE DRAWINGS

FIG. 1 is a schematic view showing cross-section of an example of the structure of an organic electroluminescent element in accordance with the present invention.

MODE FOR CARRYING OUT THE INVENTION

The present invention will be described in detail by reference to embodiments and illustrative products in accordance with the invention, but the invention should not be construed to be limited to the following embodiments and illustrative products, and can be carried out by arbitrary alteration within the gist of the invention.

[1. Structure of Polymer]

The polymer of the invention is characterized in that it has a repeating unit represented by the following general formula (1) and has a cross-linkable group.

[Ka 5]

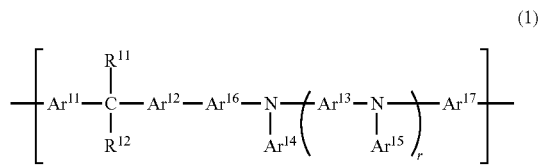

(1)

(In the general formula (1), $Ar^{11}$ to $Ar^{13}$ each independently represents a divalent aromatic group which may have a substituent, $Ar^{14}$ and $Ar^{15}$ each independently represents an aromatic group which may have a substituent, $Ar^{16}$ and $Ar^{17}$ each independently represents a direct bond or a divalent aromatic group which may have a substituent, $R^{11}$ and $R^{12}$ each independently represents a hydrogen atom, an alkyl group which may have a substituent, an alkoxy group which may have a substituent, or an aromatic group which may have a substituent, r represents an integer of from 0 to 5, and $R^{11}$ and $R^{12}$ may be connected to each other to form a ring structure. Additionally, the cross-linking group may be contained in the repeating unit represented by the above-described general formula (1).)

In the repeating unit represented by the above-described general formula (1), only one alkylene group (preferably, an alkylene group containing quaternary carbon) exists. This incorporation of the alkylene group (preferably, an alkylene group containing quaternary carbon), which is not rigid, in the main chain serves to maintain a high charge transporting ability and a high oxidation-reduction stability even after the polymer is made insoluble in an organic solvent by cross-linking thereof. Also, incorporation of the alkylene group (preferably, an alkylene group containing quaternary carbon), which suppresses expansion of the π-conjugation system, in the main chain serves to maintain a high excited singlet level and a high excited triplet level even after the polymer is made insoluble in an organic solvent by cross-linking thereof. Thus, in the case where a layer is formed of a network polymer obtained by cross-linking of the polymer of the invention, the resulting layer can pass an electric current even at a low voltage and scarcely deactivates excitons.

In the polymer having the repeating unit represented by the general formula (1), a nitrogen atom must exist between the alkylene group (preferably an alkylene group containing quaternary carbon) and the alkylene group (preferably an alkylene group containing quaternary carbon). Thus, every $Ar^{11}$ to $Ar^{17}$ can participate in hole transportation. As a result, it may be surmised for the organic electroluminescent element to be driven at a low voltage.

In the general formula (1), $Ar^{11}$ to $Ar^{13}$ each independently represents a divalent aromatic group which may have a substituent, $Ar^{14}$ and $Ar^{15}$ each independently represents an aromatic group which may have a substituent, and $Ar^{16}$ and $Ar^{17}$ each independently represents a direct bond or a divalent aromatic group which may have a substituent.

Here, the term "aromatic group" is the general term for an aromatic hydrocarbon group and an aromatic heterocyclic group.

As the monovalent or divalent aromatic group which may have a substituent and which constitutes $Ar^{11}$ to $Ar^{17}$, there are illustrated, for example, a group derived from a 6-membered single ring or from a 2- to 5-ring-condensed system, such as a benzene ring, a naphthalene ring, an anthracene ring, a phenanthrene ring, a perylene ring, a tetracene ring, a pyrene ring, a benzopyrene ring, a chrysene ring, a triphenylene ring, an acenaphthene ring, a fluoranthene ring, or a fluorene ring, and a group wherein 2 to 4 of these rings are connected to each other.

As the monovalent or divalent aromatic heterocyclic group which may have a substituent and which constitutes $Ar^{11}$ to $Ar^{17}$, there are illustrated, for example, a group derived from a 5- or 6-membered single ring or from a 2- to 4-ring-condensed system, such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrole ring, a thienopyrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, or an azrene ring, and a group wherein 2 to 4 of these rings are connected to each other.

Also, $Ar^{11}$ to $Ar^{17}$ include those groups wherein 2 to 4 of the above-described aromatic hydrocarbon rings and the aromatic heterocyclic groups are connected to each other.

Among them, from the standpoint of solubility and heat resistance, $Ar^{11}$ to $Ar^{17}$ each is preferably a group derived from a ring selected from the group consisting of a benzene ring, a naphthalene ring, an anthracene ring, a phenanthrene ring, a triphenylene ring, a pyrene ring, a thiophene ring, a pyridine ring, and a fluorene ring, or a group wherein 2 to 4 of these rings are connected to each other.

The substituent which the aromatic group in $Ar^{11}$ to $Ar^{17}$ may have is not particularly limited, and there are illustrated, for example, those groups which are selected from a substituent group Z to be described hereinafter.

Additionally, $Ar^{11}$ to $Ar^{17}$ may have one substituent or may have two or more substituents. In the case where they have two or more substituents, the substituents may be the same in kind or may be a combination of two or more kinds with any combination and with any ratio.

$R^{11}$ and $R^{12}$ each independently represents a hydrogen atom, an alkyl group which may have a substituent, an alkoxy group which may have a substituent, or an aromatic group which may have a substituent.

As the alkyl group of $R^{11}$ and $R^{12}$, there are illustrated alkyl groups containing usually 1 or more carbon atoms and containing usually 24 or less, preferably 12 or less, carbon atoms, such as a methyl group and an ethyl group.

As the alkoxy group of $R^{11}$ and $R^{12}$, there are illustrated alkoxy groups containing usually 1 or more carbon atoms and containing usually 24 or less, preferably 12 or less, carbon atoms, such as a methoxy group and an ethoxy group.

As the aromatic group of $R^{11}$ and $R^{12}$, there are illustrated the same groups as the aromatic groups constituting aforesaid $Ar^{14}$ to $Ar^{15}$.

Of the above-described groups, $R^{11}$ and $R^{12}$ each is preferably a group other than hydrogen atom from the standpoint of having a quaternary carbon. In particular, from the standpoint of solubility, $R^{11}$ and $R^{12}$ each is preferably an alkyl group containing from 1 to 12 carbon atoms or an alkoxy group containing from 1 to 12 carbon atoms and, more preferably, is an alkyl group containing from 1 to 12 carbon atoms.

Additionally, the substituent which $R^{11}$ and $R^{12}$ may further have is not particularly limited, and there are illustrated, for example, those groups which are selected from a substituent group Z described below.

(Substituent Group Z)

An alkyl group containing usually 1 or more carbon atoms and containing usually 24 or less, preferably 12 or less carbon atoms, such as a methyl group or an ethyl group;

an alkenyl group containing usually 2 or more carbon atoms and containing usually 24 or less, preferably 12 or less carbon atoms, such as a vinyl group;

an alkynyl group containing usually 2 or more carbon atoms and containing usually 24 or less, preferably 12 or less carbon atoms, such as an ethynyl group;

an alkoxy group containing usually 1 or more carbon atoms and containing usually 24 or less, preferably 12 or less carbon atoms, such as a methoxy group or an ethoxy group;

an aryloxy group containing usually 4 or more carbon atoms, preferably 5 or more carbon atoms and containing usually 36 or less, preferably 24 or less carbon atoms, such as a phenoxy group, a naphthoxy group, or a pyridyloxy group;

an alkoxycarbonyl group containing usually 2 or more carbon atoms and containing usually 24 or less, preferably 12 or less carbon atoms, such as a methoxycarbonyl group or an ethoxycarbonyl group;

a dialkylamino group containing usually 2 or more carbon atoms and containing usually 24 or less, preferably 12 or less carbon atoms, such as a dimethylamino group or a diethylamino group;

a diarylamino group containing usually 10 or more carbon atoms, preferably 12 or more carbon atoms and containing usually 36 or less, preferably 24 or less carbon atoms, such as a diphenylamino group, a ditolylamino group, or an N-carbazolyl group;

an arylalkylamino group containing usually 7 or more carbon atoms and containing usually 36 or less, preferably 24 or less carbon atoms, such as a phenylethylamino group;

an acyl group containing usually 2 or more carbon atoms and containing usually 24 or less, preferably 12 or less carbon atoms, such as an acetyl group or a benzoyl group;

a halogen atom such as a fluorine atom or a chlorine atom;

a haloalkyl group containing usually 1 or more carbon atoms and containing usually 12 or less, preferably 6 or less carbon atoms, such as a trifluoromethyl group;

an alkylthio group containing usually 1 or more carbon atoms and containing usually 24 or less, preferably 12 or less carbon atoms, such as a methylthio group or an ethylthio group;

an arylthio group containing usually 4 or more carbon atoms, preferably 5 or more carbon atoms and containing usually 36 or less, preferably 24 or less carbon atoms, such as a phenylthio group, a naphthylthio group, or a pyridylthio group;

a silyl group containing usually 2 or more carbon atoms, preferably 3 or more carbon atoms and containing usually 36 or less, preferably 24 or less carbon atoms, such as a trimethylsilyl group or a triphenylsilyl group;

a siloxy group containing usually 2 or more carbon atoms, preferably 3 or more carbon atoms and containing usually 36 or less, preferably 24 or less carbon atoms, such as a trimethylsiloxy group or a triphenylsiloxy group;

a cyano group;

an aromatic hydrocarbon cyclic group containing usually 6 or more carbon atoms and containing usually 36 or less, preferably 24 or less carbon atoms, such as a phenyl group or a naphthyl group; and an aromatic heterocyclic group containing usually 3 or more carbon atoms, preferably 4 or more carbon atoms and containing usually 36 or less, preferably 24 or less carbon atoms, such as a thienyl group or a pyridyl group.

Of these substituents, an alkyl group containing 1 to 12 carbon atoms and an alkoxy group containing 1 to 12 carbon atoms are preferred from the standpoint of solubility.

Also, each of the above-described substituents may further have a substituent and, as examples of such substituents, there are illustrated those which are illustrated in the aforesaid substituent group Z. The formula weight of the substituents of $Ar^{11}$ to $Ar^{17}$ including the substituents which are further substituted is preferably 500 or less, more preferably 250 or less. In case when the formula weight of the substituent is too large, there might result reduction of charge transporting ability.

Additionally, the formula weight of $Ar^{11}$ to $Ar^{17}$ is usually 65 or more, preferably 75 or more, and is usually 500 or less, preferably 300 or less, more preferably 200 or less. In case when the formula weight of $Ar^{11}$ to $Ar^{17}$ is too large, there might result serious reduction of solubility before causing cross-linking.

In the general formula (1), r represents the number of repeating unit -$Ar^{13}$-N($Ar^{15}$)-. r is specifically 0 or more, preferably 1 or more, more preferably 2 or more, and is usually 5 or less, preferably 4 or less, more preferably 3 or less. In case when r is too large, there might result reduction of solubility before cross-linking reaction.

$Ar^{11}$ to $Ar^{13}$, and $Ar^{16}$ and $Ar^{17}$ may each be a group wherein 2 or more, monovalent or divalent aromatic groups optionally having a substituent may be connected to each other. Examples of such group include a biphenylene group and a terphenylene group and, from the standpoint of solubility before cross-linking reaction, charge transporting ability, and electric durability, 4,4'-biphenylene group is preferred.

The polymer of the invention must have a cross-linkable group and, because of the presence of the cross-linkable group, the polymer can produce a large difference in solubility for a solvent before and after the reaction to be caused by heat and/or irradiation with actinic energy rays (insolubilization reaction).

The term "cross-linkable group" means a group which reacts, upon application of heat and/or irradiation with actinic energy rays, with the same or different group of other molecule existing in the vicinity thereof, thus producing a new chemical bond.

As the cross-linkable group, there are illustrated, for example, groups shown in a group T of cross-linking groups. The cross-linkable groups in accordance with the invention are not limited only to these groups.

[Group T of Cross-Linkable Groups]

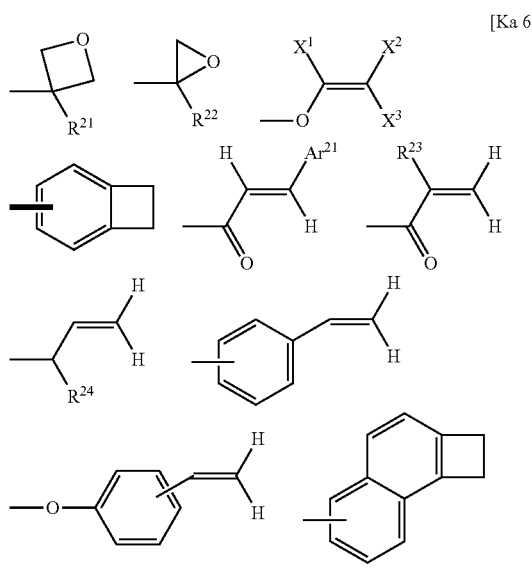

(In the above formulae, $R^{21}$ to $R^{23}$ each independently represents a hydrogen atom or an alkyl group which may have a substituent.

$Ar^{21}$ represents an aromatic group which may have a substituent.

$X^1$, $X^2$, and $X^3$ each independently represents a hydrogen atom or a halogen atom.

$R^{24}$ represents a hydrogen atom or a vinyl group.

The benzocyclobutene ring may have a substituent or substituents, and the substituents may be connected to each other to form a ring.)

As the alkyl group of $R^{21}$ to $R^{23}$, there are illustrated alkyl groups containing usually 1 or more carbon atoms and containing usually 24 or less, preferably 12 or less carbon atoms, such as a methyl group and an ethyl group.

As the aromatic group of $Ar^{21}$, there are illustrated, for example, the same group as the aromatic groups constituting the aforesaid $Ar^{11}$ to $Ar^{17}$.

Additionally, a substituent which $R^{21}$ and $R^{23}$ and $Ar^{21}$ may further have is not particularly limited, and there are illustrated, for example, those groups which are selected from the aforesaid substituent group Z.

From the standpoint of high reactivity and readiness of insolubilization, those groups are preferred which undergo the insolubilization reaction by cationic polymerization, such as a cyclic ether group (e.g., an epoxy group or an oxetane group) and a vinyl ether group. Of them, an oxetane group is particularly preferred in the point of ease of controlling rate of cationic polymerization, and a vinyl ether group is preferred in the point that a hydroxyl group which is liable to deteriorate the electroluminescent element upon cationic polymerization is scarcely produced.

From the standpoint of more improving electrochemical stability, an arylvinylcarbonyl group such as a cinnamoyl group and a group capable of undergoing cycloaddition reaction such as a group derived from a benzocyclobutene ring are preferred.

Also, of the cross-linkable groups, a group derived from a benzocyclobutene ring is particularly preferred from the standpoint of particular stability of the structure after insolubilization.

Specifically, a group represented by the following formula (II-a) is preferred.

(The benzocyclobutene ring in formula (II-a) may have a substituent or substituents. Also, the substituents may be connected to each other to form a ring.)

The cross-linkable group may be connected to the monovalent or divalent aromatic group in the molecule either directly or through a divalent group. Regarding this divalent group, it is preferred to connect to the monovalent or divalent aromatic group through a divalent group formed by linking 1 to 30 groups selected from among —O— group, —C(=O)— group, and —CH$_2$— group (optionally having a substituent) in any order. Specific examples of the cross-linkable group connected via the divalent group, that is, the cross-linking group-containing group, are as shown in the following <group T' of cross-linkable group-containing groups> which, however, do not limit the invention in any way.

<Group T' of Cross-Linkable Group-Containing Groups>

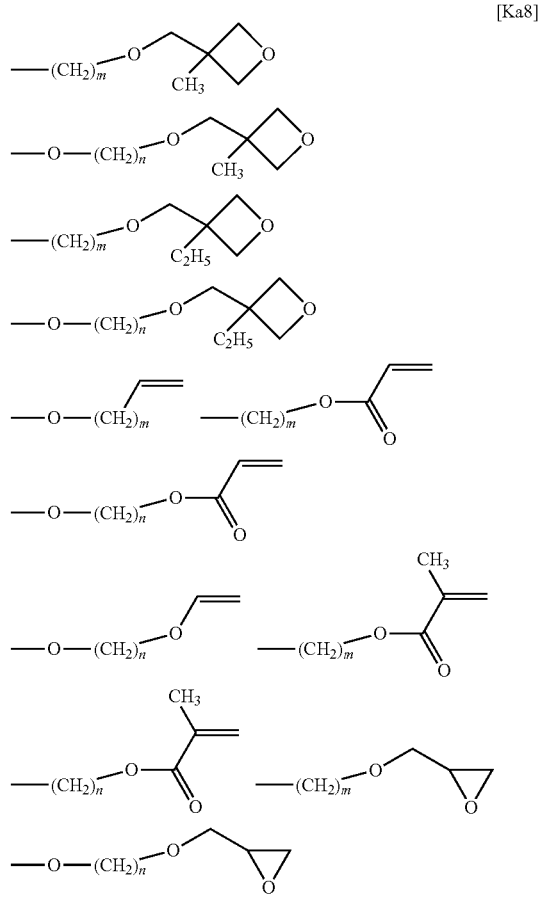

(In above formulae, m represents an integer of from 0 to 12, and n represents an integer of from 1 to 12.)

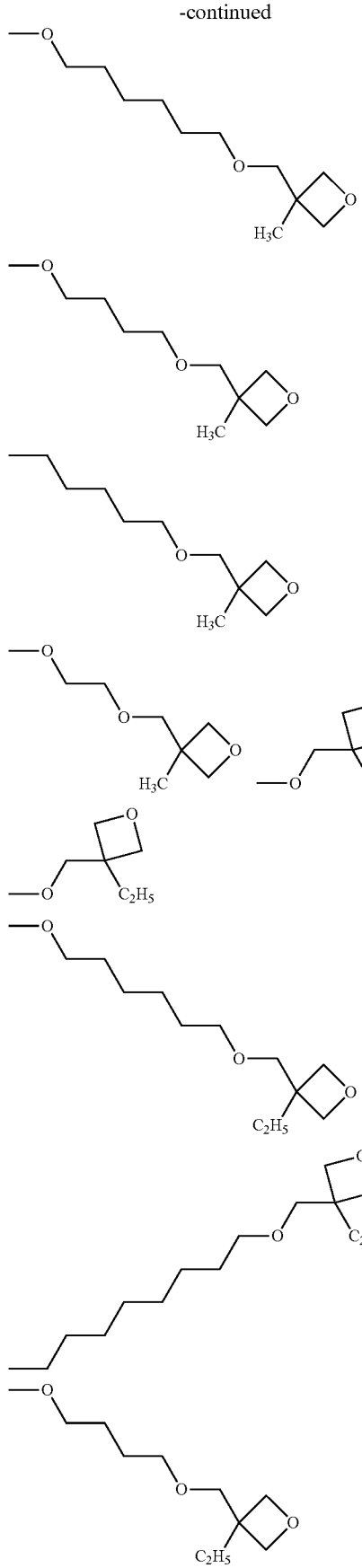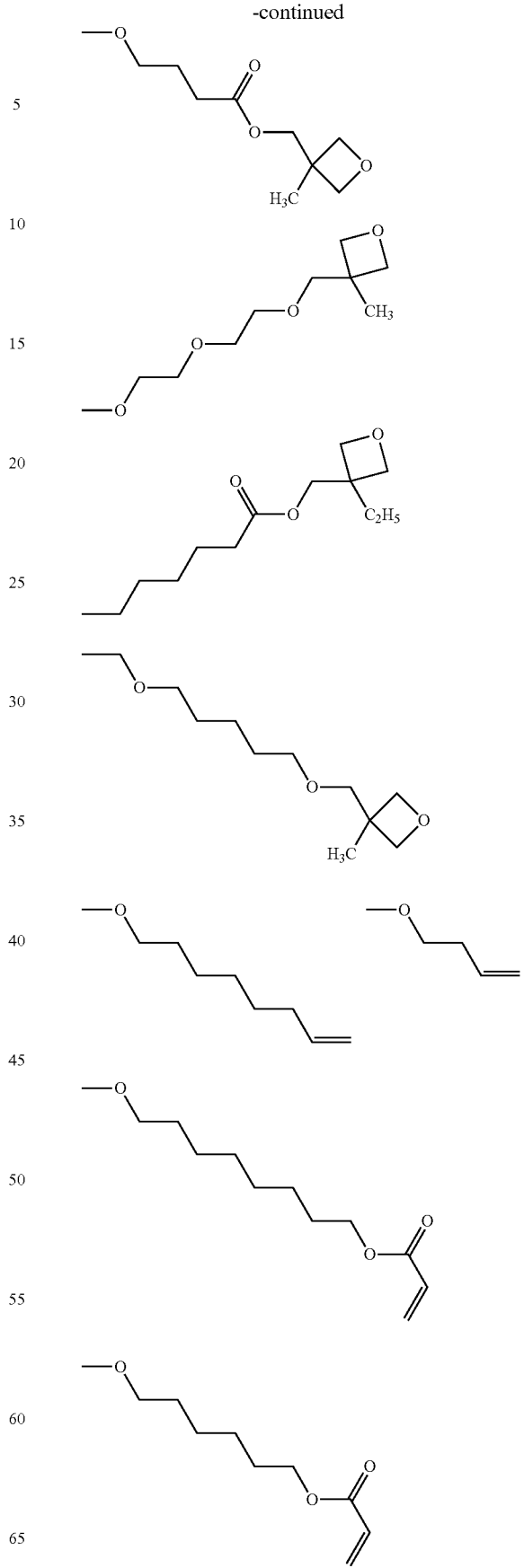

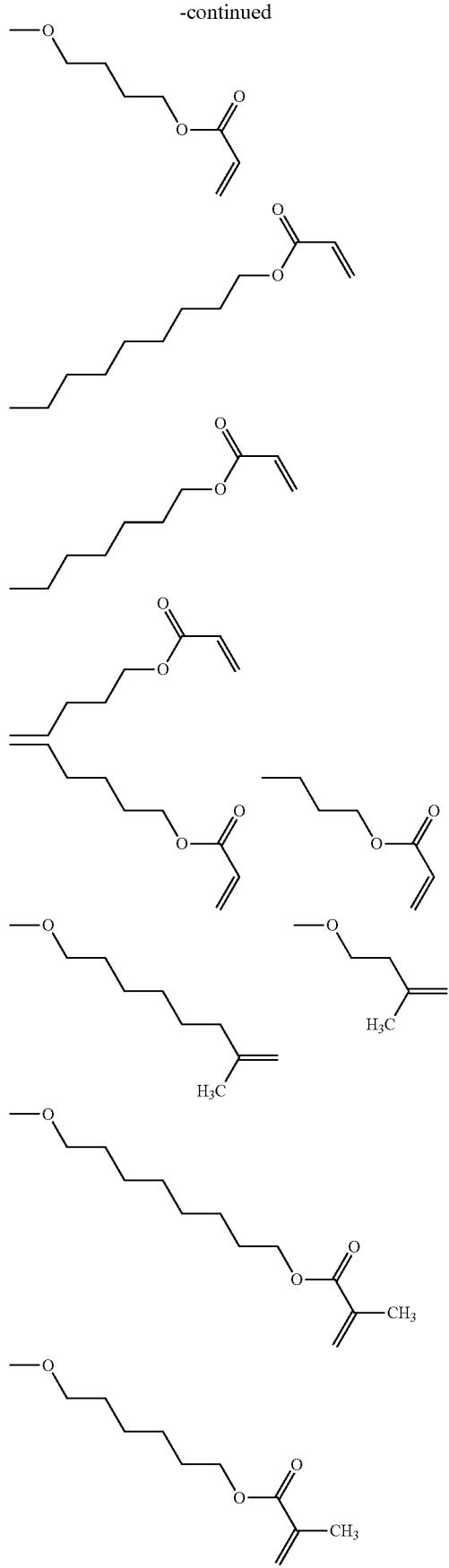
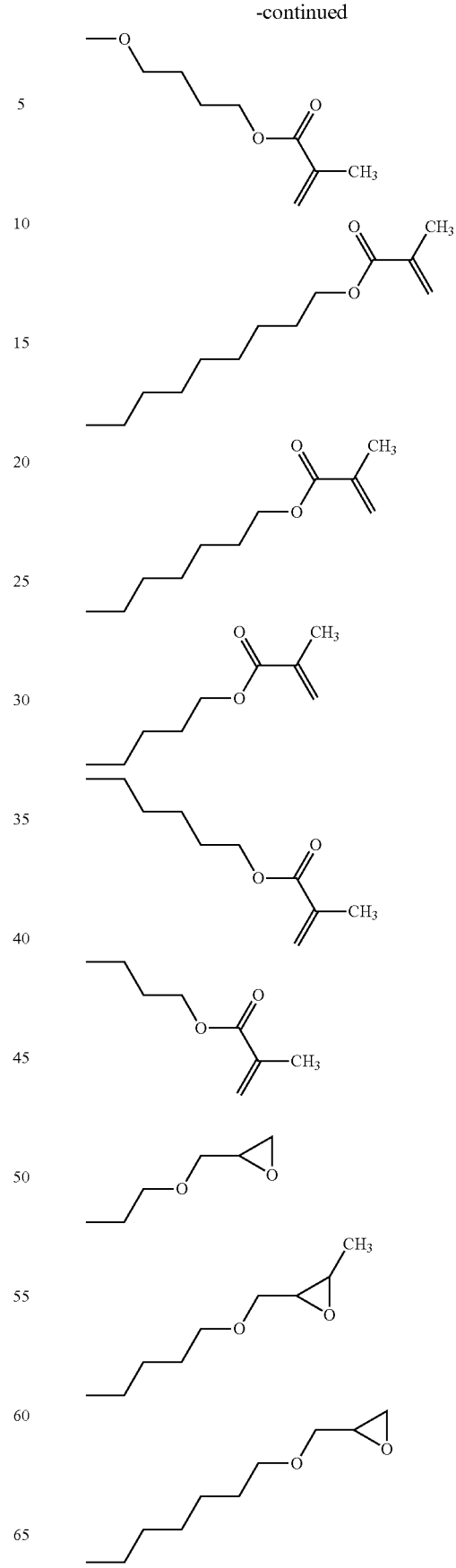
[Ka 11]

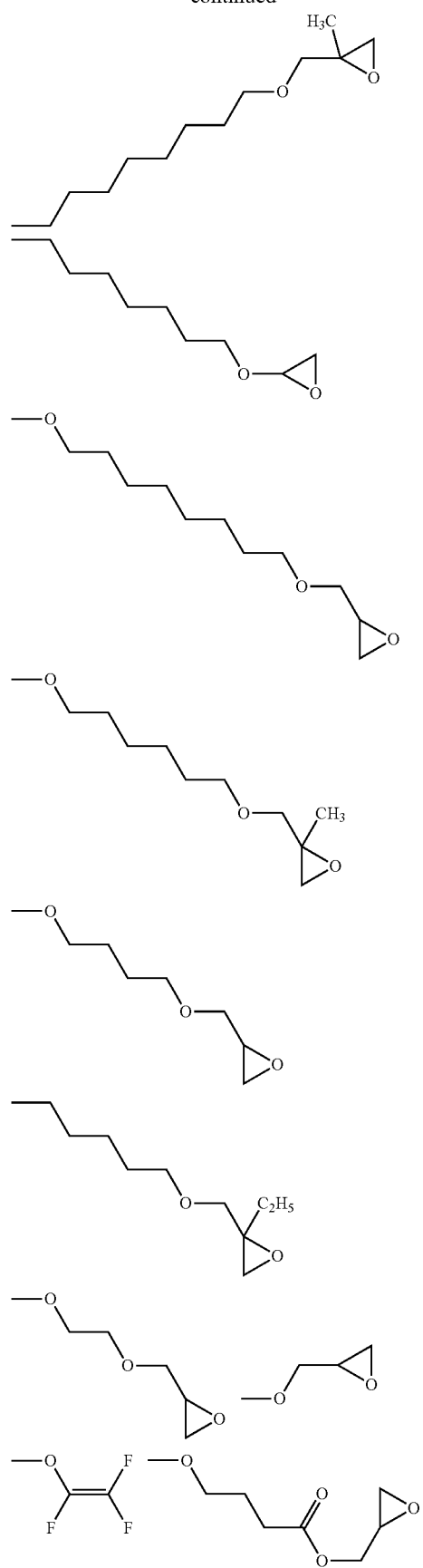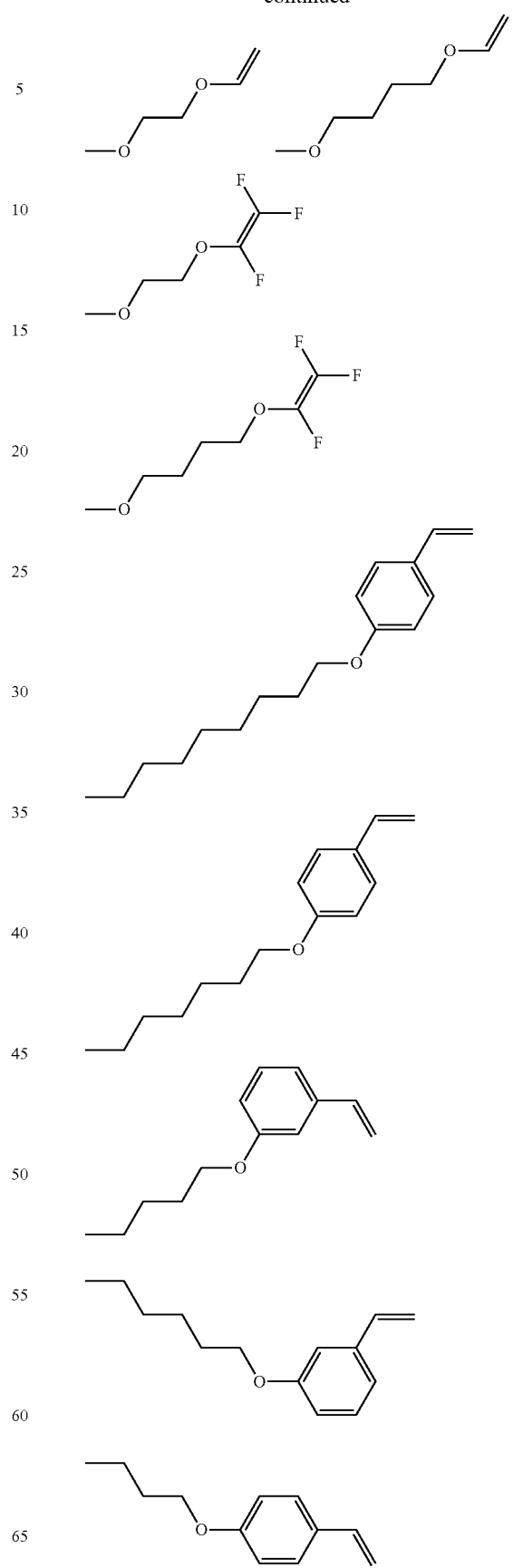

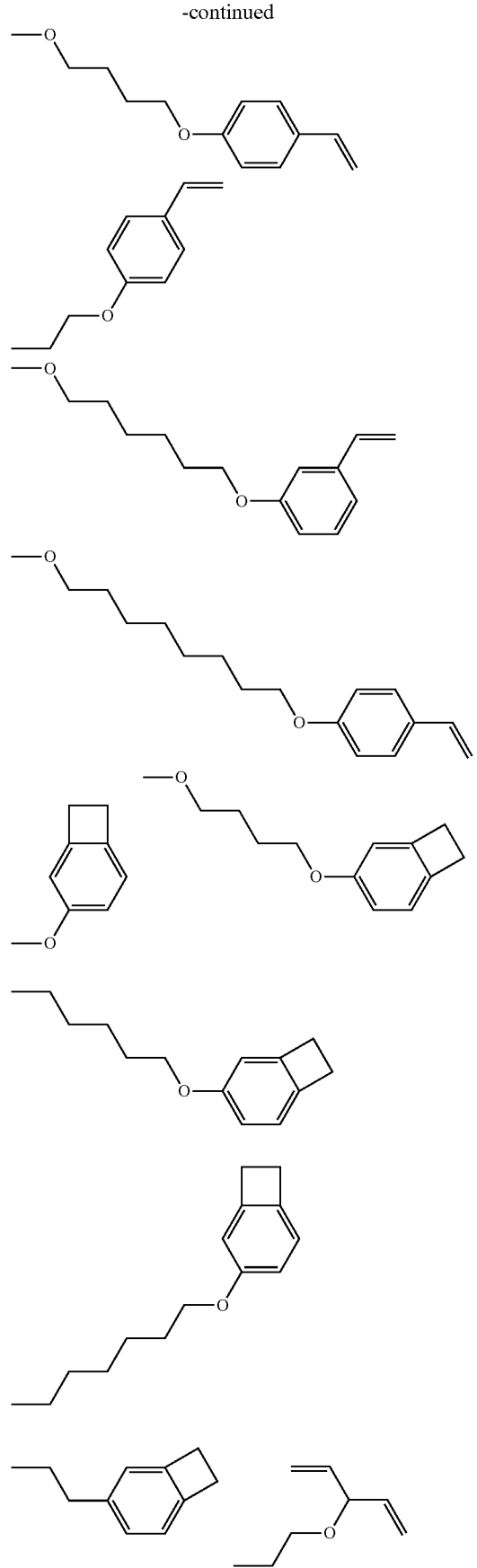
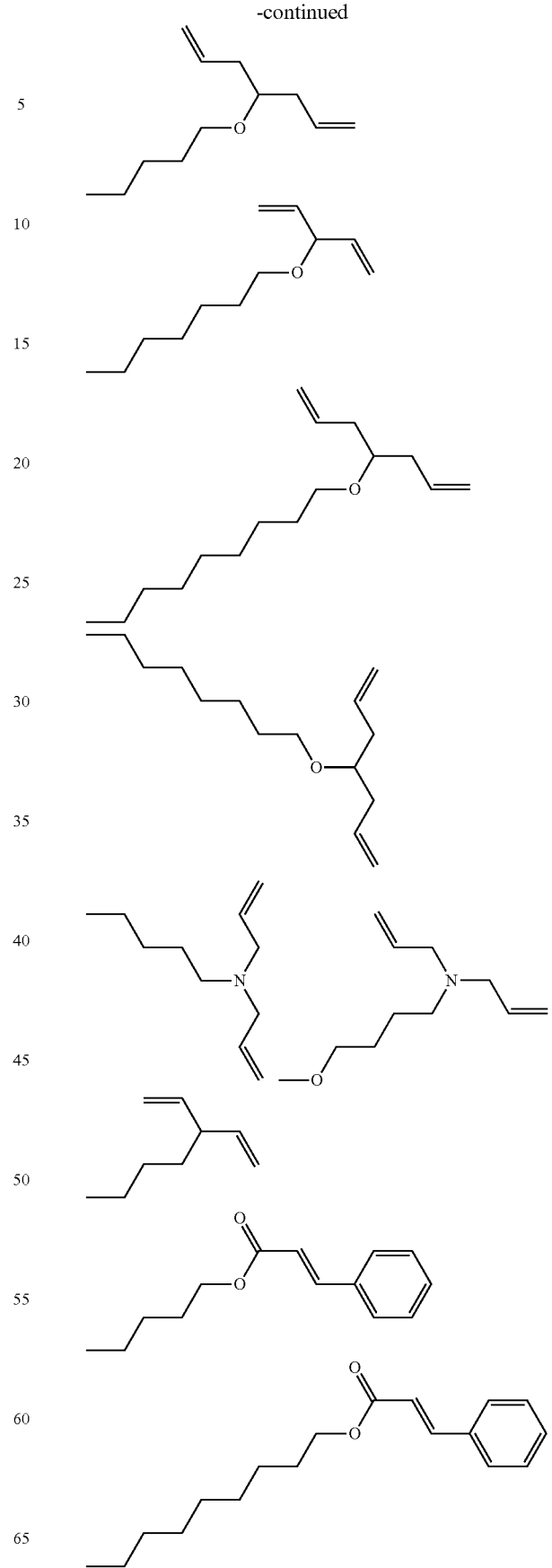

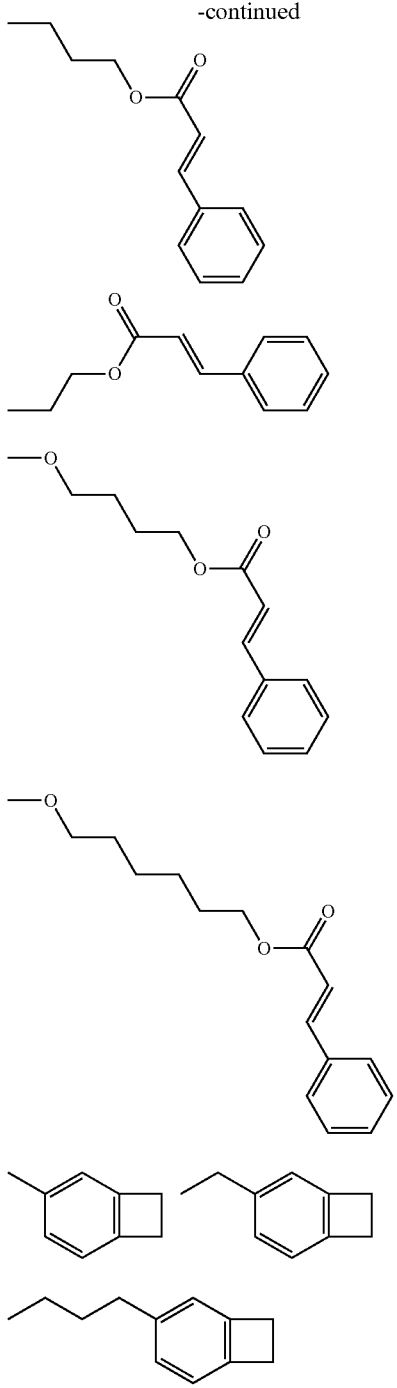
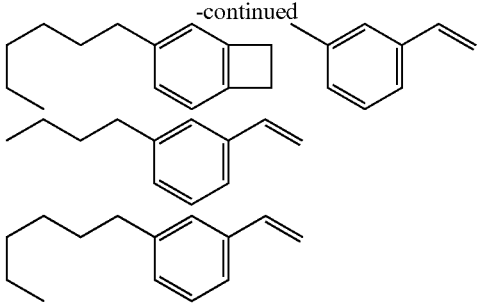

(Proportion of the Cross-Linkable Group)

With respect to the polymer of the invention, the number of the cross-linkable groups existing in one polymer chain is preferably 1 or more on average, more preferably 2 or more on average, and is preferably 200 or less on average, more preferably 100 or less on average.

Additionally, the cross-linkable group may be contained in the repeating unit represented by the foregoing general formula (1) and, specifically, in any of $Ar^{11}$ to $Ar^{17}$, and $R^{11}$ and $R^{12}$, or may be contained in other partial structure of the polymer than the foregoing general formula (1), or may be contained in both of them.

Also, the number of the cross-linkable groups which the polymer of the invention has can be expressed in terms of a number of the cross-linkable groups per 1000 molecular weight.

To express the number of the cross-linkable groups which the polymer of the invention has per 1000 molecular weight, the number is usually 3.0 or less, preferably 2.0 or less, more preferably 1.0 or less, and is usually 0.01 or more, preferably 0.05 or more.

In case when the number exceeds the upper limit, a flat film might not be obtained due to cracks, or the number of unreacted cross-linkable groups within the cross-linked layer might increase due to too large cross-linking density, which might affect the life of a resulting element. On the other hand, in case when the number lowers the lower limit, insolubilization of the cross-linked layer might become insufficient and, as a result, a multiple-layer structure might not be formed by the wet film formation method.

Here, the number of the cross-linkable groups of the conjugated polymer per 1000 molecular weight is calculated from the molar ratio of charged monomers upon synthesis and from the structural formula with excluding the end groups from the conjugated polymer.

For example, the calculation will be explained with respect to the case of an end polymer 1 synthesized in Synthesis Example 1 to be described hereinafter.

[Ka 12]

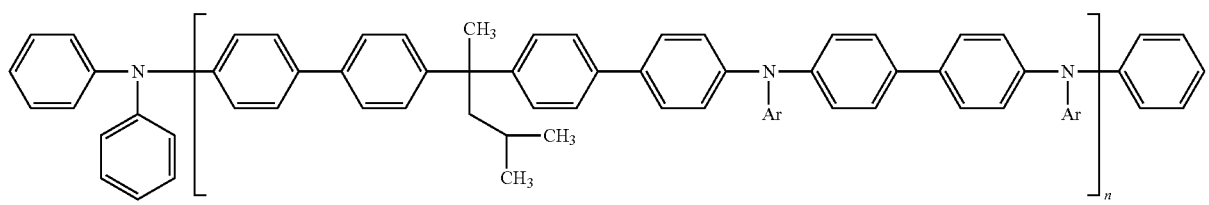

—Ar =

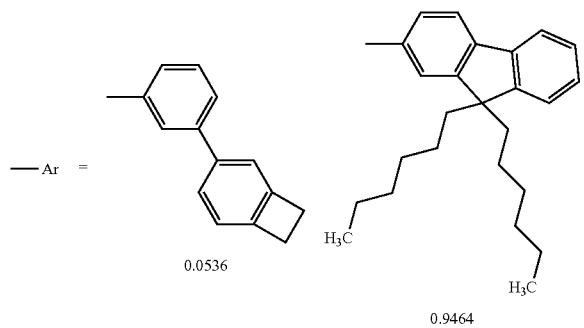

In the end polymer 1, the molecular weight of the repeating unit excluding the end groups is 1219.2 on average, and the number of the cross-linkable group per one repeating unit is 0.1076 on average. The number of the cross-linkable groups per 1000 molecular weight can be calculated to be 0.088 from these values by simple proportion calculation.

The weight-average molecular weight (Mw) of the polymer of the invention is usually 3,000,000 or less, preferably 1,000,000, more preferably 500,000 or less, still more preferably 200,000 or less, and is usually 1,000 or more, preferably 2,500 or more, more preferably 5,000 or more, still more preferably 20,000 or more.

In case when the weight-average molecular weight exceeds the upper limit, film-forming properties might be injured due to reduction of solubility for a solvent. Also, in case when the weight-average molecular weight lowers the lower limit, heat resistance might be reduced due to decrease in the glass transition temperature, melting point, and evaporating temperature of the polymer.

Also, this weight-average molecular weight (Mw) is usually determined by measurement of SEC (Size Exclusion Chromatography). In the SEC measurement, a component having a higher molecular weight shows a shorter elution time, whereas a component having a lower molecular weight shows a longer elution time, and the weight-average molecular weight is calculated by converting the elution time of a sample to its molecular weight using a calibration curve obtained from the elution time of a polystyrene (standard sample) whose molecular weight is known.

Also, the number-average molecular weight (Mn) of the polymer of the invention is usually 2,500,000 or less, preferably 750,000 or less, more preferably 400,000 or less, and is usually 500 or more, preferably 1,500 or more, more preferably 3,000 or more.

Further, the degree of dispersion (Mw/Mn) of the polymer of the invention is preferably 3.5 or less, more preferably 2.5 or less, particularly preferably 2.0 or less.

Additionally, with the degree of dispersion, the smaller, the better, thus the lower limit being ideally 1. When the degree of dispersion of the polymer is within the above-described range, purification of the polymer is easy, and the solubility for a solvent and the charge transporting ability of the polymer becomes good.

Examples of the repeating unit having the partial structure represented by the general formula (1) are shown below which, however, do not limit the invention.

[Ka 13]

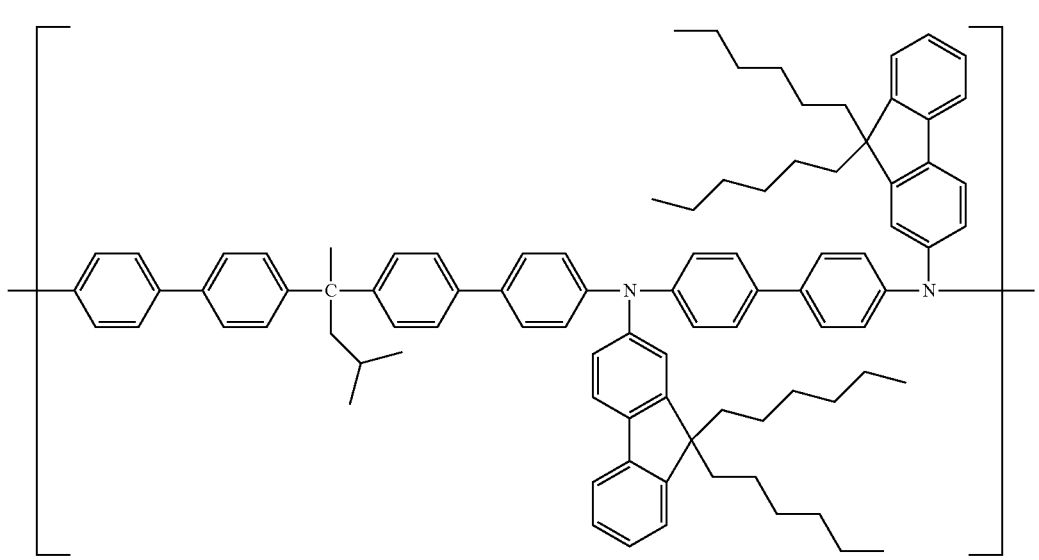

-continued
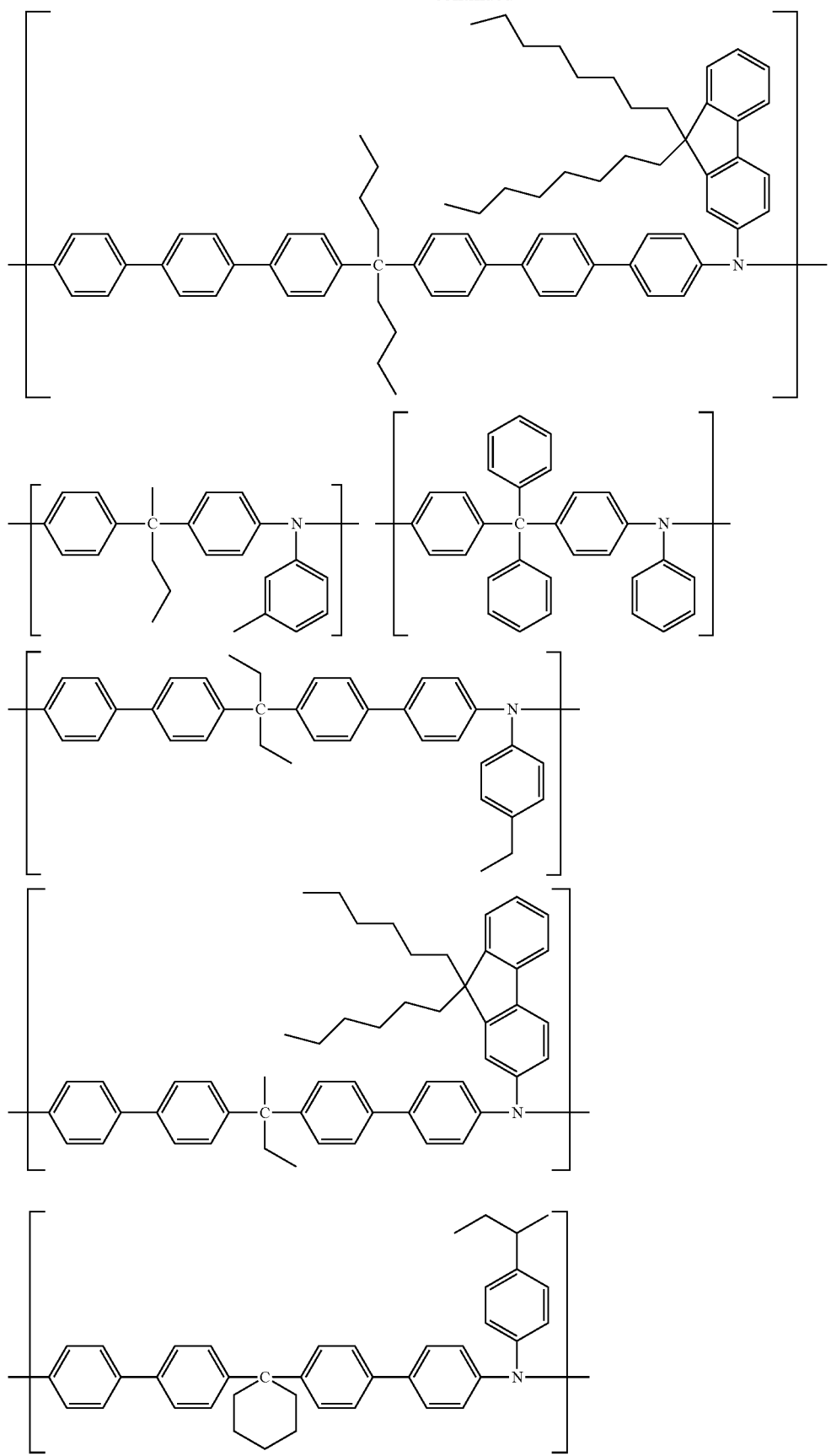

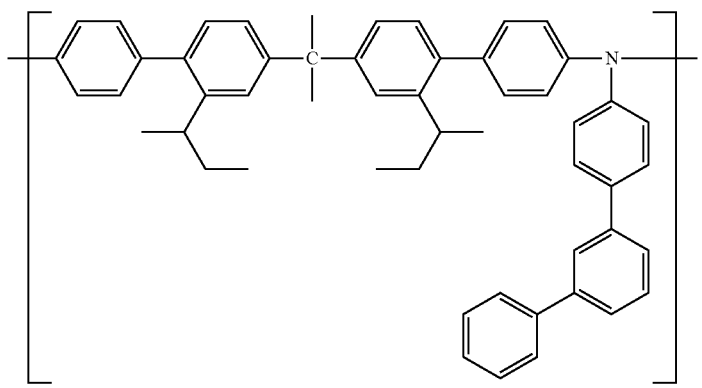
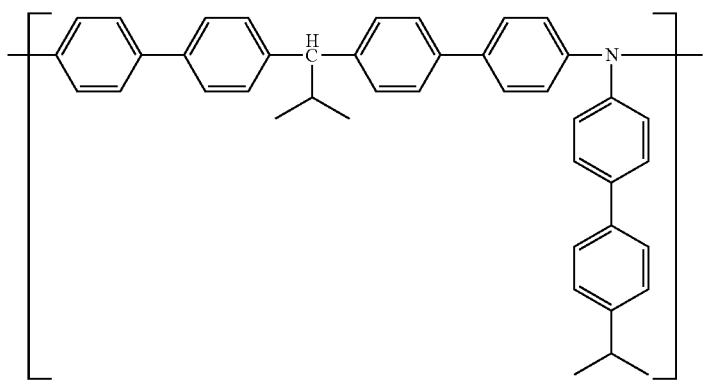
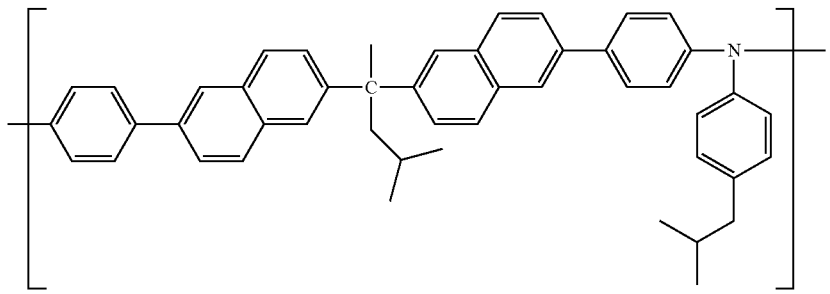
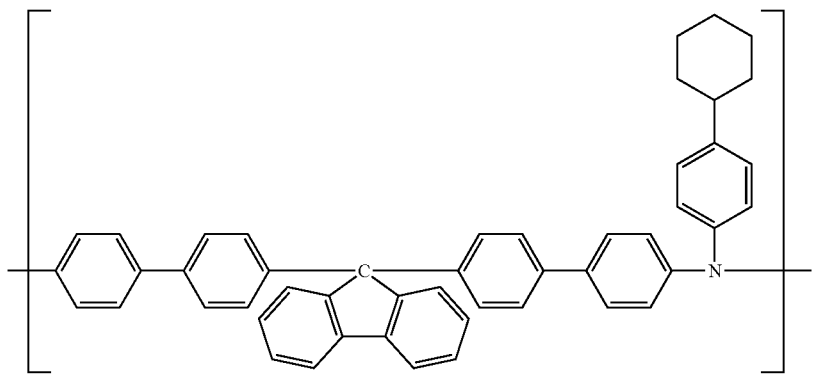

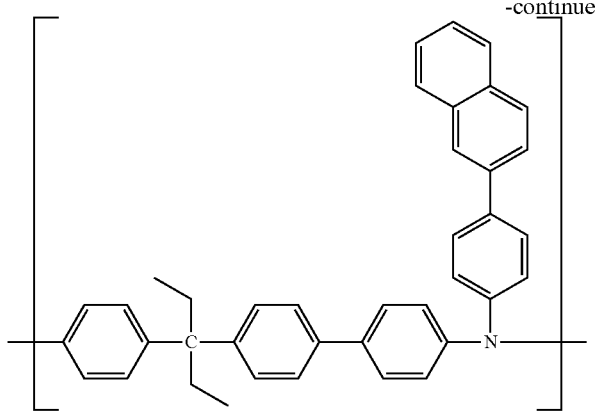
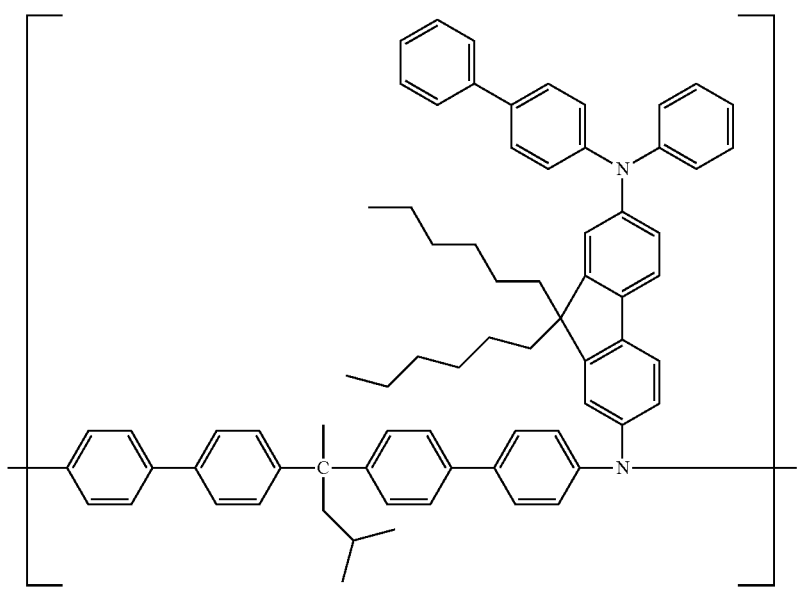
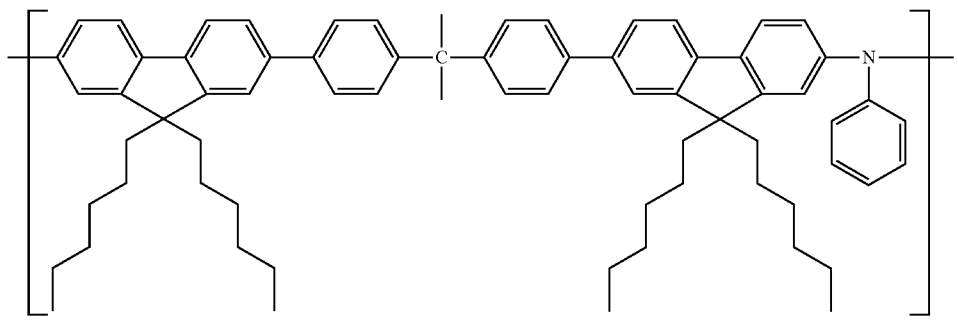
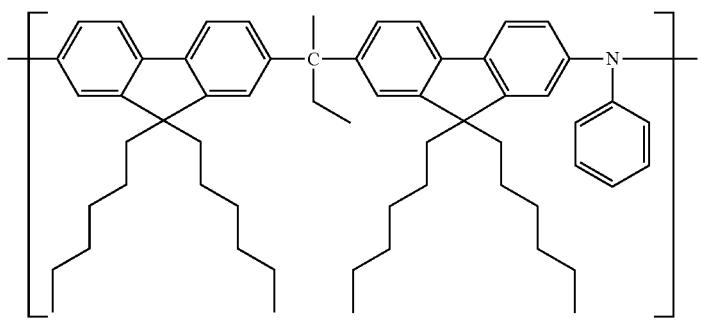

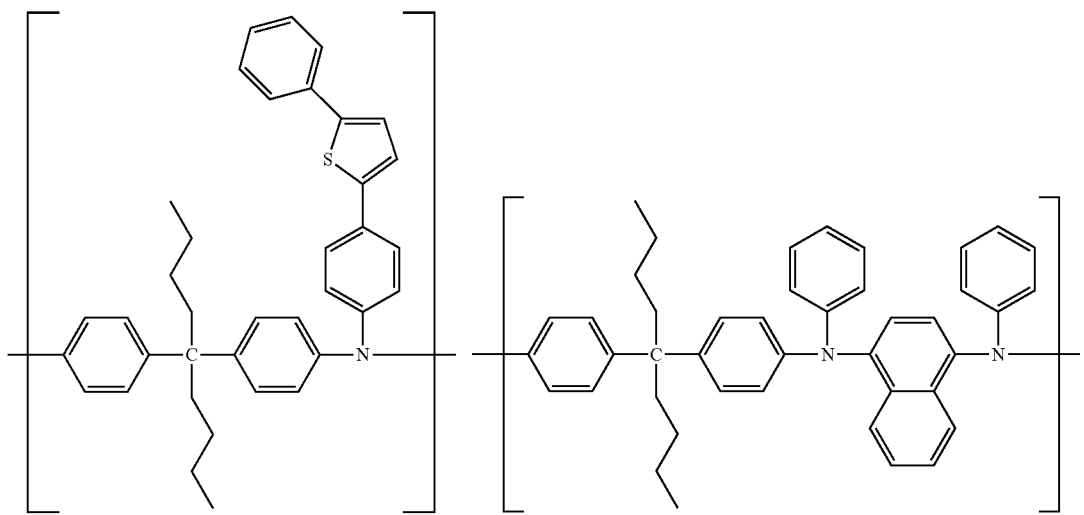
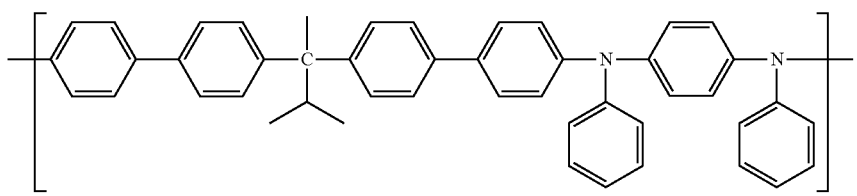
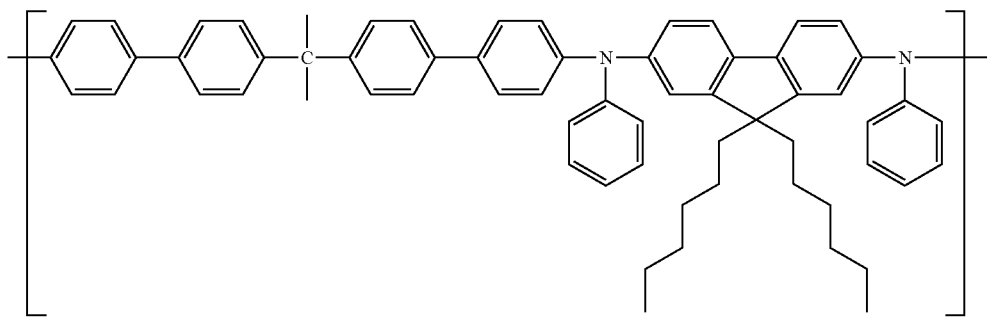
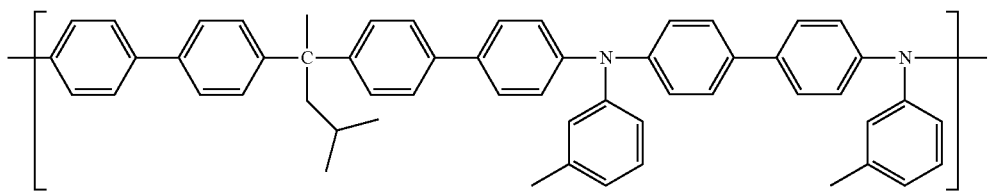

-continued
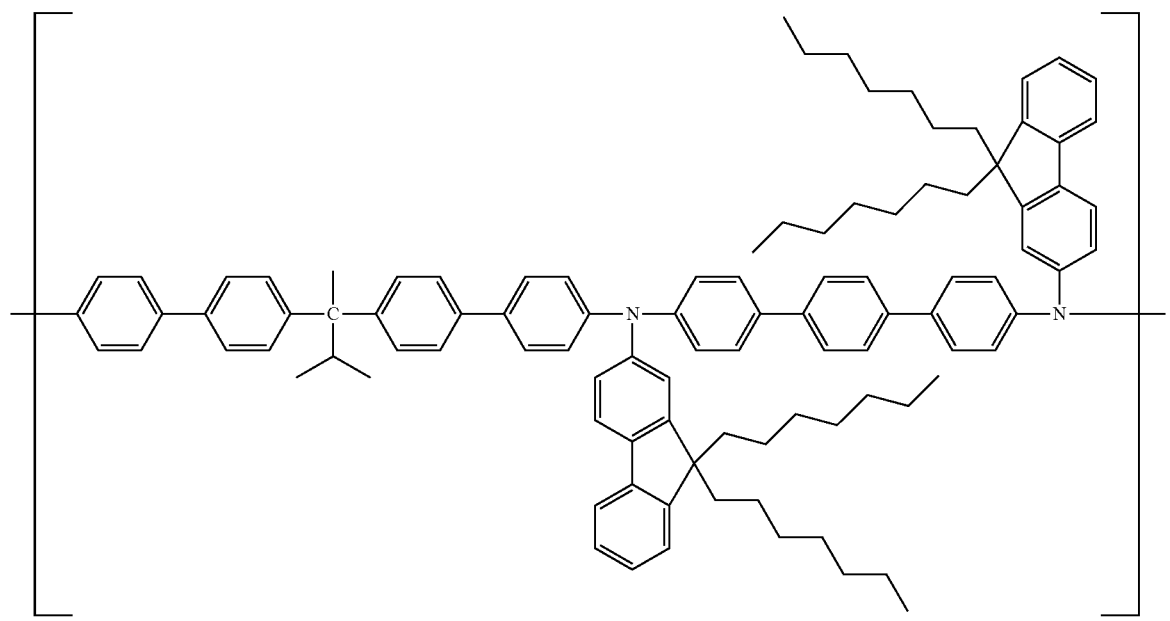
[Ka 14]
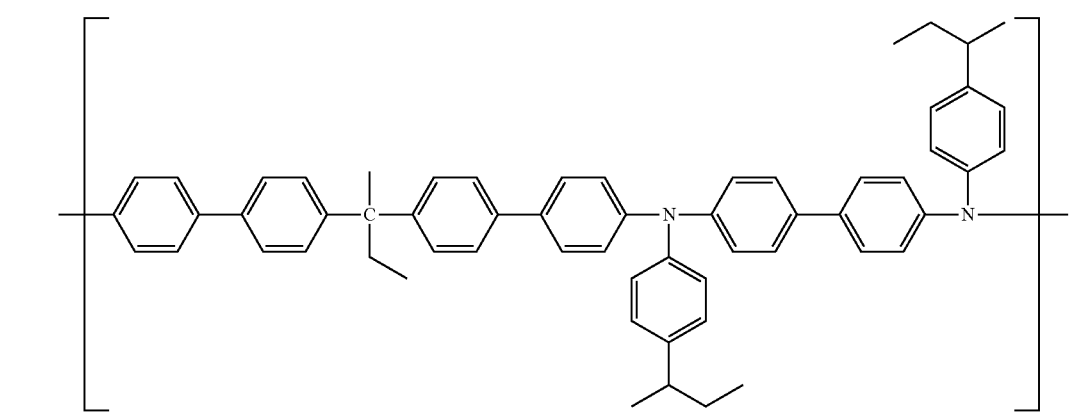
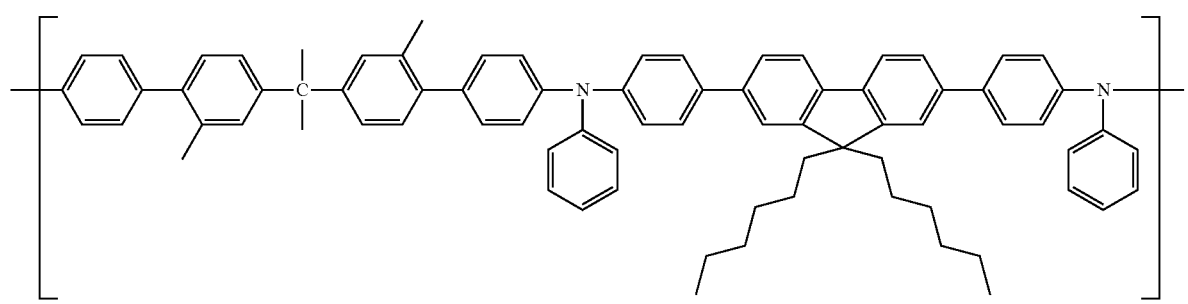
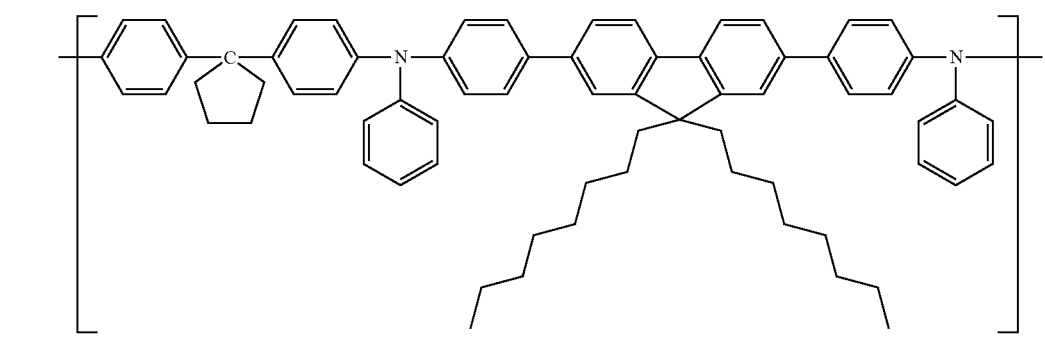

-continued
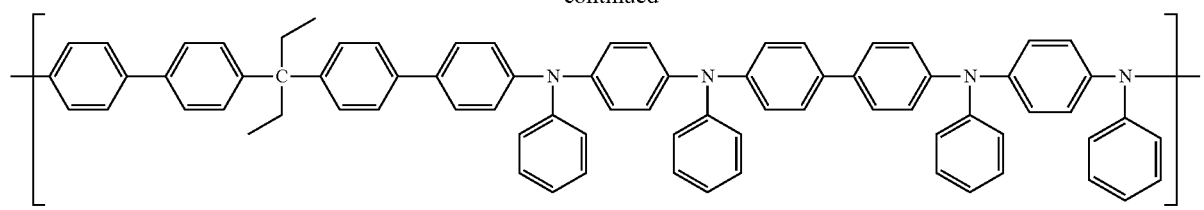
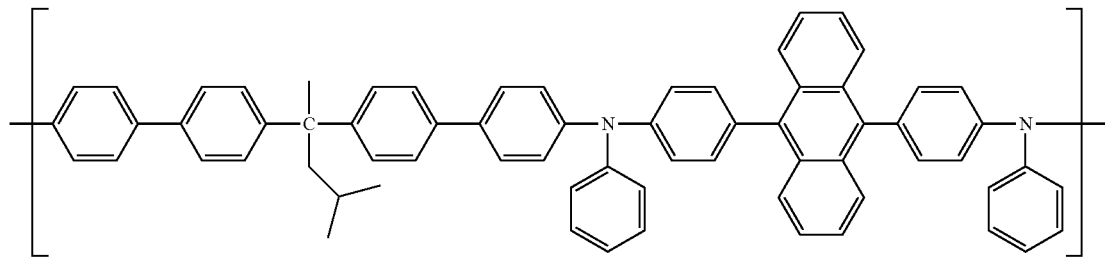
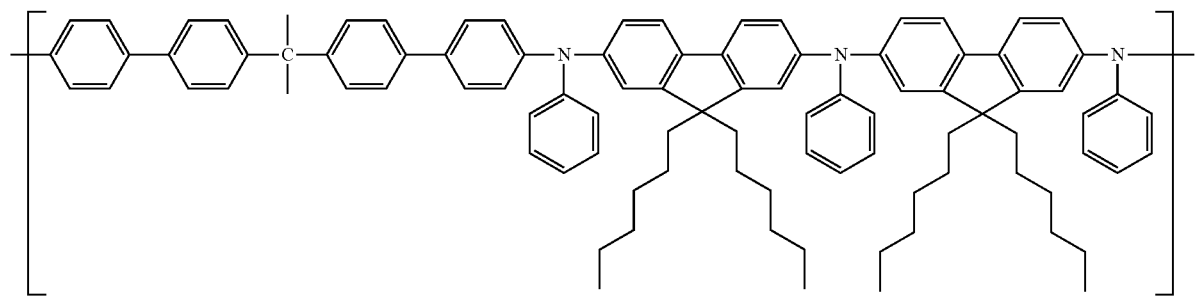
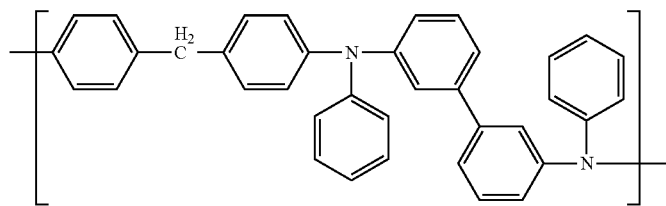
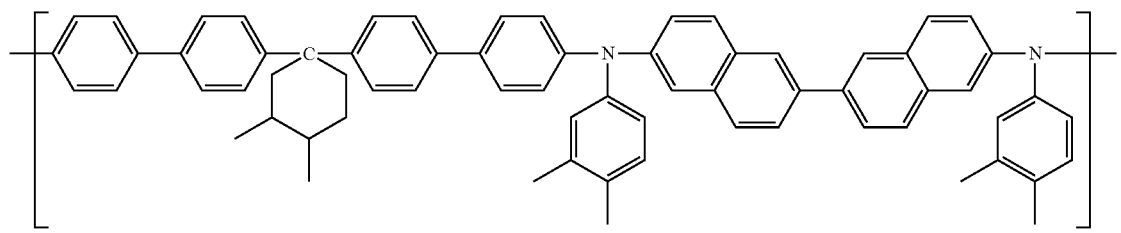
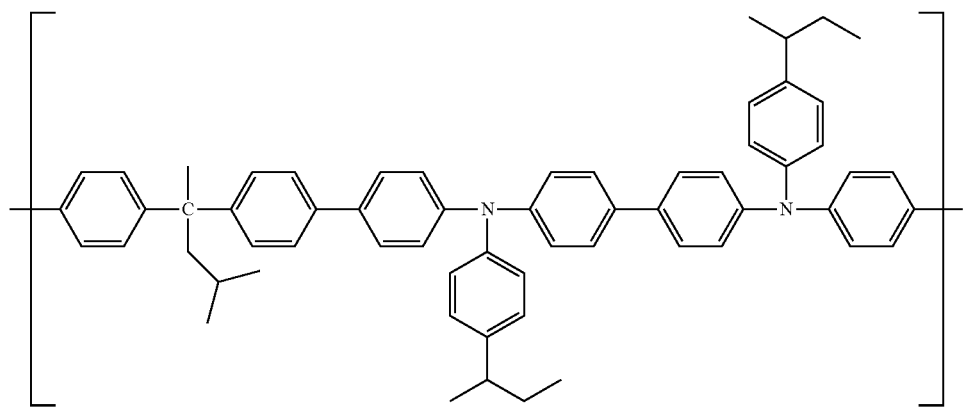

-continued
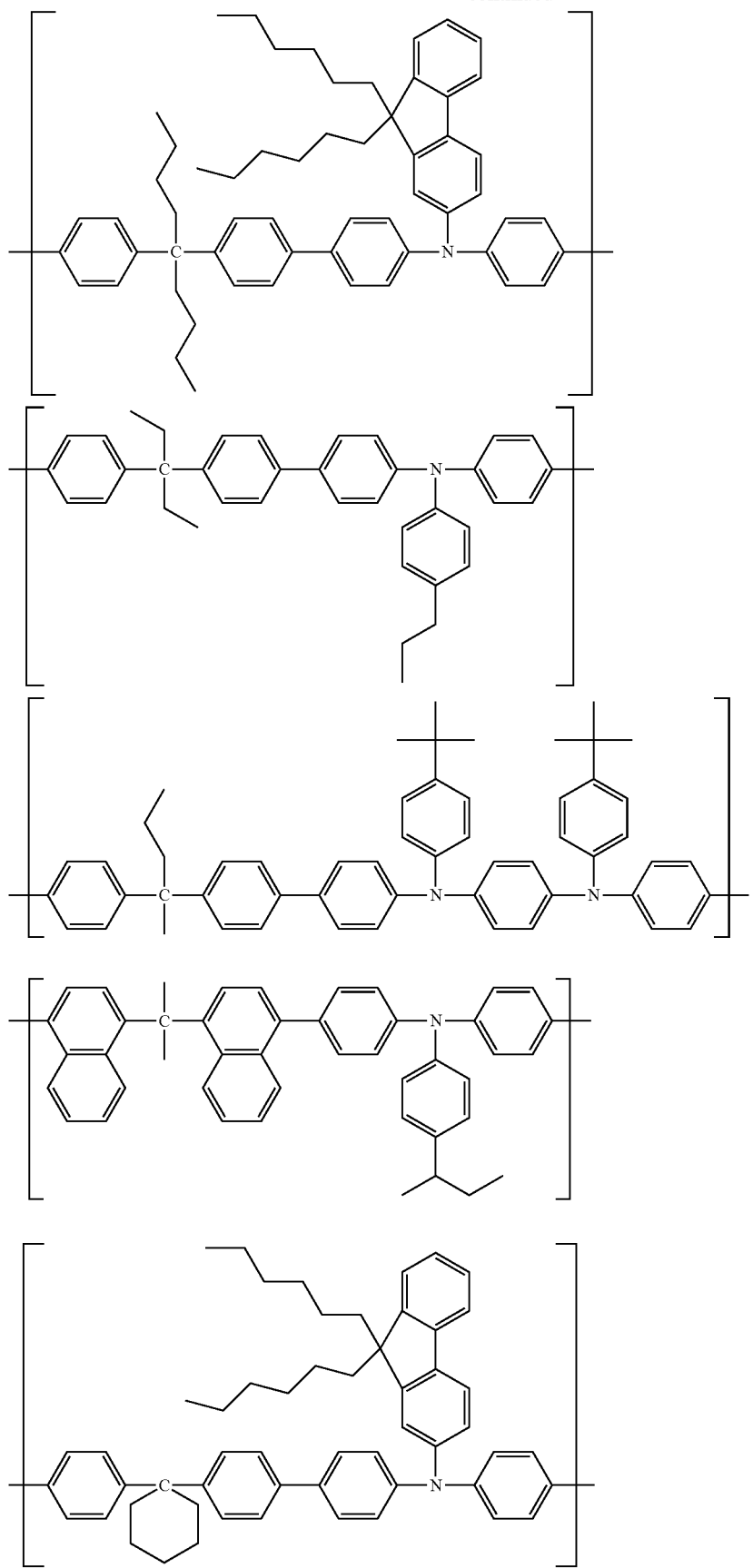

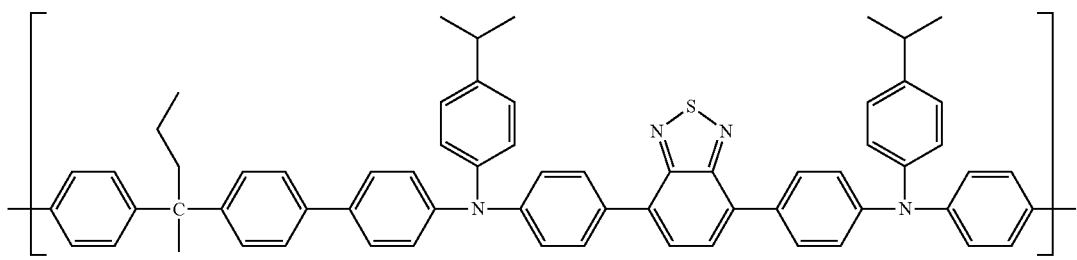
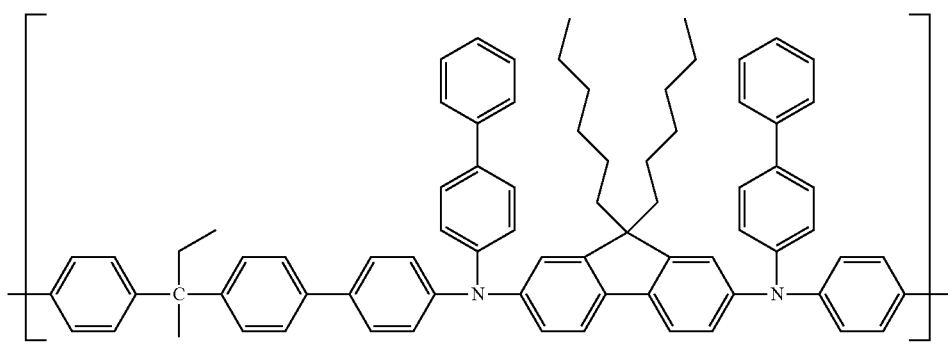
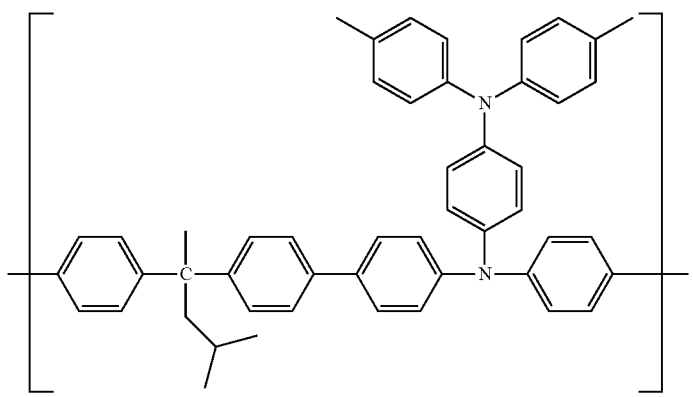
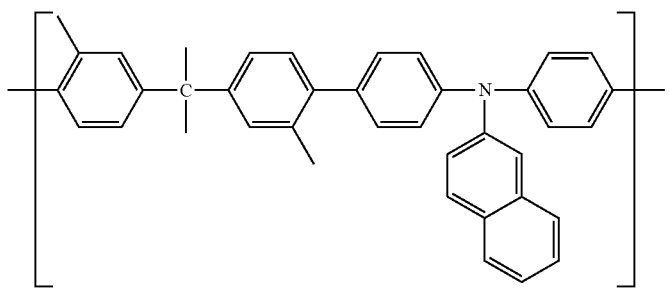
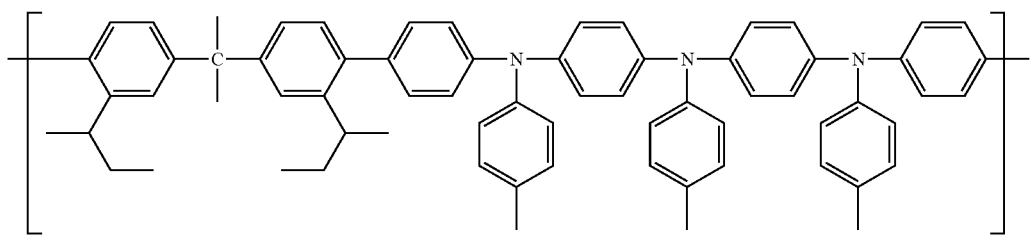

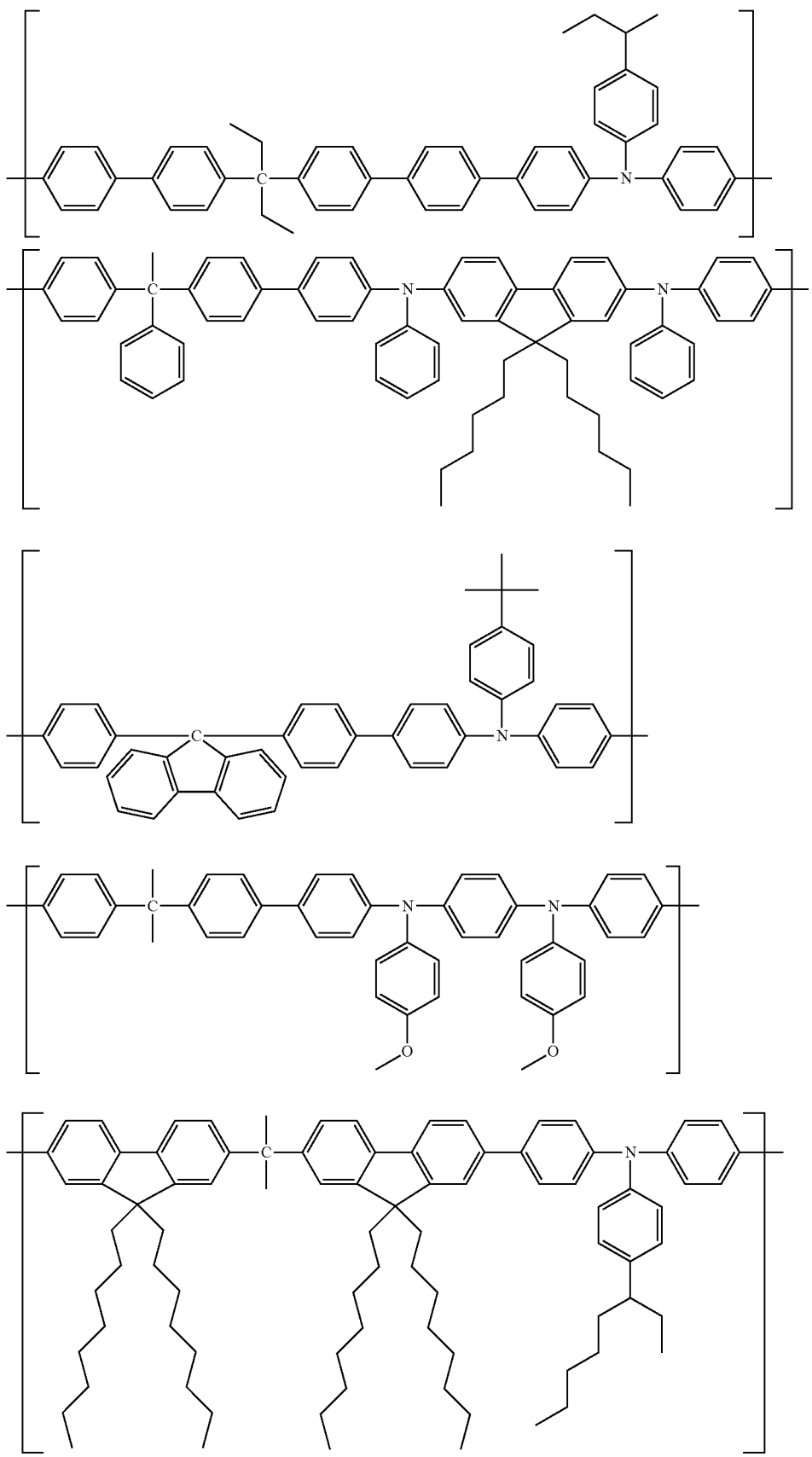
[Ka 15]

-continued
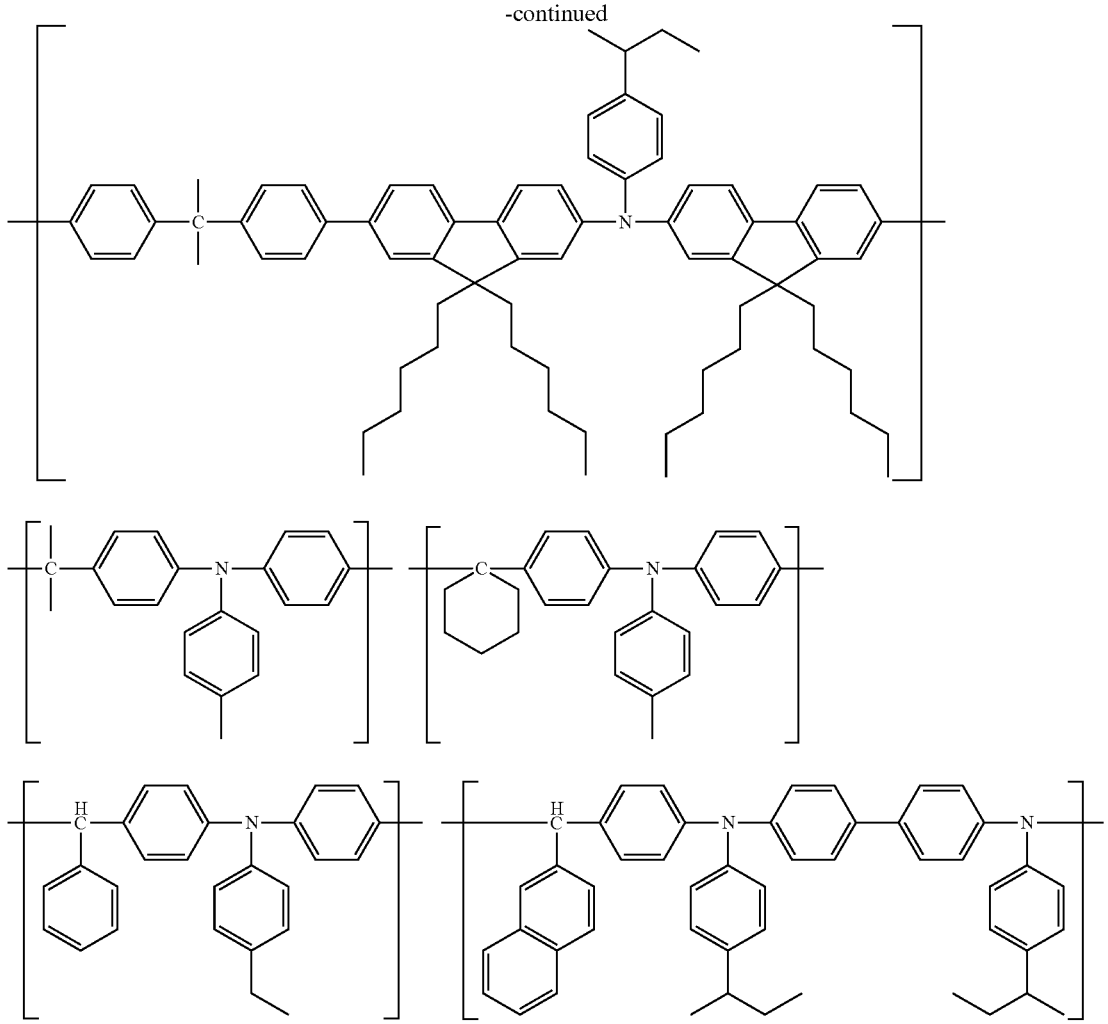
Examples of the repeating unit having a cross-linkable group will be shown below. However, the invention is not limited only to them.
[Ka 16]
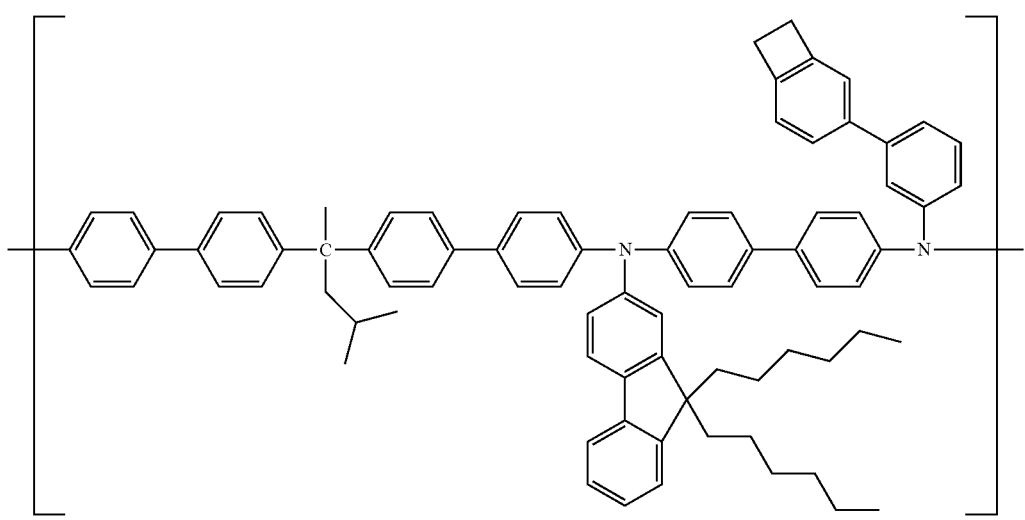

-continued
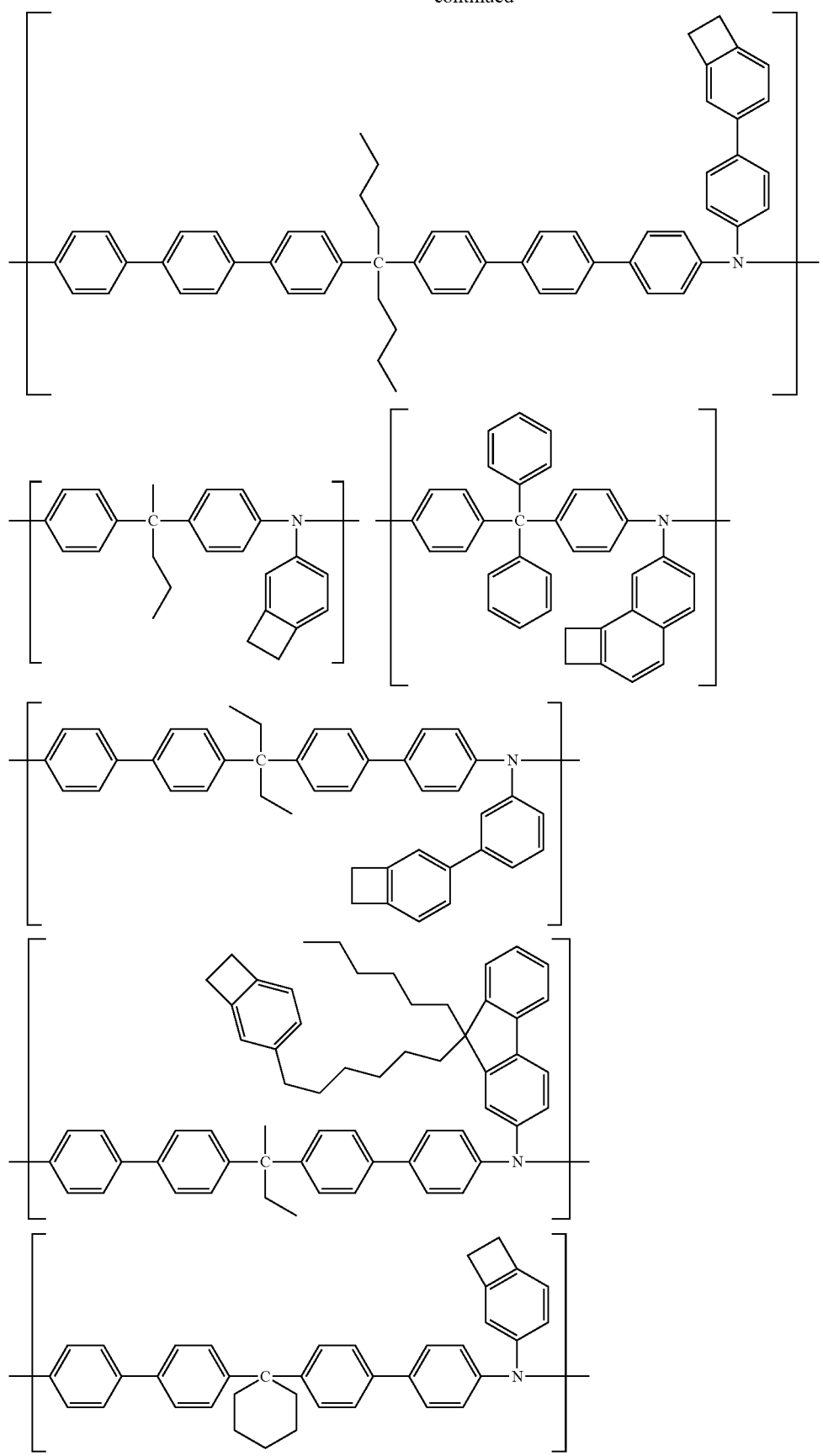

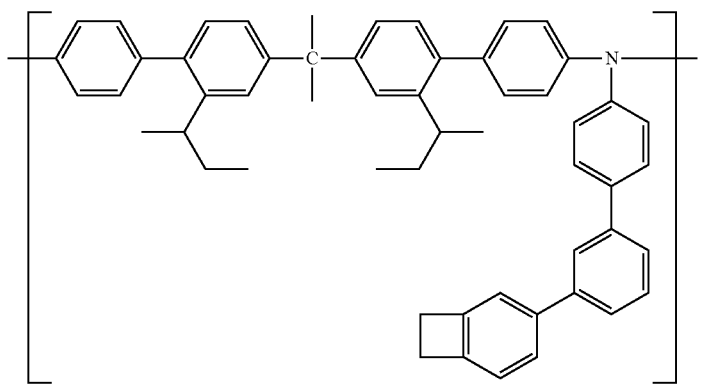
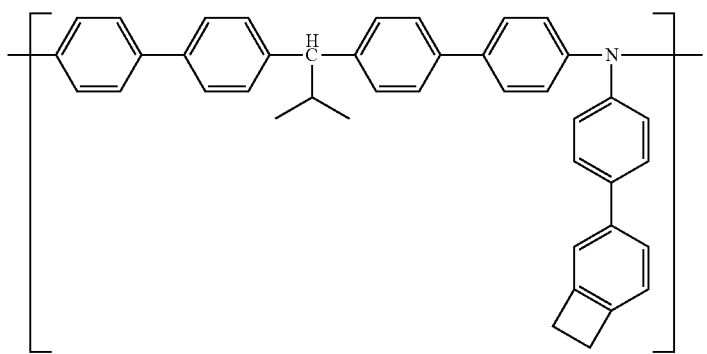
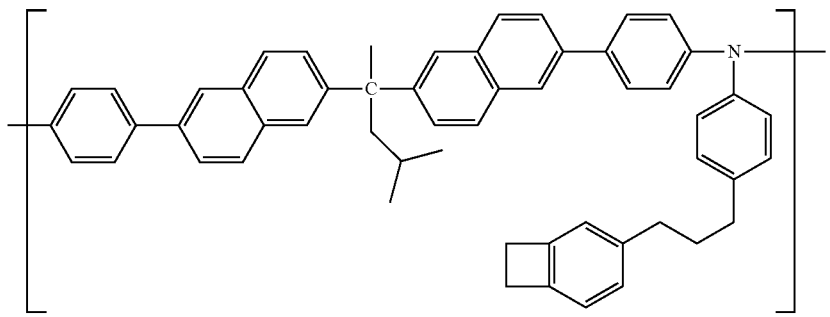
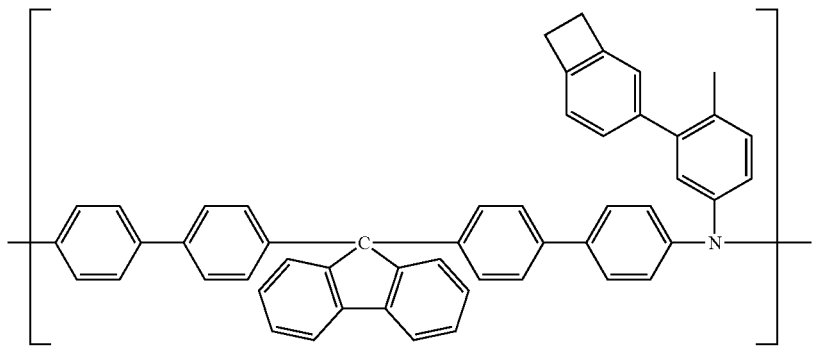

-continued
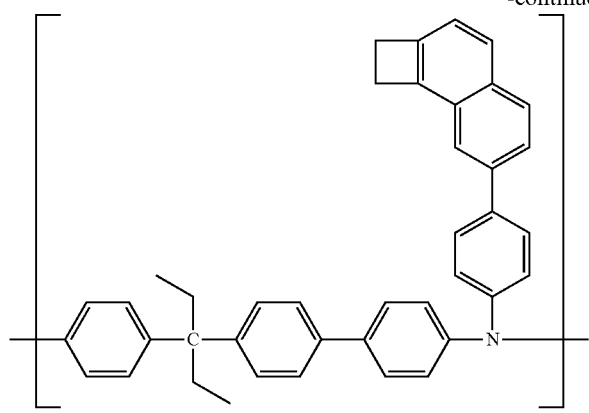
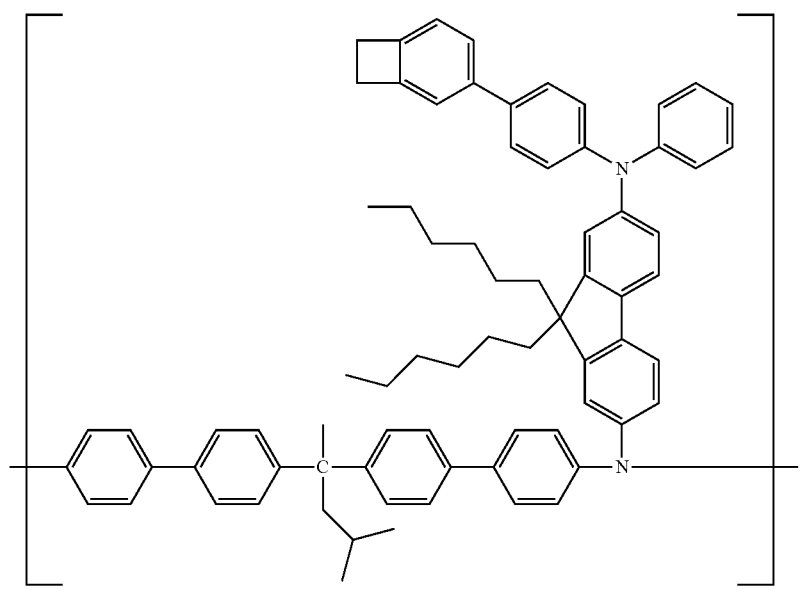
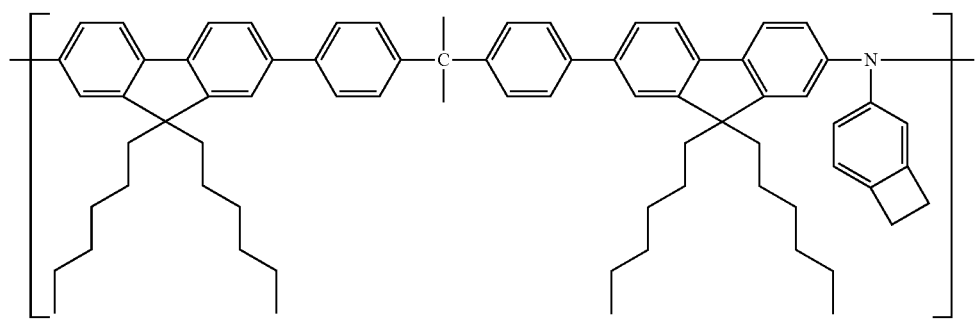
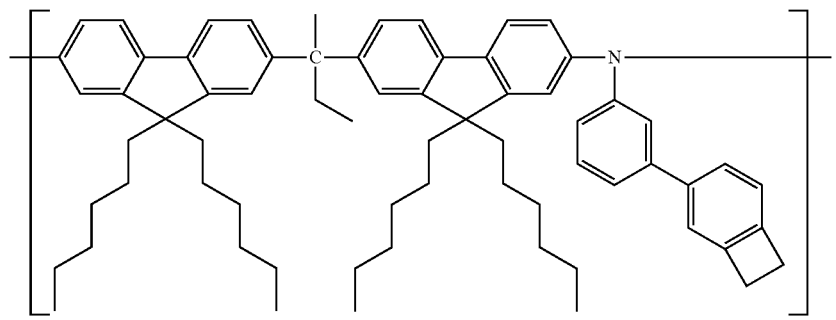

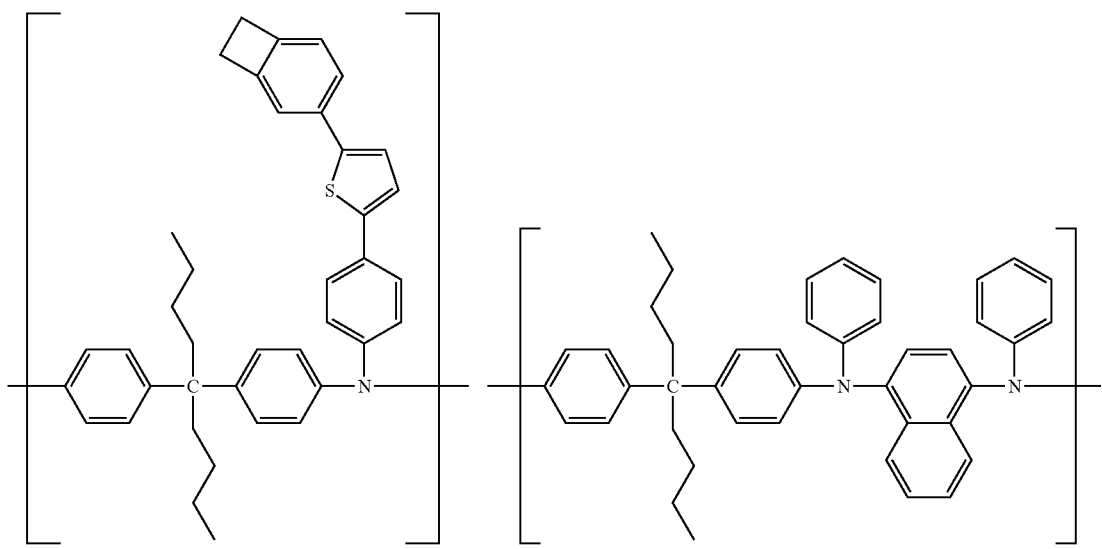
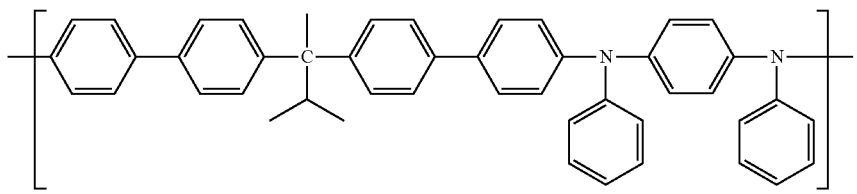
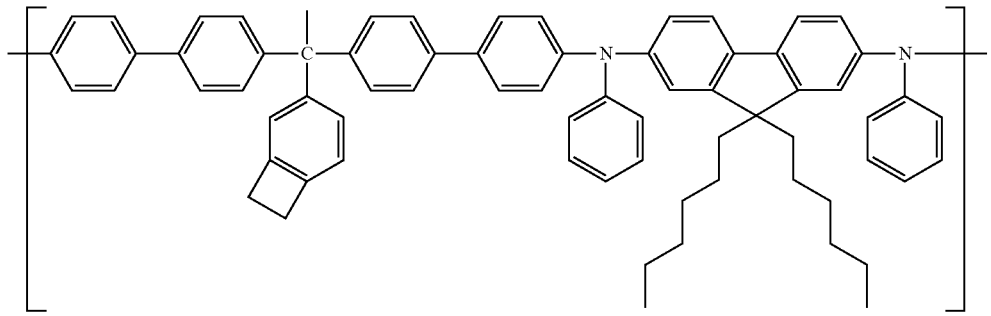
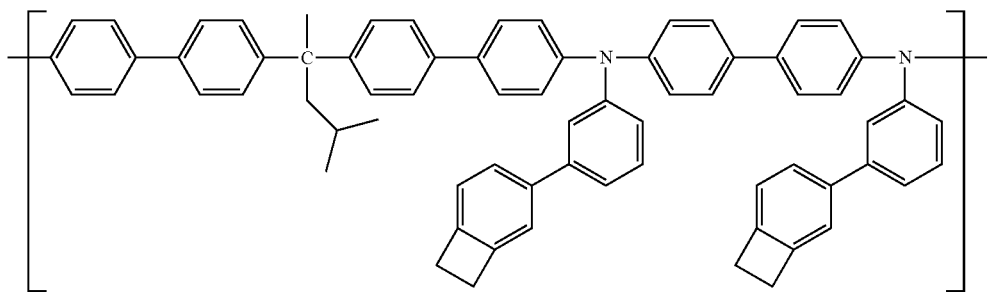

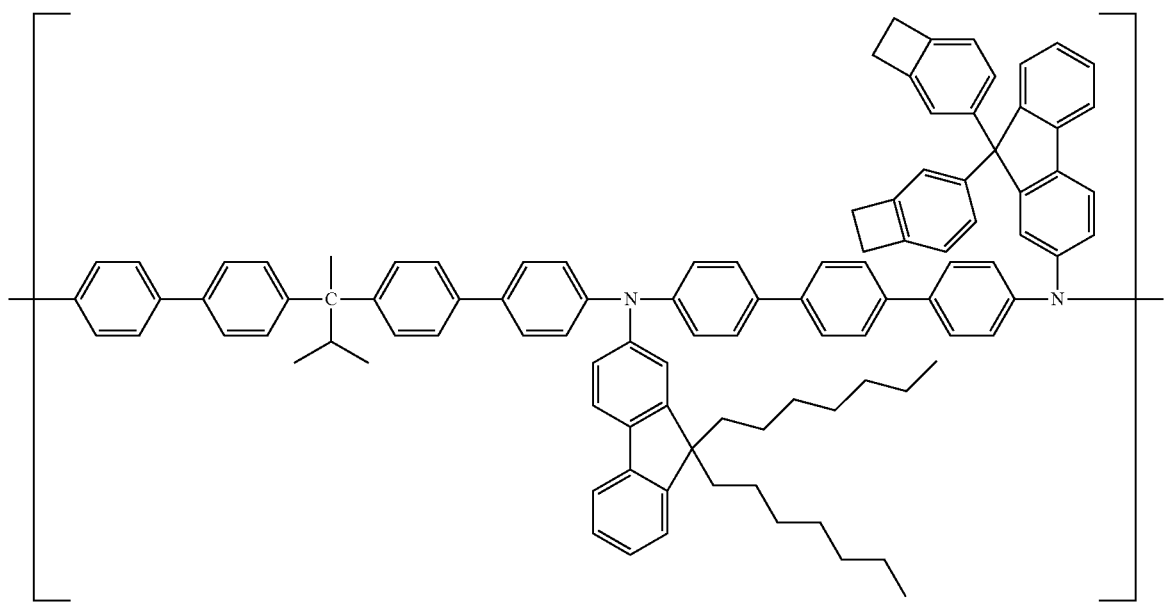
[Ka 17]
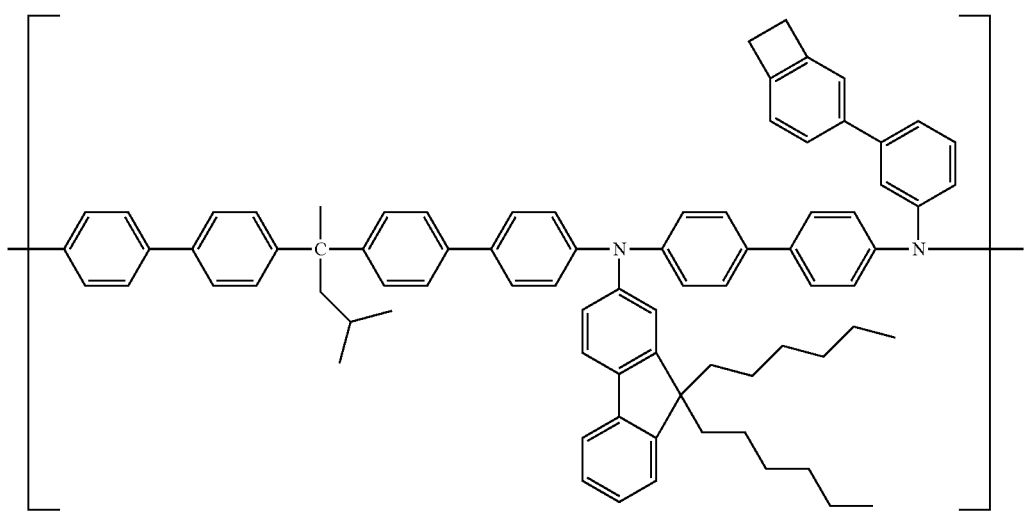
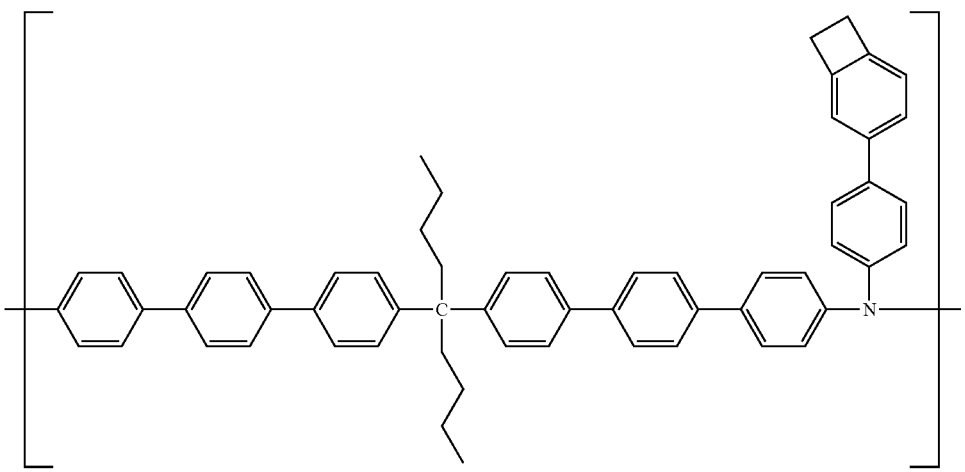

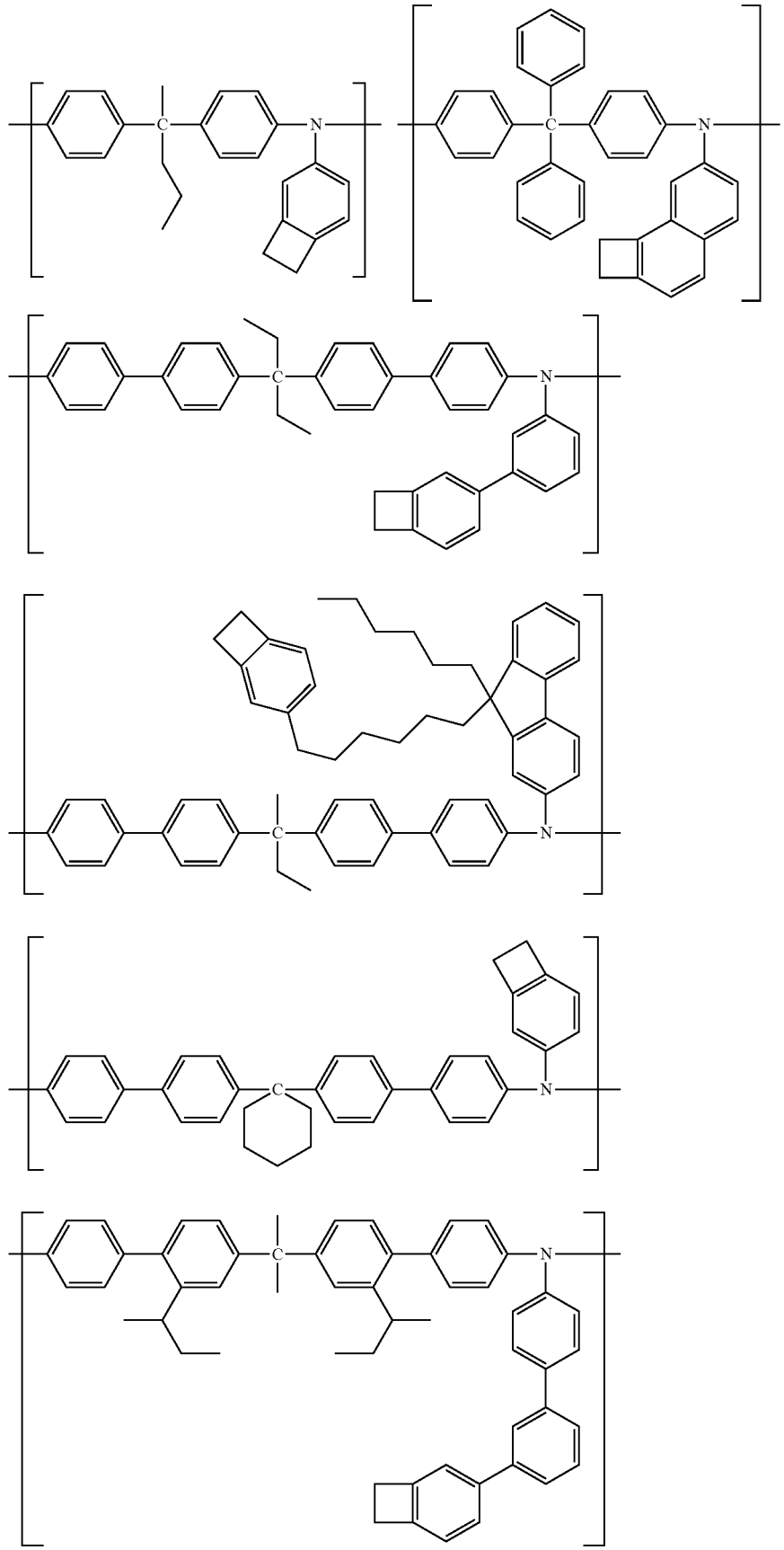

-continued
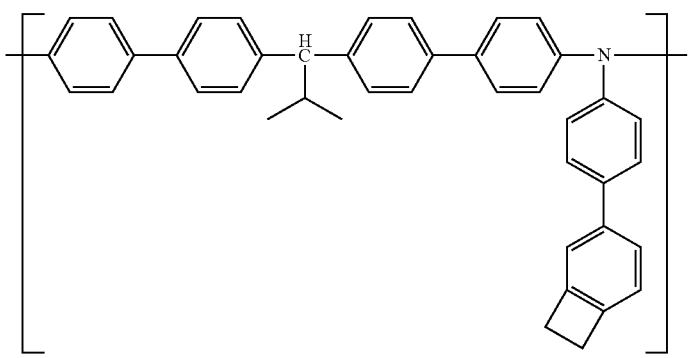
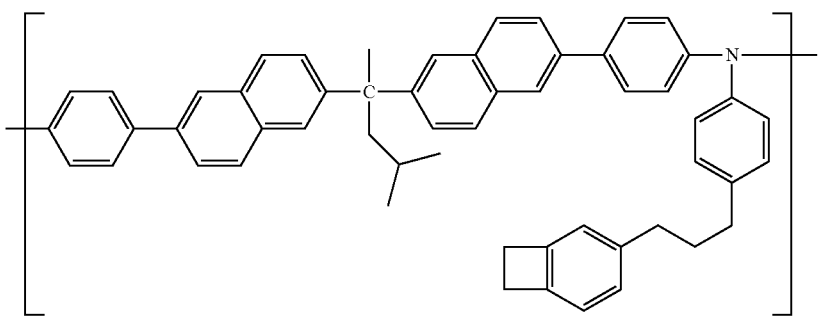
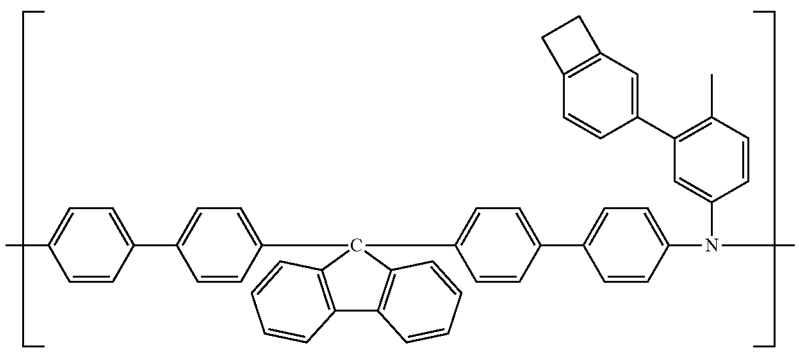
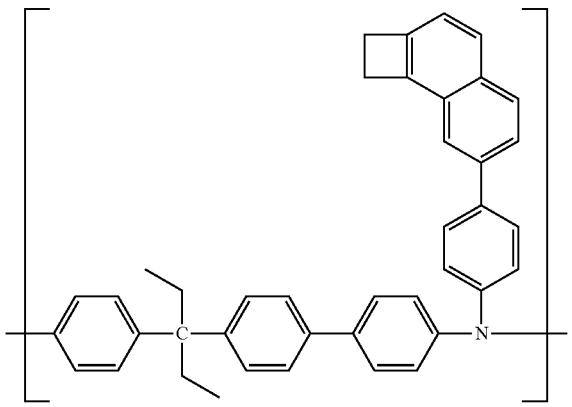

-continued
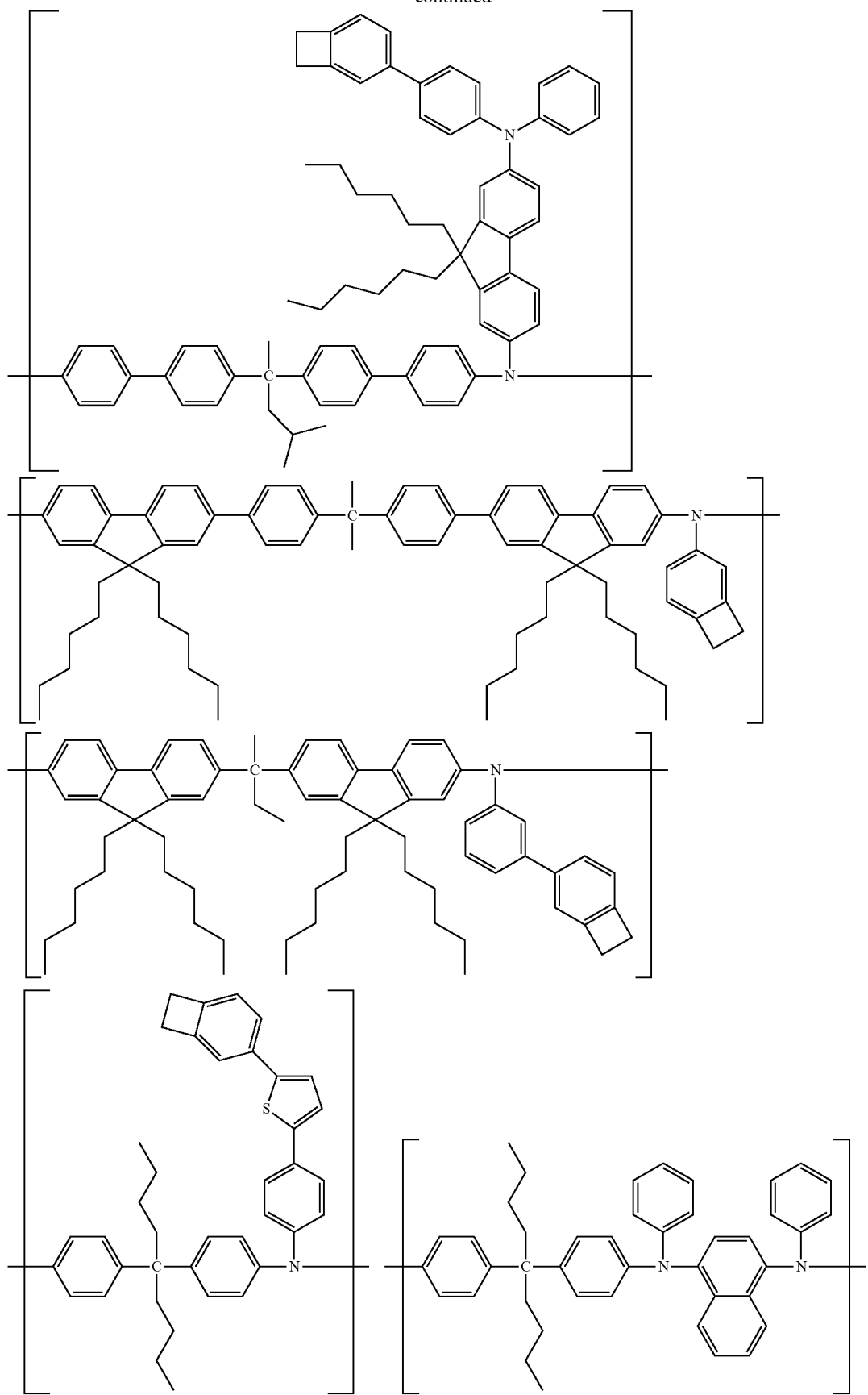

-continued
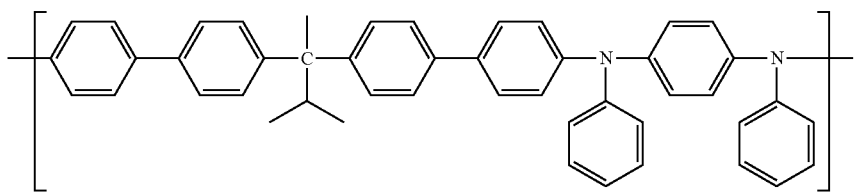
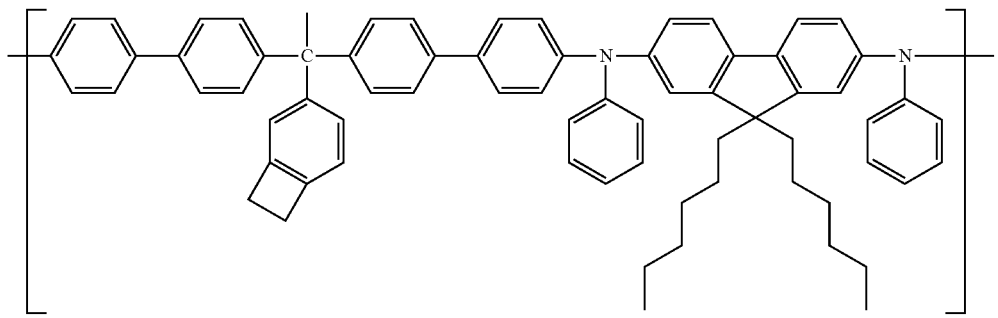
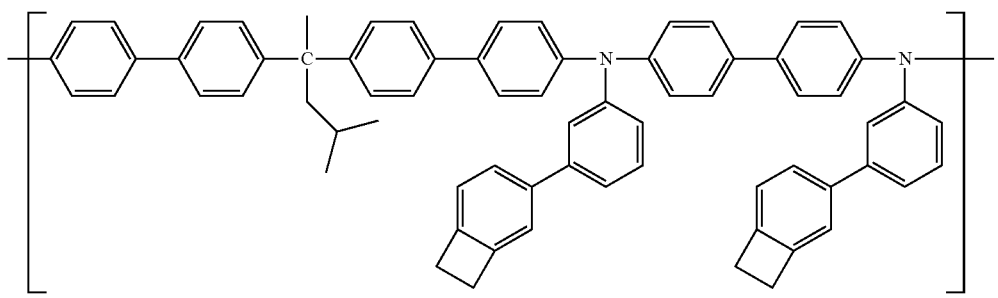
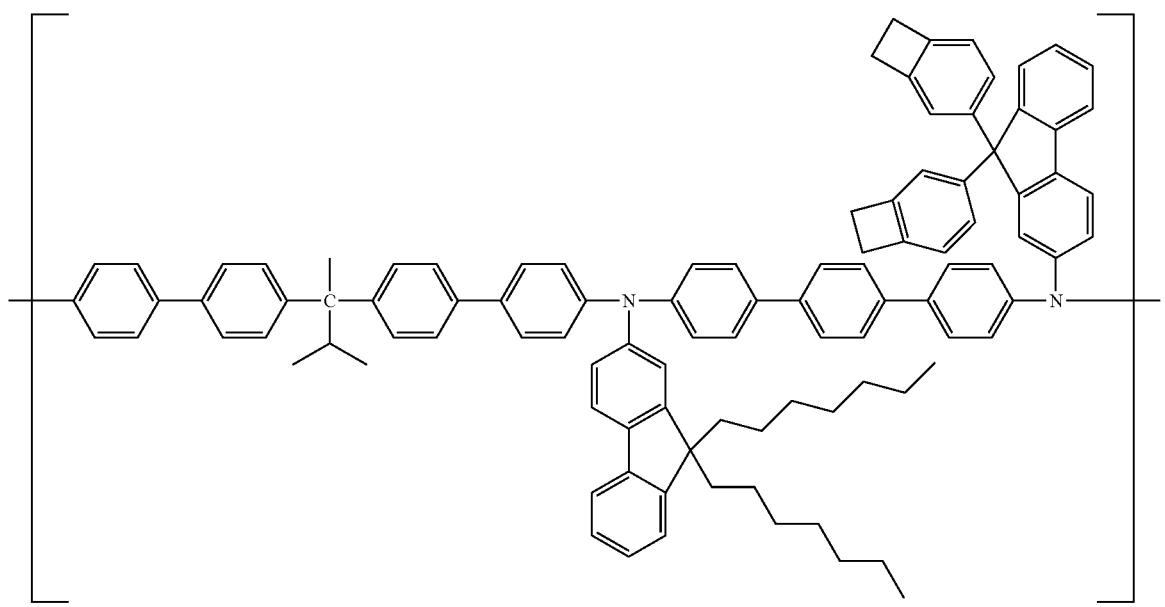

[Ka 18]
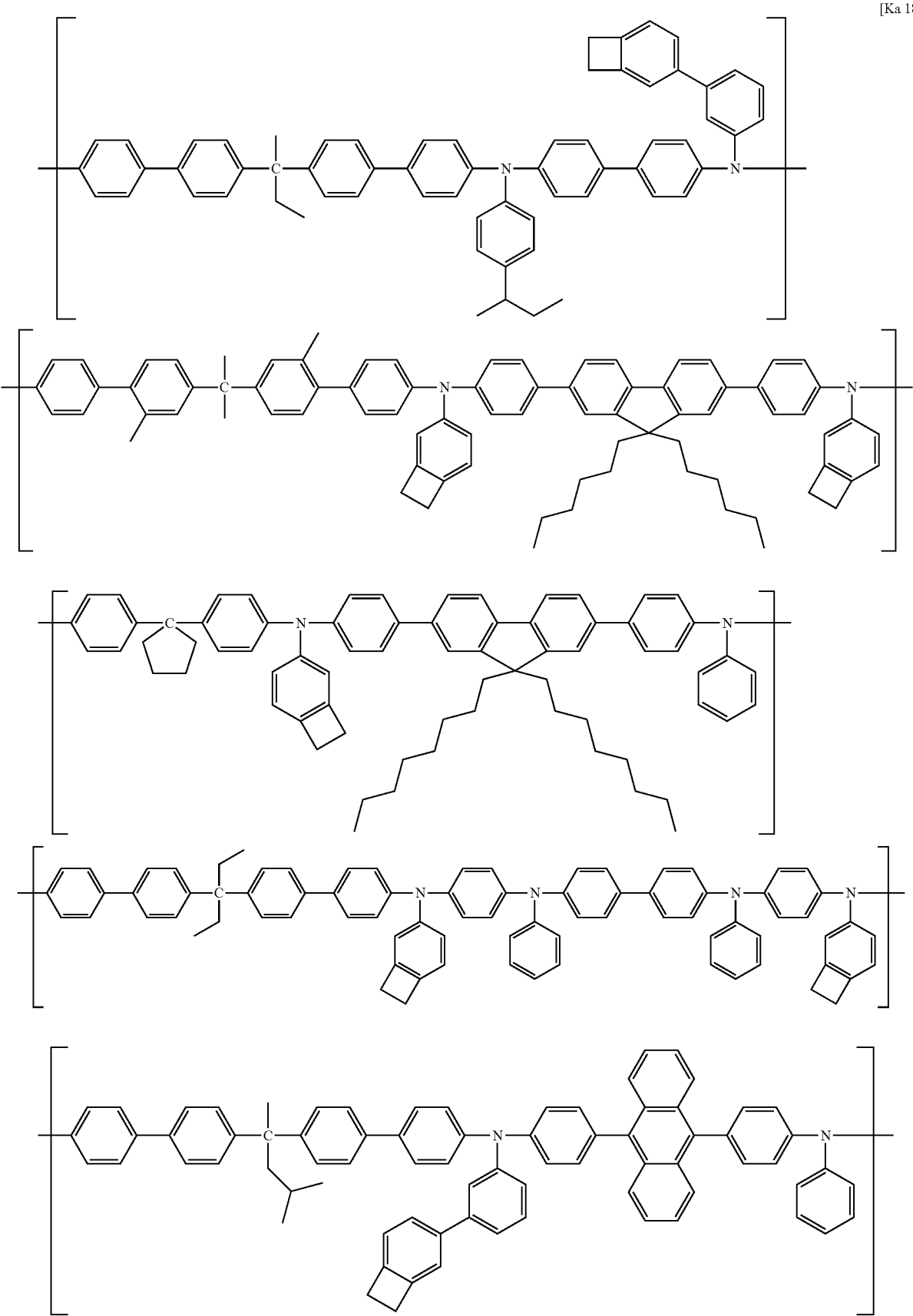

-continued
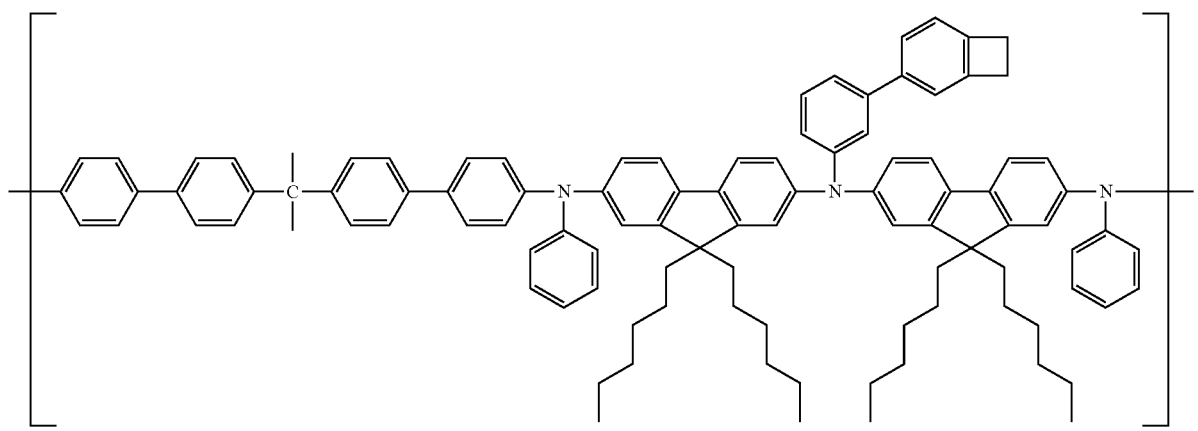
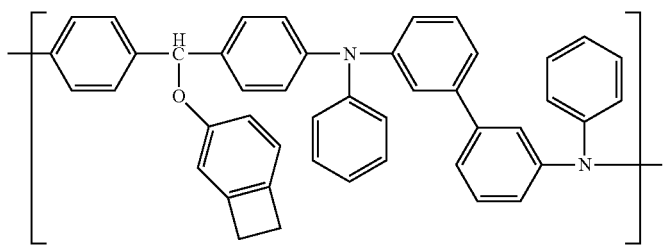
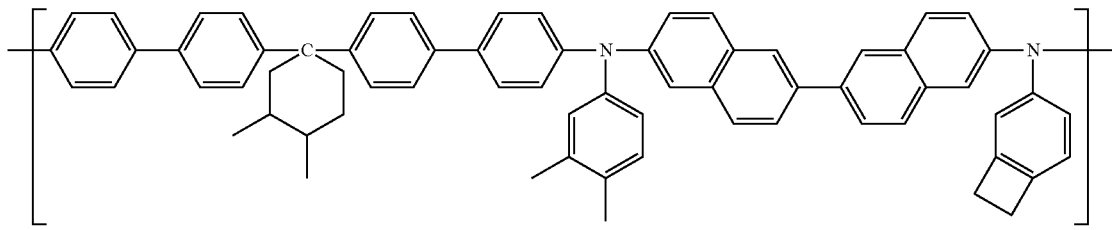
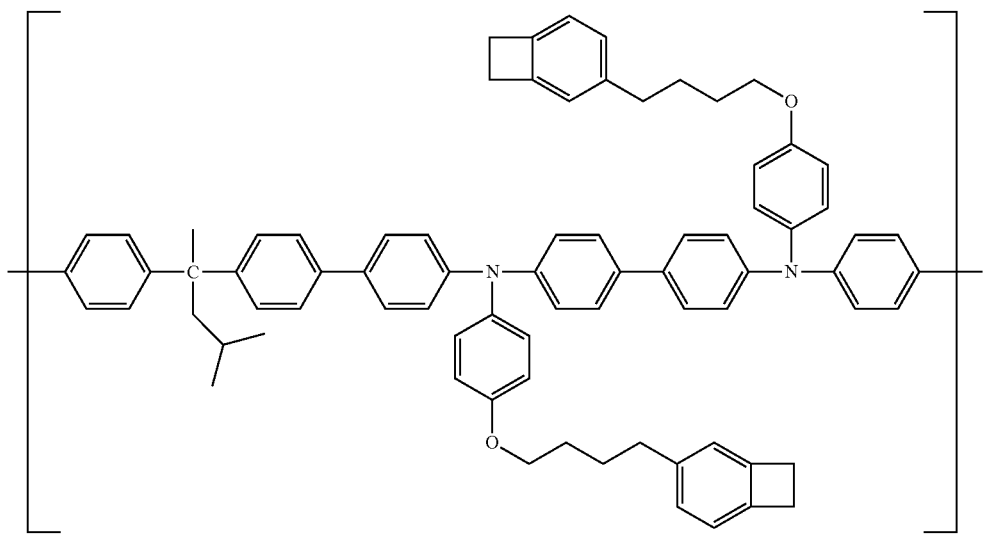

-continued
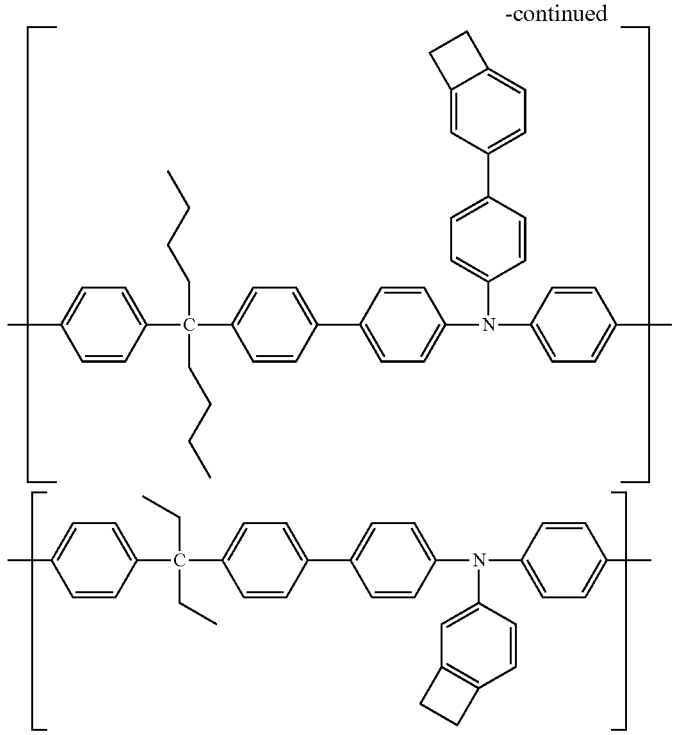
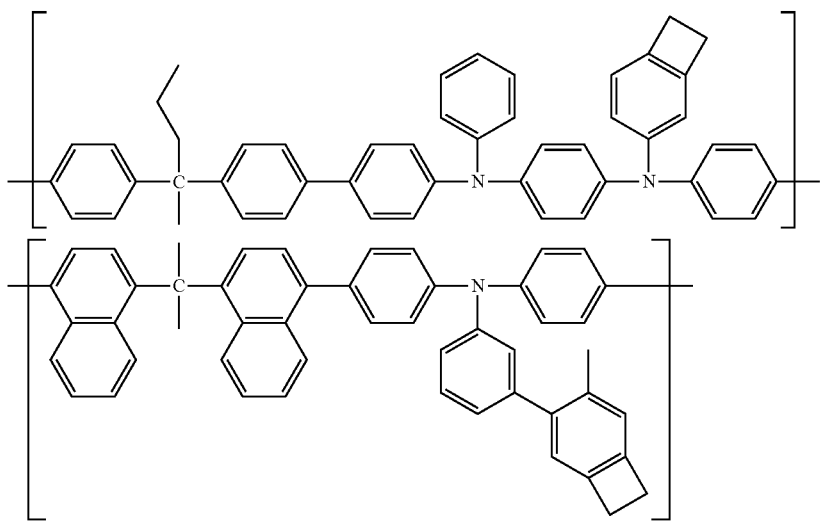
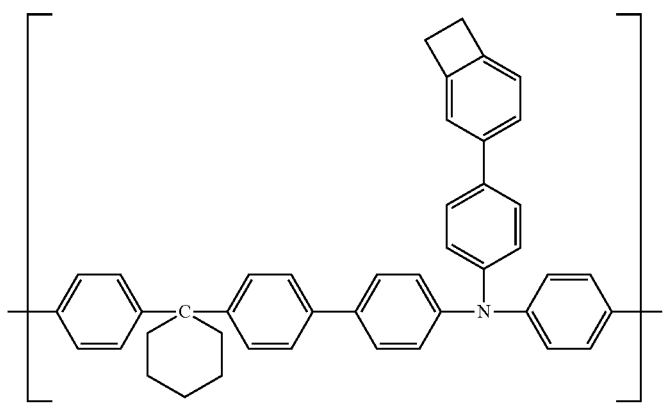

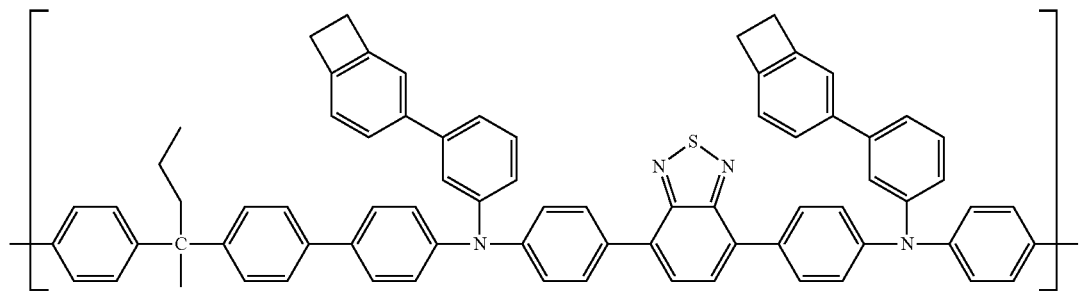
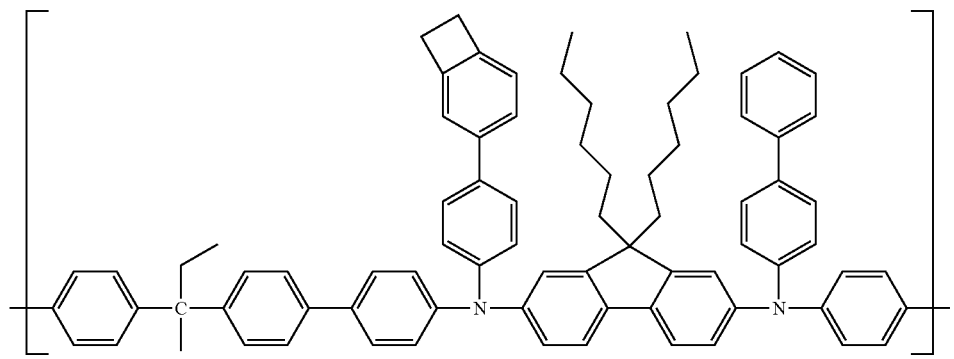
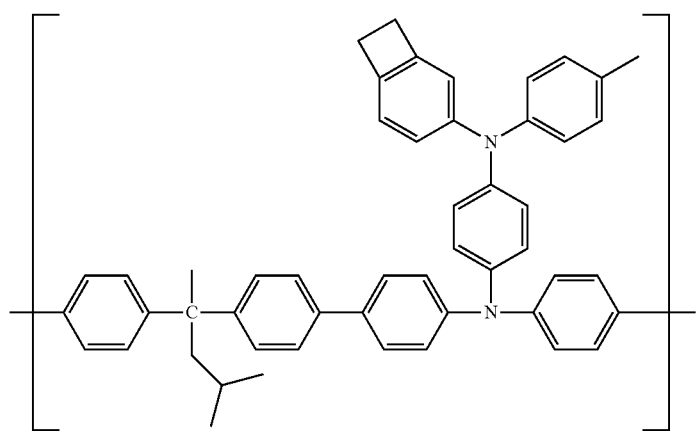
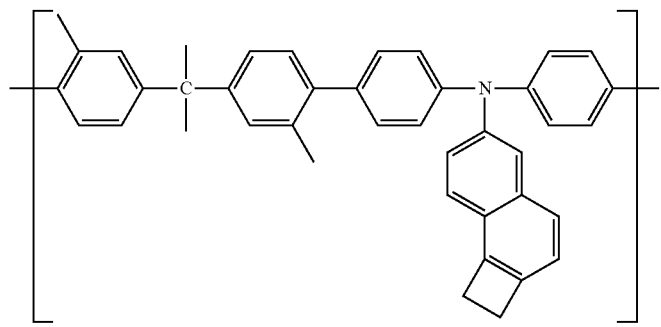

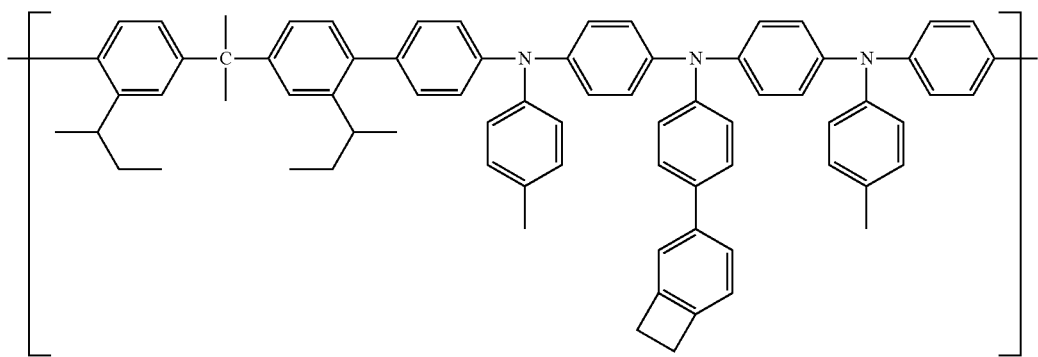
[Ka 19]
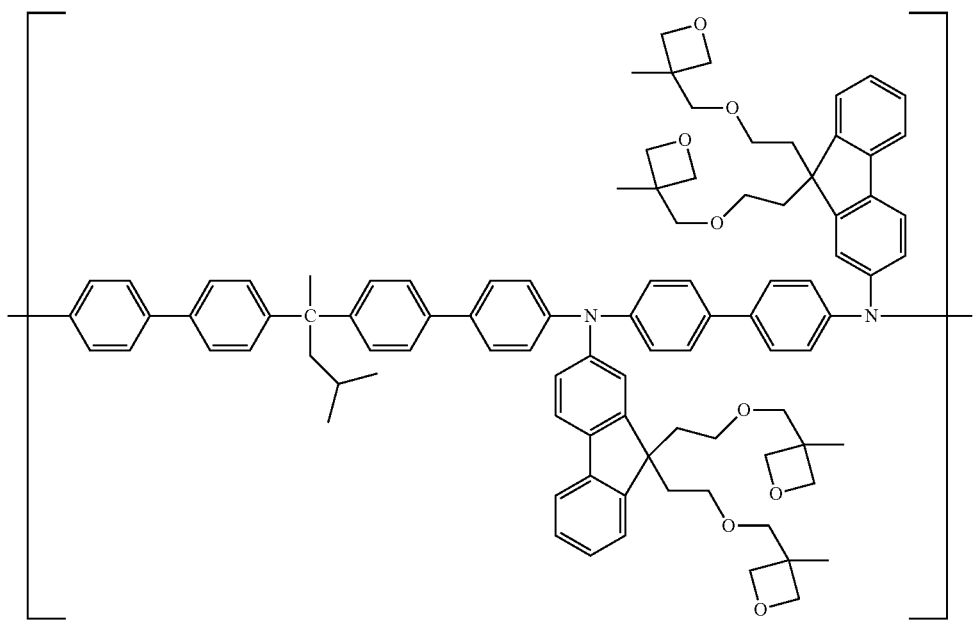
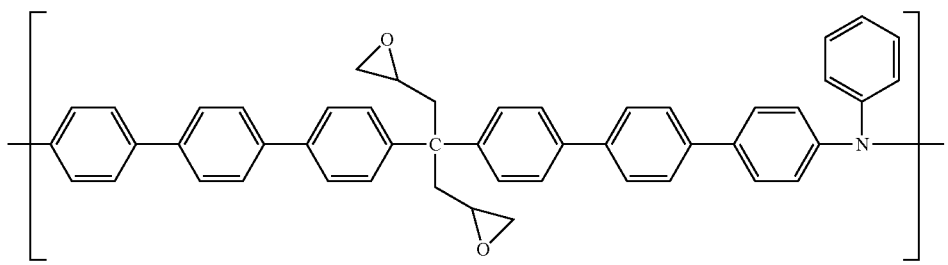
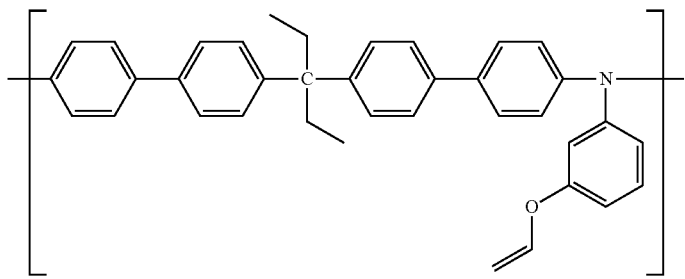

-continued
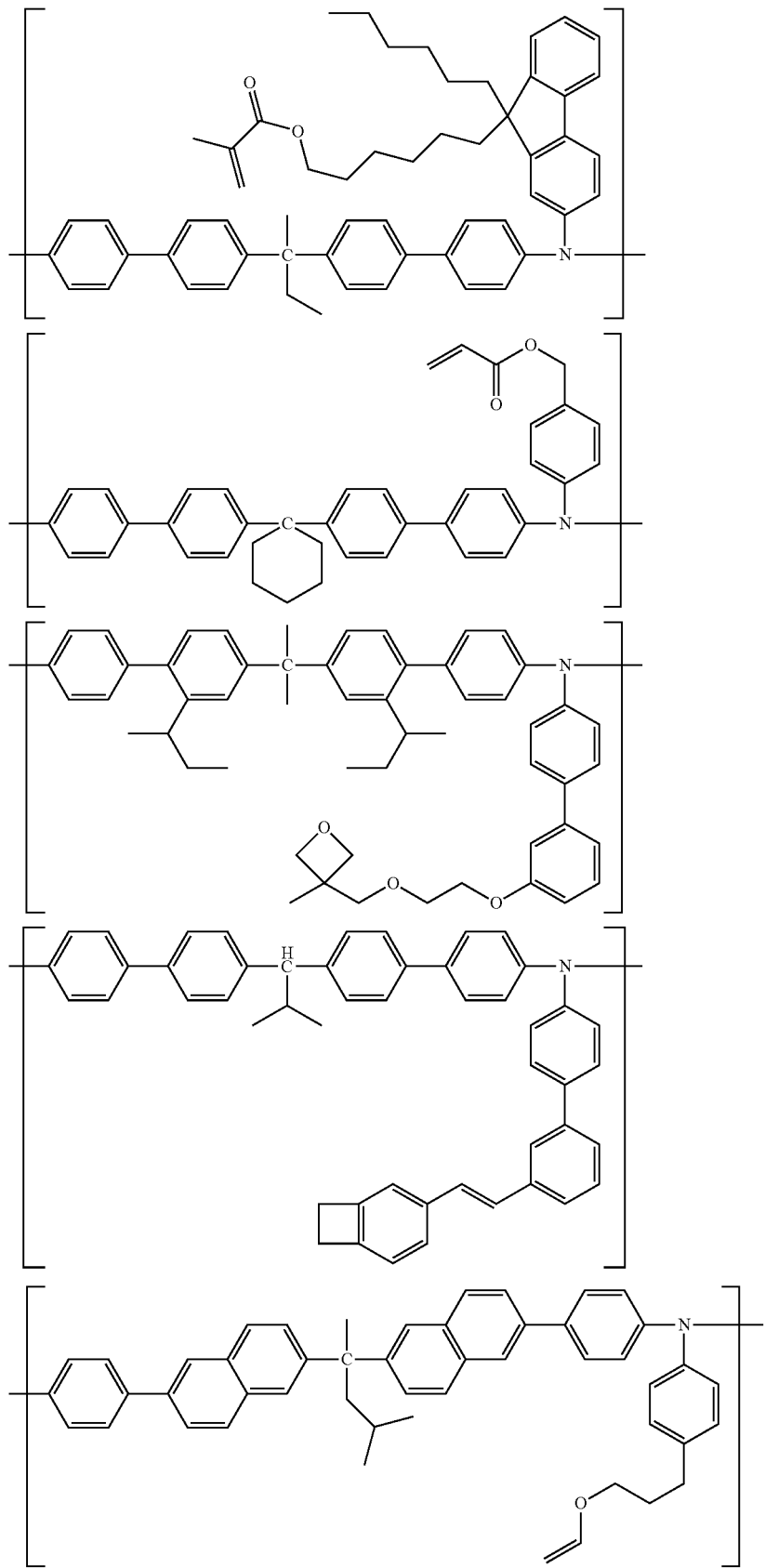

-continued
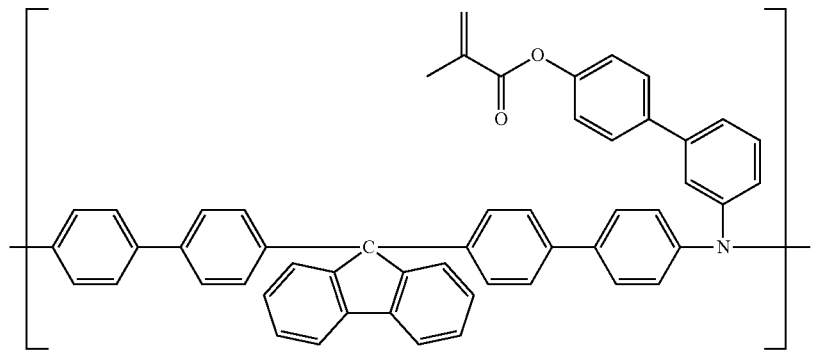
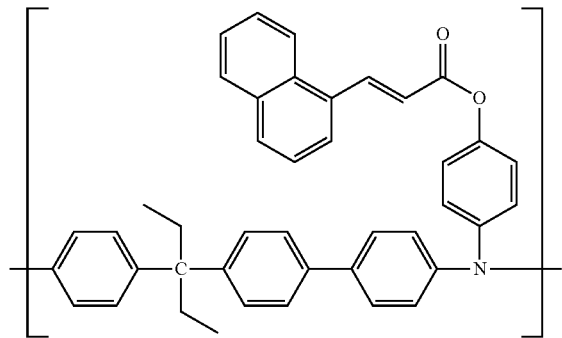
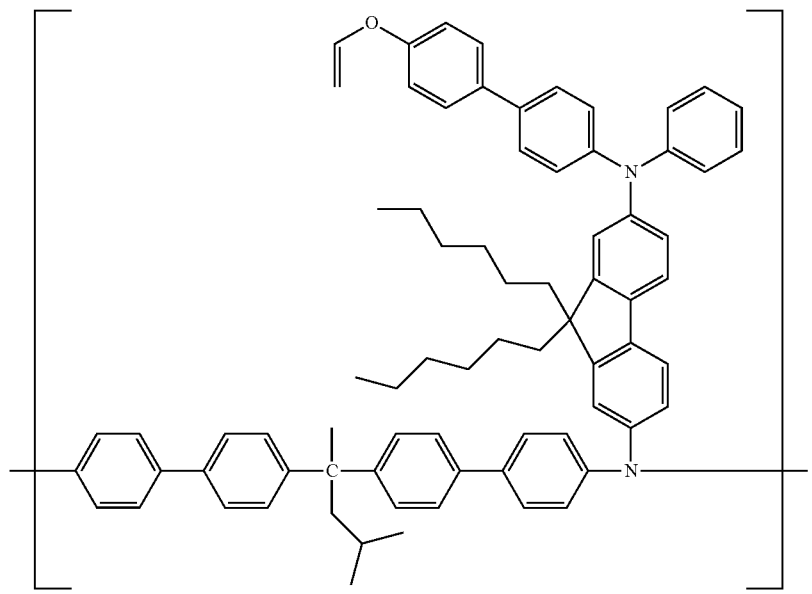
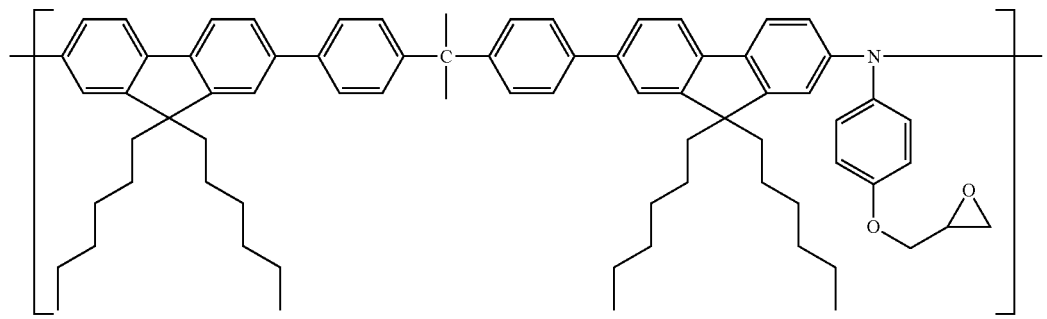

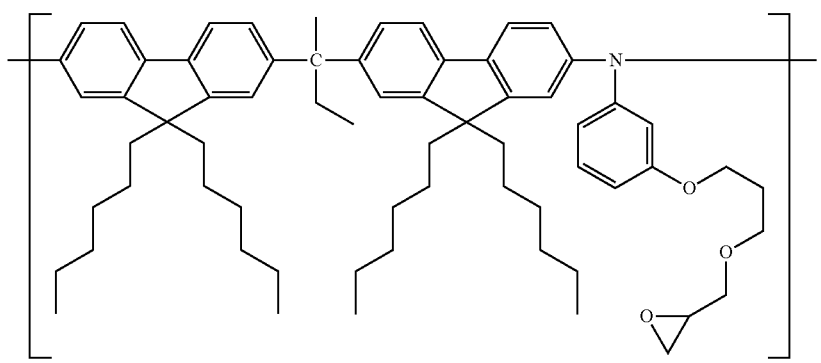
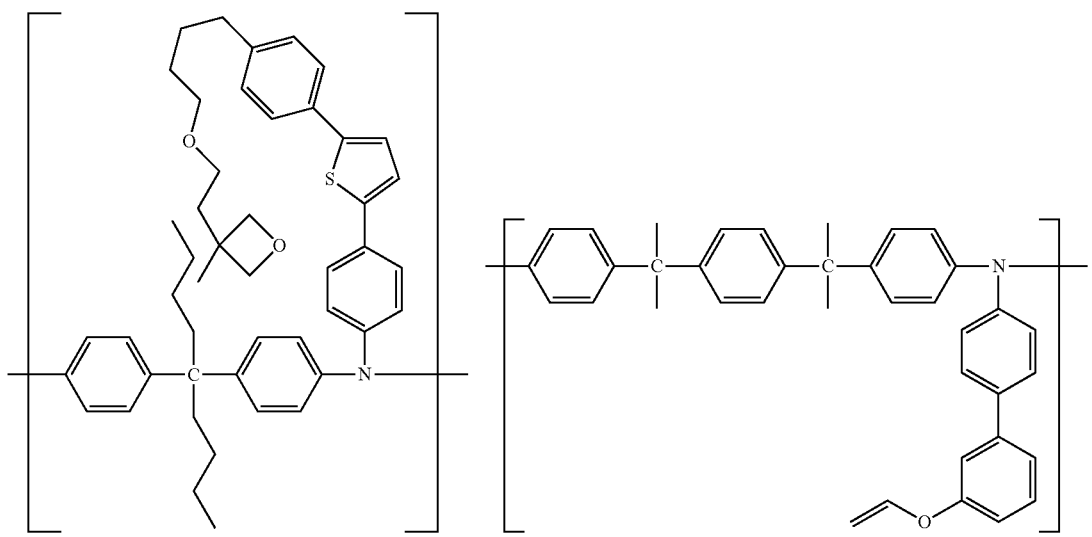
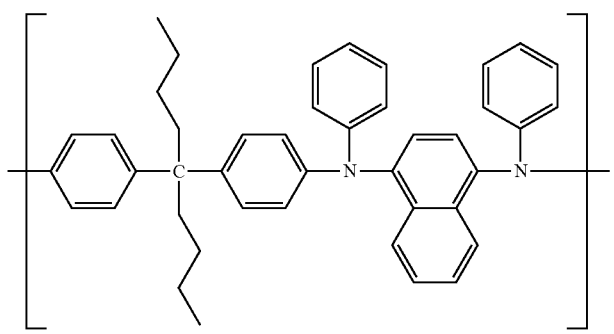
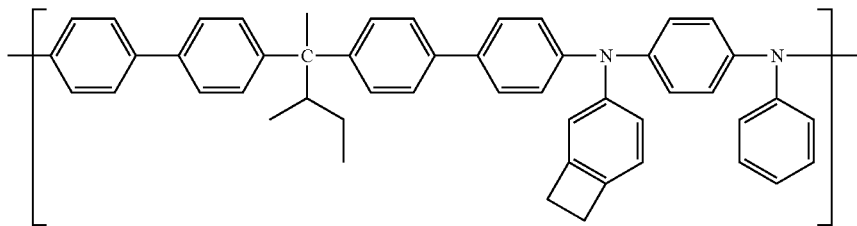

-continued

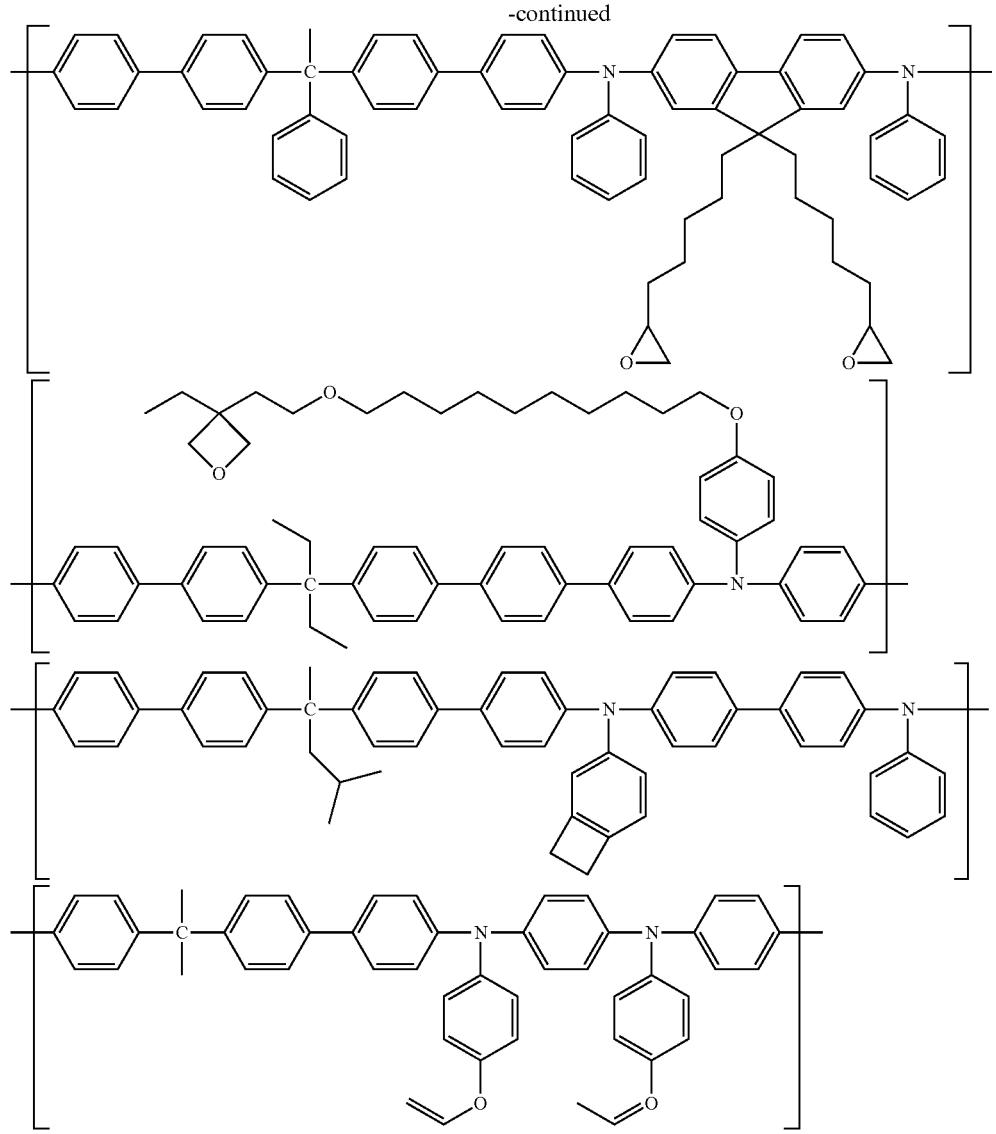

The glass transition temperature of the polymer of the invention is usually 50° C. or higher, preferably 80° C. or more, more preferably 100° C. or more, and is usually 300° C. or lower.

When within the above-described range, the polymer has an excellent heat resistance, and provides an element having improved drivable life, thus such polymer being preferred.

Also, the ionization potential of the polymer of the invention is usually 4.5 eV or more, preferably 4.8 eV or more, and is usually 6.0 eV or less, preferably 5.7 eV or less.

When within the above-described range, the polymer has an excellent charge transporting ability, and provides an element having decreased driving voltage, thus such polymer being preferred.

[2. Production Process]

Production process of the polymer of the invention is not particularly limited, and may be any process that can provide the polymer of the invention. For example, the polymer can be produced by a polymerization process according to Suzuki reaction, a polymerization process according to Grignard reaction, a polymerization process according to Yamamoto, a polymerization process according to Ullmann reaction, a polymerization process according to Buchwald-Hartwig reaction, or the like.

In the case of the polymerization process according to Ullmann reaction and the polymerization process according to Buchwald-Hartwig reaction, the polymer of the invention is synthesized by, for example, reacting a dihalogenated aryl compound represented by formula (1a) (wherein X represents a halogen atom such as I, Br, Cl, or F) with a primary aminoaryl compound or a secondary diaminoaryl compound represented by formula (2a).

[Ka 20]

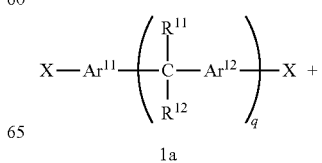

1a

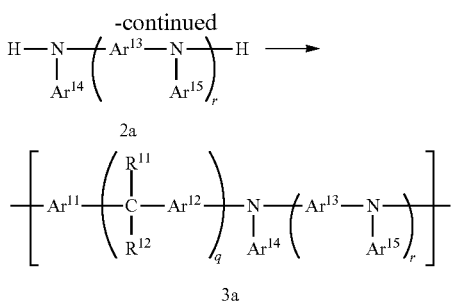

2a

3a (In the above formula, X represents a halogen atom, and $Ar^{11}$ to $Ar^{15}$, $R^{11}$, $R^{12}$, and r are the same as defined with respect to the foregoing general formula (1), provided that q represents 1.)

Additionally, in the aforesaid polymerization process, the reaction of forming N-aryl bond is usually conducted in the presence of a base such as potassium carbonate, sodium tert-butoxide, or triethylamine. Also, the reaction can be conducted in the presence of a transition metal catalyst such as a copper or palladium complex.

In the case of the polymerization process according to Suzuki reaction, the polymer of the invention is synthesized by, for example, reacting a boron derivative represented by formula (1b) (wherein R represents an arbitrary substituent, and is usually a hydroxyl group or an alkoxy group optionally forming a ring) with a dihalogenated aryl compound represented by formula (2b).

[Ka 21]

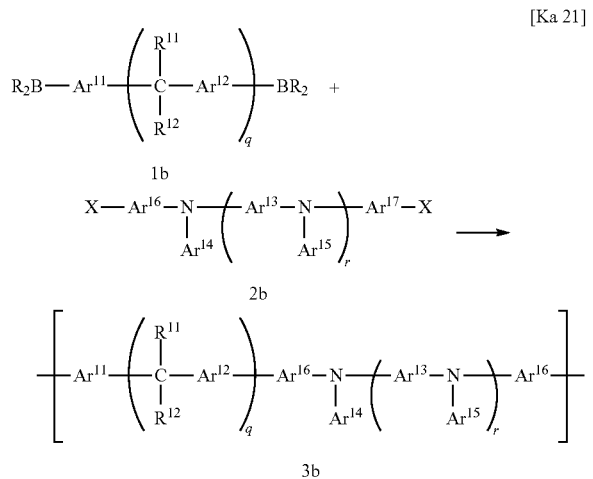

1b

2b

3b (In formula, R represents an arbitrary substituent, and X, $Ar^{11}$ to $Ar^{17}$, $R^{11}$, $R^{12}$, and r are the same as defined with respect to the foregoing general formula (1), provided that q represents 1.)

Additionally, in the aforesaid polymerization process, the step of reaction between the boron derivative and the dihalide is usually conducted in the presence of a base such as potassium carbonate, sodium tert-butoxide, or triethylamine. Also, the reaction can be conducted, as needed, in the presence of a transition metal catalyst such as a copper or palladium complex. Further, in the step of reaction with the boron derivative, the reaction can be conducted in the presence of a base such as potassium carbonate, sodium tert-butoxide, or triethylamine, and a transition metal catalyst such as a palladium complex.

In addition, the polymer of the invention can also be synthesized by polymerizing a carbonyl compound or a divinyl compound with a triarylamine wherein a hydrogen atom exists at p-position with respect to the amino group.

<Organic Electroluminescent Element Material and Organic Electroluminescent Element Composition>

The polymer of the invention is preferably used as a material for an organic electroluminescent element.

Also, the composition of the invention for an organic electroluminescent element contains the polymer of the invention and at least a solvent. Additionally, the composition of the invention for the organic electroluminescent element may contain only one kind of the polymer of the invention or may contain two or more kinds of the polymers with any ratio and any combination.

The composition of the invention for an organic electroluminescent element is preferably used as a coating solution upon forming an organic layer which is disposed between an anode and a cathode of an organic electroluminescent element according to the wet film formation method.

The composition of the invention for forming an organic electroluminescent element is particularly preferably used for forming a hole injection layer or a hole-transporting layer in the organic electroluminescent element.

Additionally, here, in the case where the layer between the anode and the luminescent layer in the organic electroluminescent element is constituted by one layer, this layer is referred to as "hole-transporting layer" and, in the case where the layer is constituted by two or more layers, a layer in contact with the anode is referred to as "hole injection layer", and other layer or layers are collectively referred to as "hole-transporting layer or layers". Also, in some cases, layers disposed between the anode and the luminescent layer are collectively referred to as "hole injection•transport layer".

The solvent to be contained in the organic electroluminescent composition is preferably a solvent which dissolves the polymer of the invention, and is usually a solvent which dissolves the polymer of the invention in a content of 0.1% by weight or more, preferably 0.5% by weight or more, more preferably 1% by weight or more.

Additionally, the composition of the invention for the organic electroluminescent element contains the polymer of the invention in a content of usually 0.01% by weight or more, preferably 0.05% by weight or more, more preferably 0.1% by weight or more, and contains in a content of 50% by weight or less, preferably 20% by weight or less, more preferably 10% by weight or less.

Kind of the solvent to be contained in the composition of the invention for the organic electroluminescent element is not particularly limited. As solvents capable of dissolving the polymer of the invention, there are illustrated, preferably, organic solvents, for example, aromatic compounds such as toluene, xylene, mesitylene, and cyclohexylbenzene; halogen-containing solvents such as 1,2-dichloroethane, chlorobenzene, and o-dichlorobenzene; ether type solvents such as aliphatic ethers, e.g., ethylene glycol dimethyl ether, ethylene glycol diethyl ether, propylene glycol-1-monomethyl ether acetate (PGMEA), and aromatic ethers, e.g., 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole; and ester series solvents such as aliphatic esters, e.g., ethyl acetate, n-butyl acetate, ethyl lactate, and n-butyl lactate, and ariphatic esters e.g., phenyl acetate, phenyl propionate, methyl benzoate, ethyl benzoate, isopropyl benzoate, propyl benzoate, and n-butyl benzoate. These may be used independently or in any combination of two or more thereof with any ratio.

The concentration of the solvent contained in the composition of the invention for the organic electroluminescent element is usually 40% by weight or more, preferably 60% by weight or more, more preferably 80% by weight or more.

As the solvent to be contained in the composition of the invention for the organic electroluminescent element, there are illustrated those solvents which have a vapor pressure at 25° C. of usually 10 mmHg or less, preferably 5 mmHg or less, and 0.1 mmHg or more. The process of producing the organic electroluminescent element according to the wet film formation method can be made preferable by use of such solvent, and the composition can be made appropriate for the properties of the polymer of the invention by use of the solvent. Specific examples of such solvent include the aforesaid aromatic solvents such as toluene, xylene, and mesitylene; ether series solvents; and ester series solvents. The concentration of these solvents in the composition is usually 10% by weight or more, preferably 30% by weight or more, more preferably 50% by weight or more.

Also, as the solvent to be contained in the composition of the invention for the organic electroluminescent element, there are illustrated mixed solvents of a solvent which has a vapor pressure at 25° C. of usually 2 mmHg or more, preferably 3 mmHg or more, more preferably 4 mmHg or more and a vapor pressure of 10 mmHg or less and a solvent which has a vapor pressure at 25° C. of usually less than 2 mmHg, preferably not more than 1 mmHg, more preferably not more than 0.5 mmHg. Use of such mixed solvents enable formation of a uniform layer containing the polymer of the invention and, further, additives such as an electron-accepting compound to be described hereinafter, by the wet film formation method. The concentration of such mixed solvent in the composition of the invention for the organic electroluminescent element is usually 10% by weight or more, preferably 30% by weight or more, more preferably 50% by weight or more.

Also, other solvents than those described above can be used as well. For example, amides such as N,N-dimethylformamide and N,N-dimethylacetamide; and dimethylsulfoxide can be used as well. Further, the composition of the invention for the organic electroluminescent element may contain various additives such as a leveling agent and a defoaming agent.

<Structure of Organic Electroluminescent Element>

The organic electroluminescent element of the invention is an organic electroluminescent element which includes a substrate having provided thereon an anode, one, two or more organic layers, and a cathode in this order, with at least one of the organic layers containing a network polymer formed by cross-linking the aforesaid polymer of the invention. Here, the organic layers include a hole injection layer, a hole-transporting layer, a luminescent layer, a hole-blocking layer, an electron-transporting layer, and an electron injection layer. It is preferred for the hole injection layer and/or hole-transporting layer to contain the network polymer formed by cross-linking the aforesaid polymer of the invention.

Also, with the organic electroluminescent element of the invention, all of the hole injection layer, hole-transporting layer, and luminescent layer are preferably formed by the wet film formation method.

Layer structure of the organic electroluminescent element produced by the process of the invention and a general process for its formation will be described below by reference to FIG. 1.

FIG. 1 is a schematic view of a cross-section showing one structural example of the organic electroluminescent element in accordance with the invention. In FIG. 1, 1 stands for a substrate, 2 an anode, 3 a hole injection layer, 4 a hole-transporting layer, 5 a luminescent layer, 6 a hole-blocking layer, 7 an electron-transporting layer, 8 an electron injection layer, and 9 a cathode.

Additionally, in the invention, the wet film formation method means a method of forming a film in a wet manner, such as a spin coating method, a dip coating method, a die coating method, a bar coating method, a blade coating method, a roll coating method, a spray coating method, a capillary coating method, an inkjet method, a screen printing method, a gravure printing method, and a flexography method. Of these film formation methods, a spin coating method, a spray coating method, and an inkjet method are preferred. This is because these methods conform to the liquid properties peculiar to the coating composition to be used for the organic electroluminescent element.

[Substrate]

The substrate is supposed to function as a support of the organic electroluminescent element, and a plate of quartz or glass, a metal plate or a metal foil, a plastic film or sheet, or the like is used as the substrate. In particular, a glass plate or a plate of transparent synthetic resin such as polyester, polymethacrylate, polycarbonate, or polysulfone is preferred. In the case of using a synthetic resin substrate, attention must be paid on gas barrier properties thereof. In case when gas barrier properties of the substrate is too small, the resulting organic electroluminescent element might be deteriorated due to the outside air through the substrate, thus too small gas barrier properties not being preferred. Therefore, it is one preferred method to provide on at least one side of the synthetic resin substrate a dense silicon oxide film or the like to thereby ensure gas barrier properties.

[Anode]

The anode is supposed to function so as to inject holes into a layer on the luminescent layer side.

This anode is usually constituted by a metal such as aluminum, gold, silver, nickel, palladium, or platinum; a metal oxide such as an oxide of indium and/or tin; a metal halogenide such as copper iodide; carbon black; or poly(3-methylthiophene); an electrically conductive high polymer such as polypyrrole or polyaniline.

Formation of the anode is usually conducted by a sputtering method or a vacuum deposition method in many cases. Also, in the case of forming the anode by using fine particles of electrically conductive metal oxide or fine powder of electrically conductive high polymer, the anode can also be formed by dispersing them in an appropriate binder resin solution and coating the solution on a substrate. Further, with electrically conductive high polymer, the anode can also be formed by forming a thin film directly on the substrate by electrolytic polymerization or by coating the electrically conductive high polymer on the substrate (Appl. Phys. Lett., vol. 60, p. 2711, 1992).

The anode is usually of a single layer structure but, as needed, it may be of a multi-layer structure composed of plural materials.

The thickness of the anode varies depending upon required transparency. In the case where transparency is required, it is preferred to adjust the visible light transmittance to usually 60% or more, preferably 80% or more. In this case, the thickness of the anode is usually 5 nm or more, preferably 10 nm or more and is usually 1,000 nm or less, preferably about 500 nm or less. In the case where the substrate may be opaque, thickness of the anode may be any thickness, and the anode and the substrate may be one and the same. Furthermore, it is also possible to superpose a different electrically conductive material on the above-described anode.

It is preferred to subject the anode surface to ultraviolet ray (UV)/ozone treatment or to the treatment with oxygen plasma or argon plasma for the purpose of removing impurities adhered to the anode and to adjust ionization potential to thereby improve hole injection properties.

[Hole Injection Layer]

The hole injection layer is a layer for transporting holes from the anode to the luminescent layer and is usually formed on the anode. In the organic electroluminescent element of the invention, it is preferred to use a network polymer formed by cross-linking the aforesaid polymer of the invention for the hole injection layer.

The method for forming the hole injection layer in accordance with the invention is not particularly limited, and either a vacuum deposition method or a wet film formation method may be employed. From the standpoint of reducing dark spots, however, it is preferred to form the hole injection layer by the wet film formation method.

The thickness of the hole injection layer is usually 5 nm or more, preferably 10 nm or more, and is usually 1,000 nm or less, preferably 500 nm or less.

{Formation of Hole Injection Layer by Wet Film Formation Method}

In the case of forming the hole injection layer by wet film formation, usually, a material constituting the hole injection layer is mixed with an appropriate solvent (solvent for the hole injection layer) to prepare a composition for film formation (composition for forming the hole injection layer), and this composition for forming the hole injection layer is coated on a layer which is an underlayer of the hole injection layer (usually, an anode), followed by drying to form the hole injection layer.

(Hole-Transporting Compound)

The composition for forming the hole injection layer usually contains a hole-transporting compound as a material for constituting the hole injection layer and contains a solvent.

The hole-transporting compound is usually used for the hole injection layer of the organic electroluminescent element. High-molecular compounds such as polymers and low-molecular compounds such as monomers may be used so long as they are compounds having hole-transporting properties, with high-molecular compounds being preferred. In the invention, it is preferred to use the polymer of the invention as the high-molecular compound. Also, other hole-transporting compounds may be used.

As other hole-transporting compounds, those compounds are preferred which have an ionization potential of from 4.5 eV to 6.0 eV from the standpoint of barrier properties for preventing charge injection from the anode to the hole injection layer. Examples of other hole-transporting compounds include aromatic amine derivatives, phthalocyanine derivatives, porphyrin derivatives, oligothiophene derivatives, polythiophene derivatives, benzylphenyl derivatives, compounds wherein tertiary amines are connected through a fluorene group, hydrazine derivatives, silazane derivatives, silanamine derivatives, phosphamine derivatives, quinacridone derivatives, polyaniline derivatives, polypyrrole derivatives, polyphenylene vinylene derivatives, polythienylene vinylene derivatives, polyquinoline derivatives, polyquinoxaline derivatives, and carbon.

Additionally, in the invention, the term "derivatives" includes, taking aromatic amine derivatives for instance, aromatic amines themselves and compounds containing aromatic amine as a main structure, and the derivatives may be polymers or monomers.

As the hole-transporting compounds to be used as a material for the hole injection layer, any one of them may be contained, or two or more thereof may be contained. In the case of containing two or more kinds of the hole-transporting compounds, any combination may be employed, but a combined use of one, two or more kinds of the aromatic tertiary amine high-molecular compounds and one, two or more kinds of other hole-transporting compounds is preferred.

Of the above-illustrated compounds, aromatic amine compounds are preferred from the standpoint of visible light transmittance, with aromatic tertiary amine compounds being particularly preferred. Here, aromatic tertiary amine compounds are compounds having an aromatic tertiary amine structure, including compounds having a group derived from an aromatic tertiary amine.

The kind of the aromatic tertiary amine compound is not particularly limited but, from the standpoint of uniform light emission due to surface-smoothening effect, high-molecular compounds having a weight-average molecular weight of 1,000 or more and 1,000,000 or less (polymerization type compounds wherein repeating units are connected to each other) are more preferred. As preferred examples of the aromatic tertiary amine high-molecular compounds, there are illustrated high-molecular compounds having a repeating unit represented by the following formula (I).

[Ka 22]

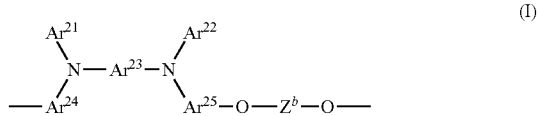

(I)

(In formula (I), $Ar^{21}$ and $Ar^{22}$ each independently represents an aromatic hydrocarbon group which may have a substituent or an aromatic heterocyclic group which may have a substituent. $Ar^{23}$ to $Ar^{25}$ each independently represents a divalent aromatic hydrocarbon group which may have a substituent or a divalent aromatic heterocyclic group which may have a substituent. Zb represents a linking group selected from among the following group of linking groups. Also, of $Ar^{21}$ to $Ar^{25}$, two groups bound to the same N atom may be connected to each other to form a ring.)

[Ka 23]

$$—Ar^{26}—\underset{\underset{O}{\|}}{\overset{\overset{O}{\|}}{C}}—Ar^{27}— \quad —Ar^{28}—\underset{\underset{O}{\|}}{\overset{\overset{O}{\|}}{S}}—Ar^{29}—$$

$$—Ar^{30}—\underset{\underset{O}{\|}}{\overset{\overset{Ar^{31}}{|}}{P}}—Ar^{32}— \quad —Ar^{33}—\underset{\underset{O}{\|}}{\overset{\overset{O}{\|}}{C}}—\underset{\underset{O}{\|}}{\overset{\overset{O}{\|}}{C}}—Ar^{34}—$$

$$—\underset{\underset{R^{16}}{|}}{\overset{\overset{R^{15}}{|}}{Si}}— \quad —\underset{\underset{O}{\|}}{\overset{\overset{O}{\|}}{C}}—Ar^{35}—\underset{\underset{O}{\|}}{\overset{\overset{O}{\|}}{C}}— \quad —\underset{\underset{O}{\|}}{\overset{\overset{O}{\|}}{C}}— \quad —\underset{\underset{O}{\|}}{\overset{\overset{O}{\|}}{S}}—$$

$$—\underset{\underset{O}{\|}}{\overset{\overset{Ar^{36}}{|}}{P}}—$$

(In each of the above-described formulae, $Ar^{26}$ to $Ar^{36}$ each independently represents a monovalent or divalent aromatic hydrocarbon group which may have a substituent or a monovalent or divalent aromatic heterocyclic group which may have a substituent. $R^{15}$ and $R^{16}$ each independently represents a hydrogen atom or any substituent.)

As the monovalent or divalent aromatic hydrocarbon group and the monovalent or divalent aromatic heterocyclic group of $Ar^{21}$ to $Ar^{36}$, groups derived from a benzene ring, a naphthalene ring, a phenenthrene ring, a thiophene ring, and a pyridine ring are preferred from the standpoint of solubility, heat resistance, and hole injection·transport properties of the high-molecular compound, with groups derived from a benzene ring and a naphthalene ring being more preferred.

The monovalent or divalent aromatic hydrocarbon group and the monovalent or divalent aromatic heterocyclic group of $Ar^{21}$ to $Ar^{36}$ may further have a substituent. The molecular weight of the substituent is usually 400 or less, with about 250 or less being preferred. As the substituent, an alkyl group, an alkenyl group, an alkoxy group, an aromatic hydrocarbon group, an aromatic heterocyclic group, and the like are preferred.

When $R^{15}$ and $R^{16}$ each represents an arbitrary substituent, examples of the substituent include an alkyl group, an alkenyl group, an alkoxy group, a silyl group, a siloxy group, an aromatic hydrocarbon group, and an aromatic heterocyclic group.

As specific examples of the aromatic tertiary amine high-molecular compounds having a repeating unit represented by formula (1), there are illustrated those which are described in WO2005/089024.

In addition, as the hole-transporting compound, an electrically conductive polymer (PEDOT/PSS) obtained by polymerizing a thiophene derivative of 3,4-ethylenedioxythiophene in high-molecular polystyrenesulfonic acid is also preferred. Also, a product obtained by capping the ends of the polymer with methacrylate or the like may be employed.

Additionally, the hole-transporting compound may be a cross-linkable polymer to be described in the following item of [Hole-transporting layer].

The concentration of the hole-transporting compound in the composition for forming the hole injection layer may be arbitrary so long as the effects of the invention are not seriously spoiled but, from the standpoint of uniformity of film thickness, the concentration is usually 0.01% by weight or more, preferably 0.1% by weight or more, still more preferably 0.5% by weight or more, and is usually 70% by weight or less, preferably 60% by weight or less, still more preferably 50% by weight or less. If this concentration is too large, there might result uneven film thickness whereas, if too small, there might result defects in the formed hole injection layer.

(Electron-Accepting Compound)

The composition for forming the hole injection layer preferably contains an electron-accepting compound as a material for constituting the hole injection layer.

The electron-accepting compound is preferably a compound having oxidizing power and having the ability of accepting one element from the above-described hole-transporting compound. Specifically, compounds having an electron affinity of 4 eV or more are preferred, and compounds having an electron affinity of 5 eV or more are more preferred.

As such electron-accepting compound, there are illustrated, for example, one, two or more compounds selected from the group consisting of triarylboron compounds, metal halides, Lewis acids, organic acids, onium salts, and salts between arylamine and Lewis acid. More specific examples thereof include onium salts substituted with organic groups, such as 4-isopropyl-4'-methyldiphenyliodonium tetrakis (pentafluorophenyl)borate and triphenylslulfonium tetrafluoroborate (WO2005/089024); high-valence inorganic compounds such as iron (III) chloride (JP-A-11-251067) and ammonium peroxodisulfate; cyano compounds such as tetracyanoethylene; aromatic boron compounds such as tris(pentafluorophenyl)boran (JP-A-2003-31365); fullerene derivatives; iodine; and sulfonate ions such as polystyrenesulfonate ion, alkylbenzenesulfonate ion, and camphorsulfonate ion.

These electron-accepting compounds can improve conductivity of the hole injection layer by oxidizing the hole-transporting compound.

The content of the electron-accepting compound based on the hole-transporting compound in the hole injection layer or in the composition for forming the hole injection layer is usually 0.1 mol % or more, preferably 1 mol % or more, but usually 100 mol % or less, preferably 40 mol % or less.

(Other Constituent Materials)

As materials of the hole injection layers, other components may be contained in addition to the above-described hole-transporting compounds and the electron-accepting compounds so long as the effects of the invention are not seriously spoiled. Examples of such other components include various light-emitting materials, electron-transporting compounds, binder resins, and agents for improving coating properties. Additionally, other components may be used alone or may be used in any combination of two or more thereof with any ratio.

(Solvent)

Of the solvents in the composition for forming the hole injection layer to be used for the wet film formation method, at least one solvent is preferably a compound which can dissolve the materials constituting the above-described hole injection layer. Also, this solvent has a boiling point of preferably 110° C. or higher, preferably 140° C. or higher, particularly 200° C. or higher, and usually 400° C. or lower, particularly preferably 300° C. or lower. In case when the boiling point of the solvent is too low, drying rate might become so fast that film quality would be deteriorated. Also, in case when the boiling point of the solvent is too high, the temperature in a drying step must be adjusted to a high level, which might adversely affect other layers or substrate.

Examples of the solvent include ether series solvents, ester series solvents, aromatic hydrocarbon series solvents, and amide series solvents.

Examples of the ether series solvents include aliphatic ethers such as ethylene glycol dimethyl ether, ethylene glycol diethyl ether, and propylene glycol-1-monomethyl ether acetate (PGMEA); and aromatic ethers such as 1,2-dimethoxybenzene, 1,3-dimethoxybenzene, anisole, phenethole, 2-methoxytoluene, 3-methoxytoluene, 4-methoxytoluene, 2,3-dimethylanisole, and 2,4-dimethylanisole.

Examples of the ester series solvents include aromatic esters such as phenyl acetate, phenyl propionate, methyl benzoate, ethyl benzoate, propyl benzoate, and n-butyl benzoate.

Examples of the aromatic hydrocarbon series solvents include toluene, xylene, cyclohexylbenzene, 3-isopropylbiphenyl, 1,2,3,4-tetramethylbenzene, 1,4-diisopropylbenzene, cyclohexylbenzene, and methylnaphthalene.

Examples of the amide series solvents include N,N-dimethylformamide and N,N-dimethylacetamide.

In addition, dimethylsulfoxide or the like can also be used.

These solvents may be used independently or in any combination of two or more with any ratio.

(Film Formation Method)

After preparing the composition for forming the hole injection layer, this composition is coated on a layer which is an underlayer of the hole injection layer (usually, an anode), followed by drying to form the hole injection layer.

The temperature in the coating step is preferably 10° C. or higher and is 50° C. or lower in order to prevent defects of the resulting film due to formation of crystals in the composition.

The relative humidity in the coating step is not particularly limited so long as the effects of the invention are not seriously spoiled, and is usually 0.01 ppm or more and is usually 80% or less.

After coating, the film of the composition for forming the hole injection layer is dried by, usually, heating or the like. Examples of heating means to be employed in the heating step include a clean oven, a hot plate, infrared rays, a halogen heater, and irradiation with microwaves. Of these, a clean oven and a hot plate are preferred in order to impart heat uniformly throughout the film.

With respect to the heating temperature in the heating step, it is preferred to heat at a temperature equal to or higher than the boiling point of the solvent used in the composition for forming the hole injection layer, so long as the effects of the invention are not seriously spoiled. Also, when the solvent used for the hole injection layer is a mixed solvent containing two or more kinds of solvents, it is preferred to heat at a temperature equal to or higher than the boiling point of at least one of the solvents. In consideration of elevation of boiling point of the solvent, it is preferred in the heating step to heat at a temperature of preferably 120° C. or higher and preferably 410° C. or lower.

In the heating step, the heating period is not particularly limited so long as the heating temperature is equal to or higher than the boiling point of the solvent in the composition for forming the hole injection layer and so long as sufficient insolubilization of the coated film does not occur, but is preferably 10 seconds or longer and is usually 180 minutes or shorter. In case when the heating period is too long, components in other layers tend to diffuse whereas, in case when too short, the hole injection layer tends to become non-uniform. Heating may be carried out in two steps.

<Formation of Hole Injection Layer by Vacuum Deposition Method>

In the case of forming the hole injection layer by vacuum deposition, one, two or more kinds of materials for constituting the hole injection layer (the aforesaid hole-transporting compound, the electron-accepting compound, etc.) are placed in a crucible provided in a vacuum vessel (in the case where two or more kinds of materials are used, the materials are placed in respective crucibles) and, after evacuating the vacuum vessel by means of an appropriate vacuum pump to a degree of about $10^{-4}$ Pa, the crucible is heated (in the case where two or more kinds of materials are used, respective crucibles are heated) to evaporate with controlling the evaporation amount (in the case where two or more kinds of materials are used, the crucibles are respectively heated with independently controlling the evaporation amounts), to thereby form a hole injection layer on an anode on a substrate placed in face of the crucible. Additionally, in the case of using two or more kinds of materials, it is also possible to place a mixture of them in a crucible and heat it to evaporate and form the hole injection layer.

The degree of vacuum upon vacuum deposition is not particularly limited so long as the effects of the invention are not seriously spoiled, but is usually $0.1 \times 10^{-6}$ Torr ($0.13 \times 10^{-4}$ Pa) or more and is usually $9.0 \times 10^{-6}$ Torr ($12.0 \times 10^{-4}$ Pa) or less. The vacuum deposition rate is not particularly limited so long as the effects of the invention are not seriously spoiled, but is usually 0.1 angstrom/sec or more and is usually 5.0 angstroms/sec or less. The film formation temperature upon vacuum deposition is not particularly limited so long as the effects of the invention are not seriously spoiled, but vacuum deposition is conducted at a temperature of preferably 10° C. or higher and preferably 50° C. or lower.

[Hole-Transporting Layer]

The method for forming the hole-transporting layer in accordance with the invention is not particularly limited and may be either the vacuum deposition method or the wet film formation method but, from the standpoint of reduction of dark spots, it is preferred to form the hole-transporting layer by the wet film formation method.

In the case where the hole injection layer exists, the hole-transporting layer can be formed on the hole injection layer and, in the case where no hole injection layer exists, it can be formed on an anode. Also, the organic electroluminescent element may have a structure wherein the hole-transporting layer is omitted.

As materials for forming the hole-transporting layer, those materials are preferred which show high hole-transporting ability and can transport injected holes with good efficiency. In order to realize this, such materials preferably have high transparency to visible light, large hole mobility, and excellent stability and scarcely generate, upon production or use, impurities which function as traps. Also, since the hole-transporting layer is in many cases in contact with the luminescent layer, it preferably does not quench the light emitted from the luminescent layer or does not form exciplex at the interface between the hole-transporting layer and the luminescent layer to thereby reduce efficiency.

As materials for such hole-transporting layer, any material may be employed that has been used as a material for constituting hole-transporting layer, and those materials are preferred which have been illustrated hereinbefore as hole-transporting compounds to be used in the aforesaid network polymer formed by cross-linking the polymer of the invention and in the aforesaid hole injection layer. Also, there are illustrated arylamine derivatives, fluorene derivatives, Spiro derivatives, carbazole derivatives, pyridine derivatives, pyrazine derivatives, pyrimidine derivatives, triazine derivatives, quinoline derivatives, phenanthroline derivatives, phthalocyanine derivatives, porphyrin derivatives, silole derivatives, oligothiophene derivatives, condensed polycyclic aromatic derivatives, metal complexes, etc.

Also, there are illustrated, for example, polyvinylcarbazole derivatives, polyarylamine derivatives, polyvinyltriphenylamine derivatives, polyfluorene derivatives, polyarylene derivatives, tetraphenylbenzidine-containing polyarylene ether sulfone derivatives, polyarylene vinylene derivatives, polysiloxane derivatives, polythiophene derivatives, and poly(p-pheylene vinylene) derivatives. These may be any of alternating copolymers, random polymers, block polymers, and graft polymers. In addition, they may be polymers wherein the main chain may be branched to have three or more end portions or may be so-called dendrimers.

Of these, polyarylamine derivatives and polyarylene derivatives are preferred. The polyarylamine derivatives are preferably polymers having a repeating unit represented by the following formula (II). In particular, polymers composed of the repeating unit represented by the following formula (II) are preferred. In this case, in the respective repeating units, $Ar^a$s or $Ar^b$s may be different from each other.

[Ka 24]

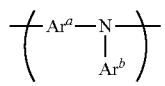

(II)

(In formula (II), $Ar^a$ and $Ar^b$ each independently represents a monovalent or divalent aromatic hydrocarbon group or a monovalent or divalent aromatic heterocyclic group, which may have a substituent.)

As the monovalent or divalent aromatic hydrocarbon group which may have a substituent, there are illustrated groups derived from a 6-membered single ring or from a 2- to 5-ring-condensed ring system such as a benzene ring, a naphthalene ring, an anthracene ring, a phenanthrene ring, a perylene ring, a tetracene ring, a pyrene ring, a benzopyrene ring, chrysene ring, a triphenylene ring, an acenaphthene ring, a fluoranthene ring, and fluorene ring, and groups wherein two or more of these rings are directly connected to each other.

As the monovalent or divalent aromatic heterocyclic group which may have a substituent, there are illustrated groups derived from a 5- or 6-membered single ring or from a 2- to 4-ring-condensed ring system such as a furan ring, a benzofuran ring, a thiophene ring, a benzothiophene ring, a pyrrole ring, a pyrazole ring, an imidazole ring, an oxadiazole ring, an indole ring, a carbazole ring, a pyrroloimidazole ring, a pyrrolopyrazole ring, a pyrrolopyrole ring, a thienopyrole ring, a thienothiophene ring, a furopyrrole ring, a furofuran ring, a thienofuran ring, a benzisoxazole ring, a benzisothiazole ring, a benzimidazole ring, a pyridine ring, a pyrazine ring, a pyridazine ring, a pyrimidine ring, a triazine ring, a quinoline ring, an isoquinoline ring, a cinnoline ring, a quinoxaline ring, a phenanthridine ring, a benzimidazole ring, a perimidine ring, a quinazoline ring, a quinazolinone ring, and an azrene ring, and groups wherein 2 to 4 of these rings are connected to each other.

From the standpoint of solubility and heat resistance, $Ar^a$ and $Ar^b$ each independently represents preferably a group derived from a ring selected from the group consisting of a benzene ring, a naphthalene ring, an anthracene ring, a phenanthrene ring, a triphenylene ring, a pyrene ring, a thiophene ring, a pyridine ring, and a fluorene ring or a group wherein two or more benzene rings are connected to each other (for example, a biphenyl group (a biphenyl group) or a terphenylene group (a terphenylene group)). Of these, a benzene ring-derived group (a phenyl group), a group wherein two benzene rings are connected to each other (a biphenyl group), and a fluorene ring-derived group (a fluorenyl group) are preferred.

As the substituent which the aromatic hydrocarbon group and the aromatic heterocyclic group represented by $Ar^a$ and $Ar^b$ may have, there are illustrated an alkyl group, an alkenyl group, an alkynyl group, an alkoxy group, an aryloxy group, an alkoxycarbonyl group, a dialkylamino group, a diarylamino group, an acyl group, a halogen atom, a haloalkyl group, an alkylthio group, an arylthio group, a silyl group, a siloxy group, a cyano group, an aromatic hydrocarbon ring group, and an aromatic heterocyclic group.

As the polyarylene group, there are illustrated polymers having as the repeating unit thereof an arylene group such as an aromatic hydrocarbon group or aromatic heterocyclic group, which may have those substituents illustrated as $Ar^a$ and $Ar^b$ in the foregoing formula (II).

The polyarylene derivative is preferably a polymer having a repeating unit composed of the following formula (III-1) and/or the following formula (III-2).

[Ka 25]

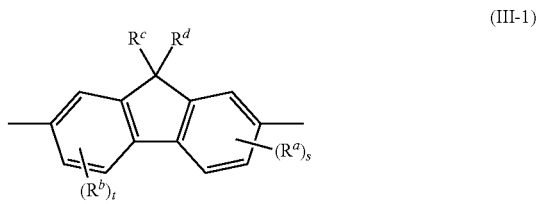

(III-1)

(In formula (III-1), $R^a$, $R^b$, $R^c$, and $R^d$ each independently represents an alkyl group, an alkoxy group, a phenylalkyl group, a phenylalkoxy group, a phenyl group, a phenoxy group, an alkylphenyl group, an alkoxyphenyl group, an alkylcarbonyl group, an alkoxycarbonyl group, or a carboxy group. t and s each independently represents an integer of 0 to 3. In the case where t or s is 2 or more, plural $R^a$s or $R^b$s contained in one molecule may be the same or different, or adjacent $R^a$s or $R^b$s may form a ring.)

[Ka 26]

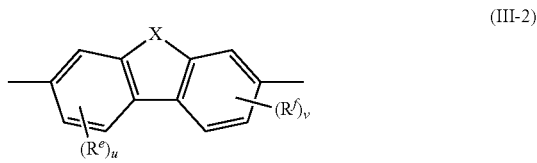

(III-2)

(In formula (III-2), $R^e$ and $R^f$ each independently is the same as $R^a$, $R^b$, $R^c$, or $R^d$ in the above formula (III-1). u and v each independently represents an integer of 0 to 3. In the case where u or v is 2 or more, plural $R^e$s or $R^f$s contained in one molecule may be the same or different, or adjacent $R^e$s or $R^f$s may form a ring. X represents an atom or atoms constituting 5- or 6-membered ring.)

Specific examples of X are —O—, —BR—, —NR—, —SiR$_2$—, —PR—, —SR—, —CR$_2$—, and a group formed by a combination thereof. Additionally, R represents a hydrogen atom or any organic group. An organic group in the invention is a group which contains at least one carbon atom.

Also, the polyarylene derivatives preferably further contain a repeating unit represented by the following formula (III-3) in addition to the repeating unit composed of the foregoing formulae (III-1) and/or (III-2).

[Ka 27]

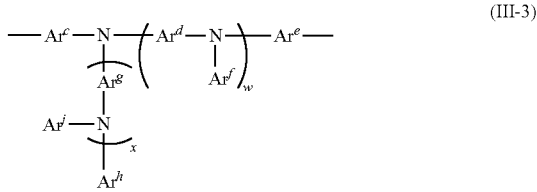

(III-3)

(In formula (III-3), $Ar^c$ to $Ar^i$ each independently represents an aromatic hydrocarbon group or an aromatic heterocyclic group, which may have a substituent. w and x each independently represents 0 or 1.)

Specific examples of $Ar^c$ to $Ar^j$ are the same as $Ar^a$ and $Ar^b$.

As specific examples of the above-described formulae (III-1) to (III-3) and specific examples of the polyarylene derivatives, there are illustrated those which are described in JP-A-2008-98619.

In the case where the hole-transporting layer is formed by the wet film formation method, a composition for forming the hole-transporting layer is prepared in the same manner as in formation of the above-described hole injection layer and, after wet film formation, the film is heated to dry.

The composition for forming the hole-transporting layer contains a solvent in addition to the above-described hole-transporting compound. The solvent to be used is the same as that used for the composition for forming the above-described hole injection layer. Also, film-forming conditions, heat-drying conditions, and the like are the same as in the case of forming the hole injection layer.

In the case of forming the hole-transporting layer by the vacuum deposition method, too, the film-forming conditions and the like are the same as in the case of forming the above-described hole injection layer.

The hole-transporting layer may contain, in addition to the above-described hole-transporting compound, various light-emitting materials, electron-transporting compounds, binder resins, coating property-improving agents, etc.

The hole-transporting layer may also be a layer formed by cross-linking a cross-linkable compound. The cross-linkable compound is a compound which has a cross-linkable group and forms a network high-molecular compound when cross-linked.

Examples of the cross-linkable group include a group derived from a cyclic ether such as oxetane or epoxy; a group derived from an unsaturated double bond such as a vinyl group, a trifluorovinyl group, a styryl group, an acryl group, methacryloyl, or cinnamoyl; and a group derived from benzocyclobutene.

The cross-linkable compound may be any of a monomer, an oligomer, and a polymer. The cross-linkable compound may include only one kind or any combination of two or more kinds thereof with any ratio.

As the cross-linkable compound, hole-transporting compounds having a cross-linkable group are preferably used. The hole-transporting compounds include those which have been illustrated above, and the cross-linkable compounds include those wherein the cross-linkable group is bound to the main chain or side chain of the hole-transporting compounds. In particular, the cross-linkable group is preferably bound to the main chain through a linking group such as an alkylene group. In addition, the hole-transporting compound is preferably a polymer containing a repeating unit having a cross-linkable group, and is preferably a polymer containing a repeating unit wherein a cross-linkable group is connected to the above-described formula (II) or formulae (III-1) to (III-3) directly or through a linking group.

Examples of the hole-transporting compound include derivatives of nitrogen-containing aromatic compounds such as pyridine derivatives, pyrazine derivatives, pyrimidine derivatives, triazine derivatives, quinolone derivatives, phenanthroline derivatives, carbazole derivatives, phthalocyanine derivatives, and porphyrin derivatives; triphenylamine derivatives; silole derivatives; oligothiophene derivatives, condensed polycyclic aromatic derivatives; and metal complexes. Of these, nitrogen-containing aromatic derivatives such as pyridine derivatives, pyrazine derivatives, pyrimidine derivatives, triazine derivatives, quinolone derivatives, phenanthroline derivatives, and carbazole derivatives; triphenylamine derivatives; silole derivatives; condensed polycyclic aromatic derivatives; metal complexes; and the like are preferred, with triphenylamine derivatives being particularly preferred.

In order to form the hole-transporting layer by cross-linking the cross-linkable compound, a composition for forming the hole-transporting layer, which contains the cross-linking compound dissolved or dispersed in a solvent, is prepared and subjected to wet film formation, followed by cross-linking the compound.

The composition for forming the hole-transporting layer may contain additives for accelerating cross-linking reaction, in addition to the cross-linkable compound. Examples of the additives for accelerating cross-linking reaction include polymerization initiators and polymerization accelerators such as an alkylphenone compound, acylphosphine oxide compound, a metallocene compound, an oxime ester compound, an azo compound, and an onium salt; and photo sensitizers such as a condensed polycyclic hydrocarbon, a porphyrin compound, and a diaryl ketone compound.

In addition, a coating property-improving agent such as a leveling agent or a defoaming agent; an electron-accepting compound; a binder resin; and the like may also be contained.

The composition for forming the hole-transporting layer contains the cross-linkable compound in a content of usually 0.01% by weight or more, preferably 0.05% by weight or more, still more preferably 0.1% by weight or more and in a content of usually 50% by weight or less, preferably 20% by weight or less, more preferably 10% by weight or less.

After forming a film of the composition for forming the hole-transporting layer, which contains the cross-linkable compound in the above-described content, on an underlayer (usually the hole injection layer), the cross-linkable compound is cross-linked by heat and/or irradiation with actinic energy such as light to form a network high-molecular compound.

Conditions of temperature, humidity, and the like upon film formation are the same as with the wet film formation of the aforesaid hole injection layer.

Techniques of heating after film formation are not particularly limited but, as to heating temperature condition, the heating temperature is usually 120° C. or higher and is preferably 400° C. or lower.

Heating time is usually 1 minute or longer and is preferably 24 hours or shorter. Heating means are not particularly limited, and means of placing a multi-layer product having the thus-formed layers on a hot plate or means of heating in an oven is employed. For example, conditions of heating on a hot plate at 120° C. or higher for 1 minute or longer may be employed.

In the case of irradiating with actinic energy such as light, there are illustrated a method of irradiating by directly using a source of ultraviolet rays, visible light, or infrared rays, such as a super-high pressure mercury lamp, a high pressure mercury lamp, a halogen lamp, or an infrared lamp, and a method of irradiating using a mask aligner having the aforesaid light source built-in or using a conveyer-type light-irradiating apparatus. As to irradiation with other actinic energy than light, there is illustrated, for example, a method of using an apparatus for irradiating with microwaves generated from a magnetron, a so-called microwave oven. As to irradiation time, it is preferred to select condition necessary for reducing solubility of the film, and irradiation is conducted for a period of usually 0.1 second or longer and is preferably 10 hours or shorter.

Heating and irradiation with actinic energy such as light each may be conducted independently or in combination thereof and, in the case of employing the combination, the order of conducting them is not particularly limited.

The film thickness of the thus-formed hole-transporting layer is usually 5 nm or more, preferably 10 nm or more and is usually 300 nm or less, preferably 100 nm or less.

[Luminescent Layer]

A luminescent layer is provided on the hole injection layer or, in the case where the hole-transporting layer is provided, on the hole-transporting layer. The luminescent layer is a layer wherein holes injected from the anode and electrons injected from the cathode recombine with each other in the space between the electric field-applied electrodes, thus being excited and functioning as a light-emitting source.

[Materials for Luminescent Layer]

The luminescent layer contains, as the materials for constituting it, at least a material having light-emitting properties (light-emitting material) and contains preferably a compound having hole-transporting properties (hole-transporting compound) or a compound having electron-transporting properties (electron-transporting compound). It may also be possible to use the light-emitting material as a dopant material and use the hole-transporting compound or the electron-transporting compound as a host material. The light-emitting material is not particularly limited, and it suffices to use a substance which emits light of desired wavelength with good light-emitting efficiency. Further, the luminescent layer may contain other components within ranges of not seriously spoiling the effects of the invention. Additionally, in the case of forming the luminescent layer by the wet film formation method, it is preferred to use low-molecular weight materials as all of the materials.

[Light-Emitting Material]

As the light-emitting materials, any known materials can be applied. For example, they may be fluorescent light-emitting materials or may be phosphorescent light-emitting materials but, from the standpoint of internal quantum efficiency, phosphorescent light-emitting materials are preferred. Also, combination thereof may be employed; for example, a fluorescent light-emitting material may be used for blue color, and a phosphorescent light-emitting material may be used for green color or red color.

Additionally, for the purpose of improving solubility in a solvent, it is preferred to reduce symmetrical properties or rigidity of the light-emitting materials.

Of the light-emitting materials, fluorescent light-emitting materials will be illustrated below, but the fluorescent dyes are not limited only to the following illustrative ones.

As fluorescent light-emitting materials capable of emitting blue light (blue fluorescent dyes), there are illustrated, for example, naphthalene, perylene, pyrene, chrysene, anthracene, coumarin, p-bis(2-phenylethenyl)benzene, and derivatives thereof.

As fluorescent light-emitting materials capable of emitting green light (green fluorescent dyes), there are illustrated, for example, quinacridone derivatives, coumarin derivatives, and aluminum complexes such as $Al(C_9H_6NO)_3$.

As fluorescent light-emitting materials capable of emitting yellow light (yellow fluorescent dyes), there are illustrated, for example, rubrene and perimidone derivatives.

As fluorescent light-emitting materials capable of emitting red light (red fluorescent dyes), there are illustrated, for example, DCM (4-(dicyanomethylene)-2-methyl-6-(p-dimethylaminostyryl)-4H-pyran) series compounds, benzopyran derivatives, Rhodamine derivatives, benzothioxanthene derivatives, and azabenzothioxanthene derivatives.

As phosphorescent light-emitting materials, there are illustrated, for example, organometallic complexes containing a metal selected from groups 7 to 11 in the long-form periodic table (hereinafter, unless otherwise specified, the term "periodic table" means long-form periodic table).

As metals selected from groups 7 to 11 in the periodic table, there are illustrated, preferably, ruthenium, rhodium, palladium, silver, rhenium, osmium, iridium, platinum, and gold.

As a ligand in the complex, ligands wherein a (hetero)aryl group and pyridine, pyrazole, phenanthroline, or the like are connected, such as a (hetero)arylpyridine ligand and a (hetero)arylpyrazole ligand are preferred, with a phenylpyridine ligand and a phenylpyrazole ligand being particularly preferred. Here, "(hetero)aryl" represents an aryl group or a heteroaryl group.

As the phosphorescent light-emitting materials, there are specifically illustrated tris(2-phenylpyridine)iridium, tris(2-phenylpyridine)ruthenium, tris(2-phenylpyridine)palladium, bis(2-phenylpyridine)platinum, tris(2-phenylpyridine)osmium, tris(2-phenylphridine)rhenium, octaethylplatinum porphyrin, octaphenylplatinum porphyrin, octaethylpalladium porphyrin, and octaphenylpalladium porphyrin.

The molecular weight of the compound to be used as the light-emitting material may be arbitrary so long as the effects of the invention are not seriously spoiled, but is usually 10,000 or less, preferably 5,000 or less, more preferably 4,000 or less, still more preferably 3,000 or less and is usually 100 or more, preferably 200 or more, more preferably 300 or more, still more preferably 400 or more. In case when the molecular weight of the light-emitting material is too small, the heat resistance might be seriously reduced, gas might be generated, film quality of the formed film might be deteriorated, or change in morphology of the organic electroluminescent element due to migration or the like might be caused. On the other hand, in case when the molecular weight of the light-emitting material is too large, purification of the organic compound tends to become difficult or the organic compound tends to require a prolonged time upon dissolving it in a solvent.

Additionally, the above-described light-emitting materials may be used alone or in any combination of two or more thereof with any ratio.

The content of the light-emitting material in the luminescent layer may be arbitrary so long as the effects of the invention are not seriously spoiled, but is usually 0.05% by weight or more and is usually 35% by weight or less. In case when the content of the light-emitting material is too small, there might result uneven light emission whereas, in case when too large, the light-emitting efficiency might be reduced. Additionally, in the case where two or more kinds of the light-sensitive materials are used in combination, the total content of these materials is to be adjusted to fall within the above-described range.

(Hole-Transporting Compound)

The hole-transporting compound may be contained in the luminescent layer as its constituent material. Here, as low-molecular weight hole-transporting compounds of the hole-transporting compounds, there are illustrated, in addition to the various compounds illustrated as the aforesaid (low-molecular weight hole-transporting compounds) in the hole injection layer, aromatic diamines which contain two or more tertiary amines and wherein two or more condensed aromatic rings are connected to nitrogen atom, represented by, for example, 4,4'-bis[N-(1-naphthyl)-N-phenylamino]biphenyl (JP-A-5-234681), aromatic amine compounds having a starburst structure such as 4,4',4"-tris(1-naphthylphenylamino)

triphenylamine (Journal of Luminescence, 1997, Vol. 72-74, pp. 985), aromatic amine compounds composed of tetramer of triphenylamine (Chemical Communications, 1996, pp. 2175), and Spiro compounds such as 2,2',7,7'-tetrakis-(diphenylamino)-9,9'-spirobifluorene (Synthetic Metals, 1997, Vol. 91, pp. 209).

Additionally, in the luminescent layer, the hole-transporting compounds may be used independently or in any combination of two or more thereof with any ratio.

The content of the hole-transporting compound in the luminescent layer may be arbitrary so long as the effects of the invention are not seriously spoiled, but is usually 0.1% by weight or more and is usually 65% by weight or less. In case when the content of the hole-transporting compound is too small, the layer might tend to be susceptible to influence of a short circuit whereas, in case when too large, there might result uneven film thickness. Additionally, in the case where two or more kinds of the hole-transporting compounds are used in combination, the total content of these materials is to be adjusted to fall within the above-described range.

(Electron-Transporting Compound)

An electron-transporting compound may be contained in the luminescent layer as its constituent material. Here, as low-molecular weight electron-transporting compounds of the electron-transporting compounds, there are illustrated 2,5-bis(1-naphthyl)-1,3,4-oxadiazole (BND), 2,5-bis(6'-(2',2''-bipyridyl)-1,1-dimethyl-3,4-diphenylsilole (Py-PySPyPy), bathophenanthroline (BPhen), 2,9-dimethyl-4,7-diphenyl-1,10-phenanthroline (BCP, bathocuproine), 2-(4-bipnenylyl)-5-(-p-tertiary-butylphenyl)-1,3,4-oxadiazole (tBu-PBD), and 4,4'-bis(9-carbazole)-biphenyl (CBP). Additionally, in the luminescent layer, the electron-transporting compounds may be used independently or in any combination of two or more thereof with any ratio.

The content of the electron-transporting compound in the luminescent layer may be arbitrary so long as the effects of the invention are not seriously spoiled, but is usually 0.1% by weight or more and is usually 65% by weight or less. In case when the content of the electron-transporting compound is too small, the layer might tend to be susceptible to influence of a short circuit whereas, in case when too large, there might result uneven film thickness. Additionally, in the case where two or more kinds of the electron-transporting compounds are used in combination, the total content of these materials is to be adjusted to fall within the above-described range.

[Formation of Luminescent Layer]

In the case of forming the luminescent layer by the wet film formation method in accordance with the invention, a composition for forming the luminescent layer is prepared by dissolving the above-described materials in an appropriate solvent, and film formation is carried out by using the composition to form the luminescent layer.

As the solvent for the luminescent layer to be contained in the composition for forming the luminescent layer by the wet film formation method in accordance with the invention, any solvent can be used so long as it enables formation of the luminescent layer. Preferred examples of the solvent for the luminescent layer are the same solvents as have been illustrated with respect to the composition for forming the above-described hole injection layer.

The content of the solvent for the luminescent layer may be arbitrary so long as the effects of the invention are not seriously spoiled, but is usually 0.01% by weight or more and is usually 70% by weight or less. Additionally, in the case where two or more kinds of solvents for the luminescent layer are used in combination, the total content of these solvents is to be adjusted to fall within the above-described range.

Also, the concentration of the solid component such as the light-emitting material, hole-transporting compound, and electron-transporting compound in the composition for forming the luminescent layer is usually 0.01% by weight or more and is usually 70% by weight or less. In case when the concentration is too large, there might result uneven film thickness whereas, in case when too small, film defects might be generated.

The luminescent layer is formed by forming a film from the composition for forming the luminescent layer according to the wet film formation method, and drying the obtained coated film to thereby remove the solvent. To be specific, the method is the same as the method described above with respect to formation of the hole injection layer. The type of the wet film formation method is not limited so long as the effects of the invention are not seriously spoiled, and any type of the aforesaid method may be employed.

The film thickness of the luminescent layer is arbitrary so long as the effects of the invention are not seriously spoiled, but is usually 3 nm or more, preferably 5 nm or more and is usually 200 nm or less, preferably 100 nm or less. In case when the film thickness of the luminescent layer is too small, film defects might be generated whereas, in case when too large, driving voltage might be increased.

[Hole-Blocking Layer]

A hole-blocking layer may be provided between the luminescent layer and an electron injection layer to be described hereinafter. The hole-blocking layer is a layer to be formed on the luminescent layer so that the hole-blocking layer is in contact with the cathode-side surface of the luminescent layer.

This hole-blocking layer functions to prevent holes migrating from the anode from reaching the cathode and to transport electrons injected from the cathode effectively toward the luminescent layer.

As to physical properties required for materials constituting the hole-blocking layer, they are required to have a high electron mobility, a low hole mobility, a large energy gap (difference between HOMO and LUMO), and a high excited triplet level (T1). As materials of the hole-blocking layer which satisfy these conditions, there are illustrated mixed-ligand complexes such as bis(2-methyl-8-quinolinolato)(phenolato)aluminum, bis(2-methyl-8-quinolinolato)(triphenylsilanolato)aluminum, dinuclear metal complexes such as bis(2-methyl-8-quinolato)aluminum-μ-oxobis(2-methyl-8-quinolilato)aluminum, styryl compounds such as distyrylbiphenyl derivatives (JP-A-11-242996), triazole derivatives such as 3-(4-biphenylyl)-4-phenyl-5(4-tert-butylphenyl)-1,2,4-triazole (JP-A-7-41759), and phenanthroline derivatives such as bathocuproine (JP-A-10-79297). Furthermore, the compound having at least one pyridine ring substituted in the 2-, 4-, and 6-positions which is described in WO2005/022962 is also preferred as a material for the hole blocking layer.

Additionally, the materials of the hole blocking layer may be used alone or in any combination of two or more thereof with any ratio.

There are no limits as to the method of forming the hole blocking layer. Therefore, the layer can be formed by a wet film formation method, a vacuum deposition method, or other method.

The thickness of the hole blocking layer is arbitrary so long as the effects of the invention is not seriously spoiled, but is usually 0.3 nm or more, preferably 0.5 nm or more, and is usually 100 nm or less, preferably 50 nm or less.

[Electron-Transporting Layer]

An electron-transporting layer may be provided between the luminescent layer and an electron injection layer to be described hereinafter.

The electron-transporting layer is provided for the purpose of more improving light-emitting efficiency of the element, and is formed from a compound which can transport electrons injected from the cathode effectively in the space between electrodes across which electric field is applied, toward the luminescent layer.

As the electron-transporting compound to be used in the electron-transporting layer, those compounds are usually used which show high electron injection efficiency from the cathode or from the electron injection layer, and which have such high electron mobility that injected electrons can be transported with good efficiency. As compounds which satisfy such conditions, there are illustrated metal complexes such as 8-hydroxyquinoline aluminum complex (JP-A-59-194393), metal complexes of 10-hydroxybenzo[h]quinolone, oxadiazole derivatives, distyrylbiphenyl derivatives, silole derivatives, metal complexes of 3-hydroxyflavone, metal complexes of 5-hydroxyflavone, metal complexes of benzoxazole, metal complexes of benzothiazole, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type hydrogenated amorphous silicon carbide, n-type zinc sulfide, and n-type zinc selenide.

Additionally, the materials of the electron-transporting layer may be used alone or in any combination of two or more thereof with any ratio.

There are no limits as to the method of forming the electron-transporting layer. Therefore, the layer can be formed by a wet film formation method, a vacuum deposition method, or other method.

The thickness of the electron-transporting layer is arbitrary so long as the effects of the invention is not seriously spoiled, but is usually 1 nm or more, preferably nm or more, and is usually 300 nm or less, preferably 100 nm or less.

[Electron Injection Layer]

The electron injection layer functions to inject electrons injected from the cathode into the luminescent layer with good efficiency. In order to conduct electron injection with good efficiency, materials for forming the electron injection layer are preferably metals having a low work function. As examples thereof, there are used alkali metals such as sodium and cesium, and alkaline earth metals such as barium and calcium. The film thickness thereof is usually 0.1 nm or more and is preferably 5 nm or less.

Further, doping an organic electron-transporting compound represented by a nitrogen-containing heterocyclic compound such as bathophenanthroline or by a metal complex such as an aluminum complex of 8-hydroxyquinoline with an alkali metal such as sodium, potassium, cesium, lithium, or rubidium (described in JP-A-10-270171, JP-A-2002-100478, JP-A-2002-100482, etc.) serves to improve electron-injecting and electron-transporting properties and provide good film quality, thus such doping being preferred. The film thickness in this case is usually 5 nm or more, particularly preferably 10 nm or more, and is usually 200 nm or less, particularly preferably 100 nm or less.

Additionally, the materials of the electron injection layer may be used alone or in any combination of two or more thereof with any ratio.

There are no limits as to the method of forming the electron injection layer. Therefore, the layer can be formed by a wet film formation method, a vacuum deposition method, or other method.

[Cathode]

The cathode functions to inject electrons into layers on the side of the luminescent layer (e.g., the electron injection layer, the luminescent layer, etc.).

As materials for the cathode, those materials can be used which are used for the aforesaid anode but, in order to conduct electron injection with good efficiency, metals having a low work function are preferred. For example, appropriate metals such as tin, magnesium, indium, calcium, aluminum and silver or alloys thereof are used. Specific examples thereof include electrodes of alloys having a low work function, such as magnesium-silver alloy, magnesium-indium alloy, and aluminum-lithium alloy.

Additionally, the materials of the cathode may be used alone or in any combination of two or more thereof with any ratio.

The thickness of the cathode is usually the same as that of the anode.

Further, in order to protect the cathode composed of the metal with a low work function, it is preferred to further provide thereon a metal layer which has a high work function and is stable against atmosphere, because stability of the element is increased. For this purpose, metals such as aluminum, silver, copper, nickel, chromium, gold, and platinum are used. Additionally, these materials may be used alone or in any combination of two or more thereof with any ratio.

[Other Layers]

The organic electroluminescent element in accordance with the invention may have other constitution without departing from the spirit thereof. For example, an arbitrary layer may be provided between the anode and the cathode in addition to the above-described layers, or any of the layers may be omitted.

[Electron-Blocking Layer]

As such other arbitrary layer, there is illustrated, for example, an electron-blocking layer.

The electron-blocking layer is provided between the hole injection layer or hole-transporting layer and the luminescent layer and, by preventing electrons having migrated from the luminescent layer from reaching the hole injection layer, the electron-blocking layer functions to increase probability of electron-hole recombination within the luminescent layer and confine generated excitons within the luminescent layer and functions to transport holes injected from the hole injection layer toward the luminescent layer with good efficiency. In particular, in the case of using a phosphorescent material or a blue-light-emitting material as the light-emitting material, it is effective to provide the electron-blocking layer.

As to characteristic properties required for the electron-blocking layer, they are required to have a high hole-transporting ability, a large energy gap (difference between HOMO and LUMO), and a high excited triplet level (T1). Further, in the invention, in the case where the luminescent layer is formed as an organic layer in accordance with the invention by the wet film formation method, the electron-blocking layer is also required to have adaptability to the wet film formation method. As materials to be used for such electron-blocking layer, there is illustrated a copolymer between dioctylfluorene and triphenylamine represented by F8-TFB (WO2004/084260).

Additionally, the materials of the electron-blocking layer may be used alone or in any combination of two or more thereof with any ratio.

There are no limits as to the method of forming the electron-blocking layer. Therefore, the layer can be formed by a wet film formation method, a vacuum deposition method, or other method.

Further, insertion of an extremely thin insulating film (0.1 to 5 nm) formed from, for example, lithium fluoride (LiF), magnesium fluoride ($MgF_2$), lithium oxide ($Li_2O$), or cesium (II) carbonate ($CsCO_3$) between the cathode and the luminescent layer or the electron-transporting layer is also an effective method for improving efficiency of the element (see, for example, Applied Physics Letters, 1997, Vol. 70, pp. 152; JP-A-10-74586; IEEE Transactions on Electron Devices, 1997, Vol. 44, pp. 1245; SID 04 Digest, pp. 154, etc.).

Moreover, in any of the layer configurations explained above, the constituent elements excluding the substrate may be superposed in the reverse order. For example, in the case of the layer configuration shown in FIG. 1, the constituent elements other than the substrate may be provided on the substrate in the order of: the cathode, electron injection layer, electron-transporting layer, hole-blocking layer, luminescent layer, hole-transporting layer, hole injection layer, and anode.

It is also possible to constitute an organic electroluminescent element in accordance with the invention by superposing the constituent elements other than the substrate between two substrates, at least one of which is transparent.

A structure composed of a stack of stages each composed of constituent elements other than substrates (light-emitting units) (i.e., a structure composed of a plurality of stacked light-emitting units) is also possible. In this case, when a carrier generation layer (CGL) made of, for example, vanadium pentoxide ($V_2O_5$) is disposed in place of the interfacial layers located between the stages (i.e., between the light-emitting units) (when the anode is ITO and the cathode is A1, the interfacial layers are these two layers), then the barrier between the stages is reduced. This configuration is more preferred from the standpoints of light-emitting efficiency and driving voltage.

Furthermore, the organic electroluminescent element in accordance with the invention may be configured so as to be a single organic electroluminescent element, or may be applied to a configuration in which a plurality of organic electroluminescent elements have been disposed in an array arrangement. The organic electroluminescent element may also be applied to a configuration in which anodes and cathodes have been disposed in an X-Y matrix arrangement.

Also, each of the layers described above may contain ingredients other than those described above as materials for the layer so long as the effects of the invention are not seriously spoiled.

<Display Device>

The display device of the invention employs the organic electroluminescent element of the invention described above.

The type and structure of the display device of the invention are not particularly limited, and can be fabricated using the organic electroluminescent element of the invention according to ordinary methods.

For example, the display device of the invention can be formed by the method described in Yu ki EL Dispurei (Ohmsha, Ltd., published on Aug. 20, 2004, written by TOKITO Shizuo, ADACHI Chihaya, and MURATA Hideyuki).

<Lighting Device>

The lighting device of the invention employs the organic electroluminescent element of the invention described above. The type and structure of the lighting device of the invention are not particularly limited, and can be fabricated using the organic electroluminescent element of the invention according to ordinary methods.

EXAMPLES

Synthesis Example 1

Synthesis of Polymer 1

Synthesis of Intermediate 1

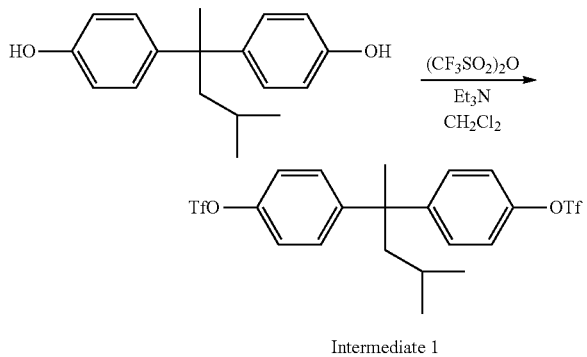

[Ka 28]

Intermediate 1

4,4'-(1,3-dimethylbutylidene)diphenol (15 g, 55.48 mmol), triethylamine (22.46 g, 221.92 mmol), and methylene chloride (150 mL) were placed under nitrogen atmosphere, followed by stirring at 0° C. Trifluoromethanesulfonic acid anhydride (37.56 g, 133.16 mmol) was added thereto, and the resulting mixture was stirred at room temperature for 6 hours. Water and 1N hydrochloric acid were added to the reaction mixture, and the mixture was extracted with methylene chloride. The organic layer was washed with a mixed liquid of water and 1N hydrochloric acid, then washed with an aqueous solution of sodium chloride and dried over magnesium sulfate, followed by concentrating under reduced pressure. The residue was purified by silica gel column chromatography (hexane/methylene chloride=3/1) to obtain an intermediate 1 (19.1 g, yield: 64%).

Synthesis of Intermediate 2

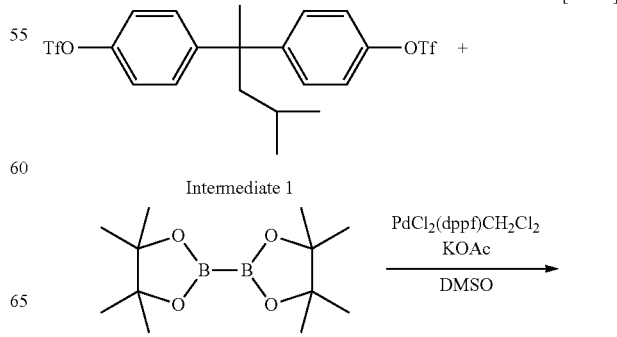

[Ka 29]

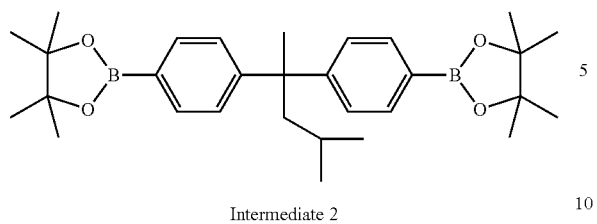

Intermediate 2

A suspension of the intermediate 1 (19.1 g, 35.73 mmol), bis(pinacolato)diborane (21.78 g, 85.76 mmol), and potassium acetate (17.89 g, 182.25 mmol) in dehydrated dimethylsulfoxide (157 mL) was heated to 60° C. under nitrogen atmosphere, then a dichloromethane adduct of dichloro[1,1'-bis(diphenylphosphino)ferrocene]palladium (II) (1.46 g, 1.79 mol) was added thereto, followed by increasing the temperature to 80° C. and stirring for 4 hours. After allowing the reaction mixture to cool to room temperature, water was added to the reaction solution, and crystals precipitated were collected by filtration, dissolved in methylene chloride and, after adding thereto magnesium sulfate and white clay, the resulting mixture was stirred and filtered. The filtrate was concentrated, and the residue was purified by silica gel column chromatography (hexane/methylene chloride=1/1), and was subjected to suspension washing in hexane to obtain an intermediate 2 (7.9 g, yield 45%).

Synthesis of Intermediate 3

[Ka 30]

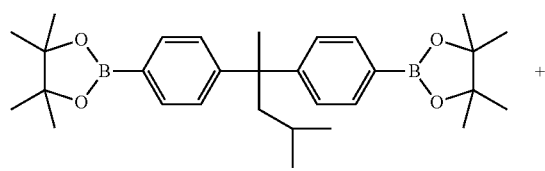

Intermediate 2

+

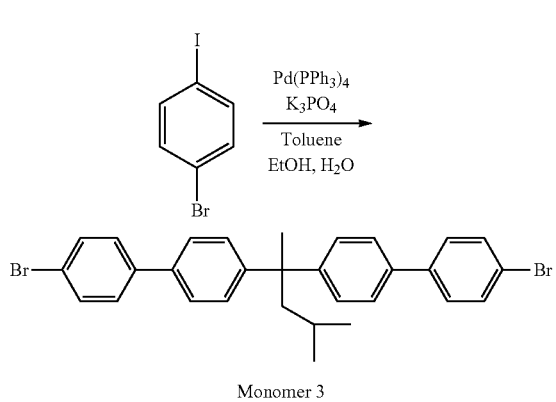

Monomer 3

To a solution of the intermediate 2 (13.2 g, 26.92 mmol), 4-bromoiodobenzene (17.67 g, 62.47 mmol), toluene (268 mL), and ethanol (134 mL) were added, under nitrogen atmosphere, tetrakis(triphenylphosphine)palladium (0) (1.56 g, 1.35 mmol) and a 2M potassium triphosphate aqueous solution (67 mL) at room temperature, followed by refluxing for 8 and a half hours. After allowing the reaction mixture to cool to room temperature, the reaction mixture was extracted with toluene. The organic layer was washed with water and dried over magnesium sulfate, followed by concentrating under reduced pressure. The residue was purified by silica gel column chromatography (hexane/methylene chloride=8/1) and, after concentrating, a small amount of hexane was added thereto to precipitate crystals, thus a monomer 3 (8.3 g, yield: 56%) being obtained.

Synthesis Example of End Polymer 1

[Ka 31]

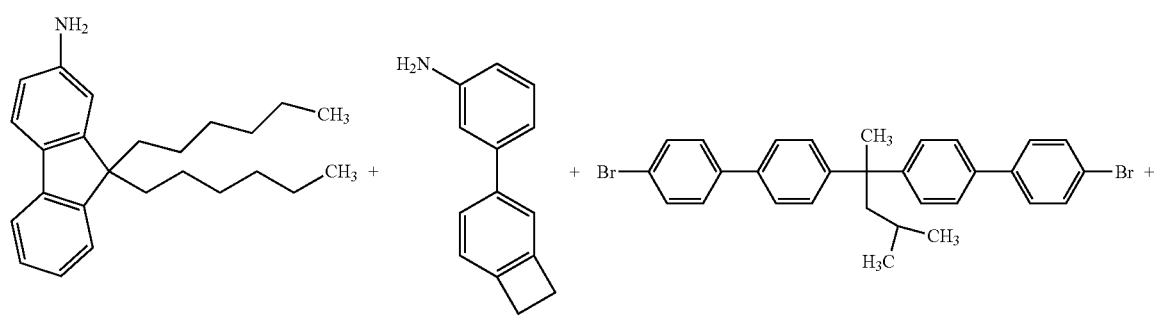

Monomer 1    Monomer 2    Monomer 3

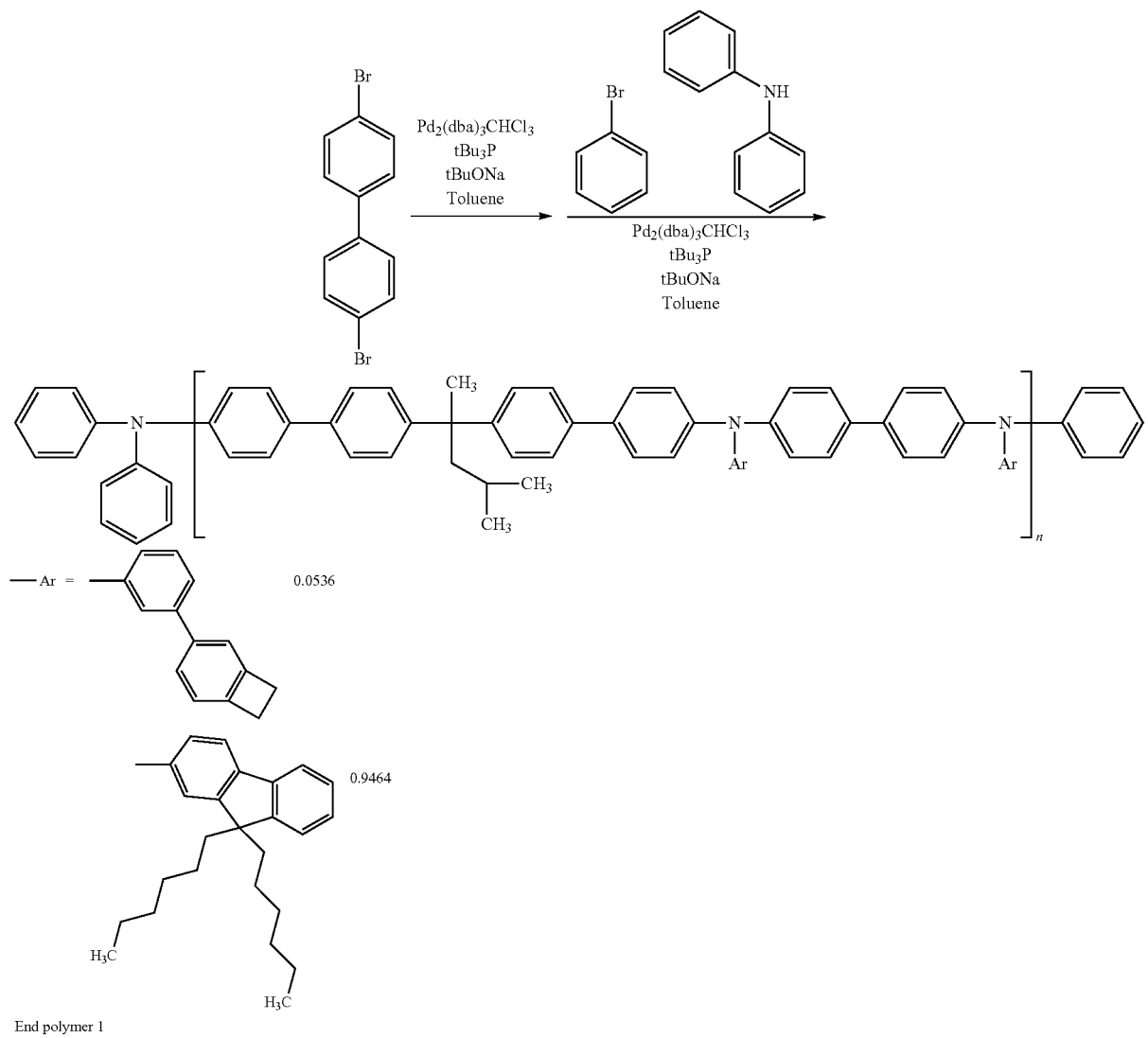

End polymer 1

The monomer 1 (2.677 g, 7.6596 mmol), the monomer 2 (0.0847 g, 0.4338 mmol), the monomer 3 (2.219 g, 4.0467 mmol), sodium t-butoxide (2.49 g, 25.9 mmol), and toluene (30 mL) were charged, and the atmosphere inside the system was sufficiently purged with nitrogen, followed by heating the mixture to 60° C. (solution A). Tri-tert-butylphosphine (0.131 g, 0.647 mmol) was added to a solution of tris(dibenzylideneacetone)dipalladium-chloroform complex (0.084 g, 0.081 mmol) in 3 mL of toluene, and the resulting mixture was heated to 60° C. (solution B). The solution B was added to the solution A in a nitrogen stream, followed by refluxing under heating for 2.0 hours to react. After confirming that the monomers 1 to 3 disappeared, 4,4'-dibromobenzene (1.212 g, 3.8846 mmol) was added thereto. After refluxing the mixture for 30 minutes under heating, the reaction solution was allowed to cool, and then the reaction solution was dropwise added to 300 mL of ethanol to crystallize a crude polymer 1. Crystals formed were collected by filtration and dried.

The thus-obtained crude polymer 1 was dissolved in 80 ml of toluene, and bromobenzene (0.254 g, 1.62 mmol) and sodium tert-butoxide (2.49 g, 25.9 mmol) were charged therein and, after sufficiently purging the atmosphere with nitrogen, the mixture was heated to 60° C. (solution C). Tri-t-butylphosphine (0.131 g, 0.647 mmol) was added to a solution of tris(dibenzylideneacetone)dipalladium-chloroform complex (0.084 g, 0.081 mmol) in 3 mL of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (1.37 g, 8.09 mmol) in toluene (3 mL), and the mixture was further refluxed under heating for 4 hours to react. The reaction solution was allowed to cool, and was dropwise added to an ethanol/water (250 mL/50 mL) solution to obtain an end-capped crude polymer 1.

This end-capped crude polymer 1 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 1 (2.95 g).

Weight-average molecular weight (Mw)=82,000

Number-average molecular weight (Mn)=48,800

Degree of dispersion (Mw/Mn)=1.68

<Solubility Test>

The end polymer 1 synthesized in Synthesis Example 1 was subjected to solubility test in toluene at room temperature (25° C.). As a result, the end polymer 1 was found to dissolve in a content of 10% by weight or more in toluene at room temperature (25° C.).

Synthesis Example 2

Synthesis of Polymer 2

[Ka 32]

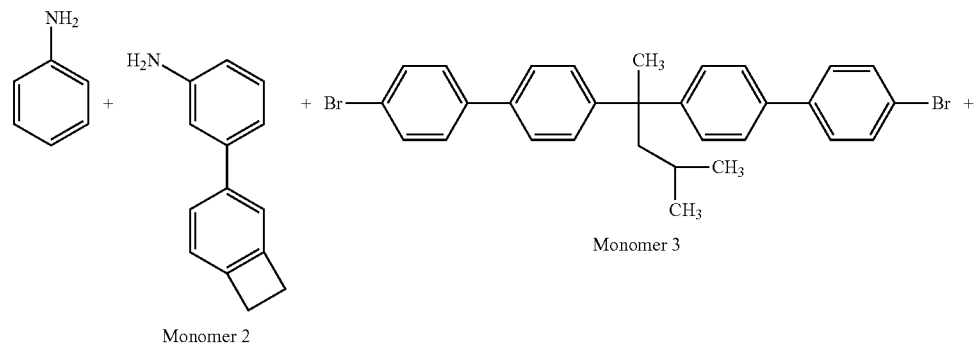

Monomer 2

Monomer 3

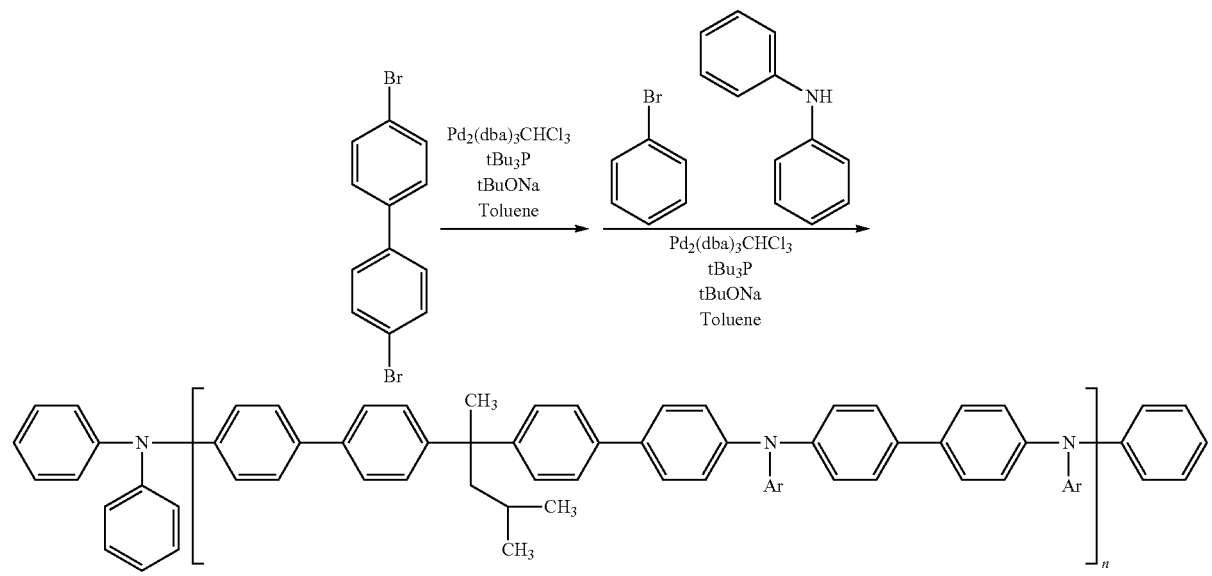

End polymer 2

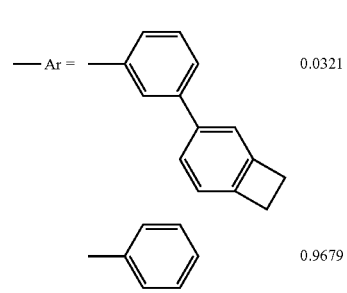

—Ar = 0.0321

0.9679

Aniline (0.6575 g, 0.706 mmol), the monomer 2 (0.0457 g, 0.234 mmol), the monomer 3 (2.000 g, 3.647 mmol), sodium tert-butoxide (2.24 g, 23.3 mmol), and toluene (19 mL) were charged, and the atmosphere inside the system was sufficiently purged with nitrogen, followed by heating the mixture to 60° C. (solution A). Tri-tert-butylphosphine (0.118 g, 0.584 mmol) was added to a solution of tris(dibenzylideneacetone)dipalladium-chloroform complex (0.075 g, 0.0729 mmol) in 5 mL of toluene, and the resulting mixture was heated to 60° C. (solution B). The solution B was added to the solution A in a nitrogen stream, followed by refluxing under heating for 2.0 hours to react. After confirming that aniline and the monomers 2 and 3 disappeared, 4,4'-dibromobenzene (1.104 g, 3.538 mmol) was added thereto. After refluxing the mixture for 40 minutes under heating, the reaction solution was allowed to cool, and then the reaction solution was dropwise added to 300 mL of ethanol to crystallize a polymer 2.

The polymer 2 obtained by filtration was dissolved in 70 ml of toluene, and the solution was dropwise added to 300 mL of ethanol to obtain the end polymer 2 (2.62 g).

Weight-average molecular weight (Mw)=47,900

Number-average molecular weight (Mn)=26,600

Degree of dispersion (Mw/Mn)=1.80

<Process for Producing Organic Electroluminescent Element>

Example 1

An organic electroluminescent element shown in FIG. 1 was prepared. A substrate constituted of a glass substrate and, formed thereon, a transparent conductive film of indium-tin oxide (ITO) deposited in a thickness of 150 nm (deposited by sputtering; sheet resistance: 15Ω) was subjected to patterning by an ordinary technique of photolithography into stripes having a width of 2 mm. Thus, an anode 2 was formed. The ITO substrate which had undergone the patterning was cleaned by subjecting the substrate to ultrasonic cleaning with acetone, rinsing with pure water, and ultrasonic cleaning with isopropyl alcohol, in this order, subsequently dried by blowing nitrogen, and was finally subjected to ultraviolet/ozone cleaning.

First, a coating liquid for forming a hole injection layer containing the polymer represented by the following structural formula (H8) (weight-average molecular weight: 70,000; number-average molecular weight: 40,000), 4-isopropyl-4'-methyldiphenyliodonium tetrakis(pentafluorophenyl)borate represented by the structural formula (A1), and ethyl benzoate was prepared. This coating liquid was applied to the anode 2 by spin coating under the following conditions to form a film thereof on the anode. Thus, a hole injection layer 3 having a thickness of 40 nm was obtained.

[Ka 33]

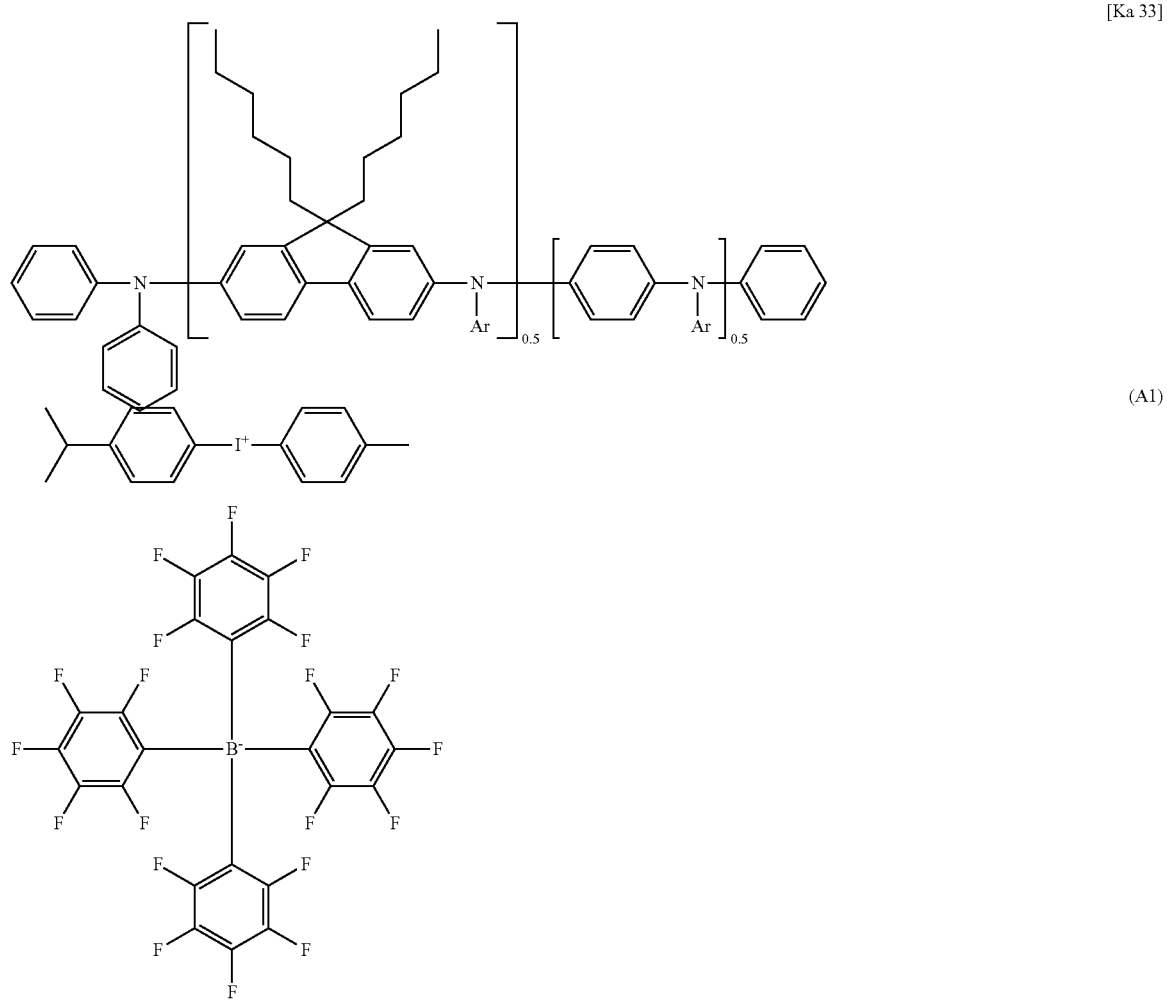

(A1)

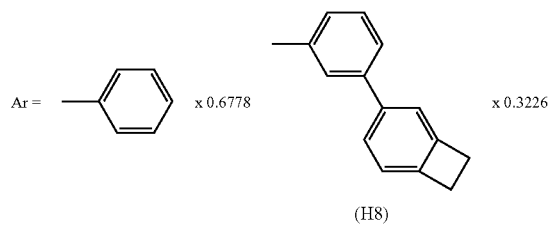

(H8)

<Coating Liquid for Forming Hole Injection Layer>
Solvent: ethyl benzoate
Concentrations in coating fluid: H8: 2.0% by weight
  A1: 0.4% by weight
<Conditions for Forming Hole Injection Layer 3>
Spinner rotation speed: 1,500 rpm
Spinner rotation period: 30 sec
Spin coating atmosphere: in the air
Heating conditions: in the air; 230° C.; 1 hr Subsequently, a coating liquid for forming a hole-transporting layer containing a polymer represented by the following formula (H1) (weight-average molecular weight: 82,000; number-average molecular weight: 48,800; the end polymer 1 obtained in Synthesis Example 1) was prepared. This coating liquid was applied by spin coating and was polymerized by heating, under the following conditions. Thus, a hole-transporting layer 4 having a thickness of 15 nm was formed.

<Coating Liquid for Forming Hole-Transporting Layer>
Solvent: cyclohexylbenzene
Concentration in coating liquid: H1: 1.0% by weight
<Conditions for Forming Hole-Transporting Layer 4>
Spinner rotation speed: 1,500 rpm
Spinner rotation period: 120 sec
Spin coating atmosphere: in nitrogen
Heating conditions: 230° C.; 1 hr; in nitrogen Next, a coating liquid for forming a luminescent layer containing compounds (C1) and (D1) represented by the following structural formulae was prepared. This coating liquid was applied by spin coating and heated under the following conditions. Thus, a luminescent layer 5 having a thickness of 40 nm was formed.

[Ka 34]

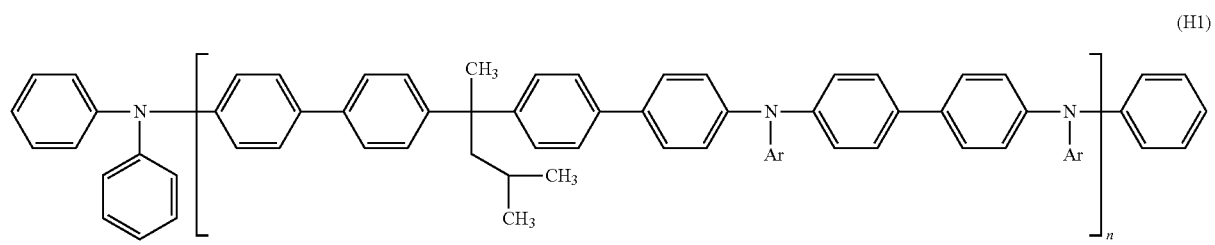

(H1)

[Ka 35]

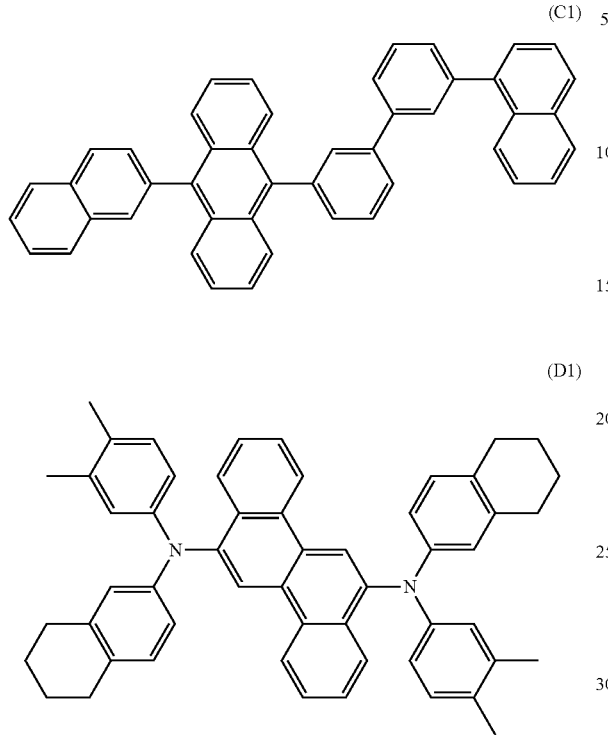

[Ka 36]

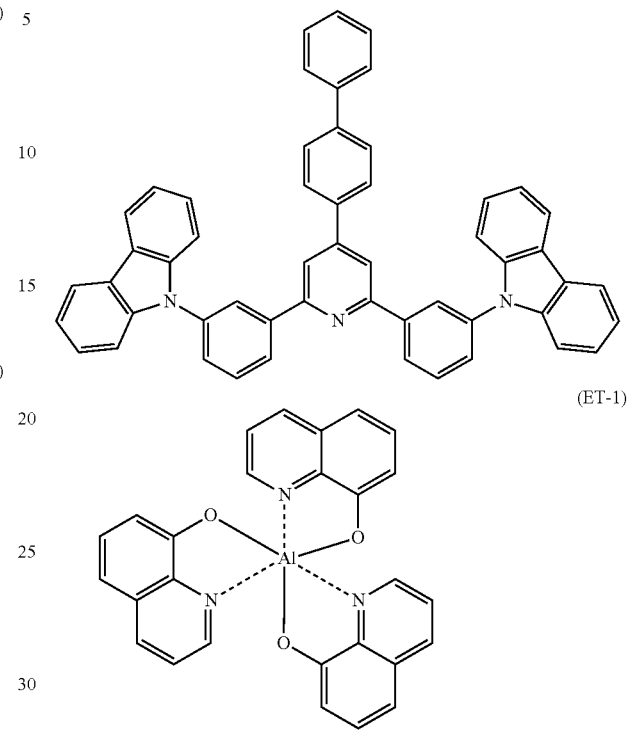

<Coating Liquid for Forming Luminescent Layer>

Solvent: cyclohexylbenzene

Concentrations in coating liquid: (C1): 3.20% by weight
(D1): 0.32% by weight

<Conditions for Forming Luminescent Layer 5>

Spinner rotation speed: 1,200 rpm

Spinner rotation period: 120 sec

Spin coating atmosphere: in nitrogen

Heating conditions: 130° C.; 1 hr; under reduced pressure (0.1 MPa)

On the thus-obtained luminescent layer 5 was superposed as a hole-blocking layer 6 a compound of the following structure HB-1 in a film thickness of 10 nm by the vacuum deposition method. Subsequently, a compound of the following structure ET-1 was superposed thereon as an electron-transporting layer 7 in a film thickness of 30 nm.

Thereafter, lithium fluoride (LiF) was deposited as an electron injection layer 8 in a film thickness of 0.5 nm by the vacuum deposition method, and aluminum was deposited thereon as a cathode 9 in a film thickness of 80 nm in the stripe form of 2 mm in width so that these stripes were perpendicular to the ITO stripes of the anode 2. In this way, an organic electroluminescent element having 2 mm×2 mm-size light-emitting area portions was obtained.

It was confirmed that a blue light of 465 nm in EL peak wavelength was obtained from this element. Characteristic properties of the organic electroluminescent elements obtained in this Example and Comparative Example 1 to be described hereinafter will be shown in Table 1.

Comparative Example 1

An organic electroluminescent element was prepared in the same manner as in Example 1 except for using a comparative polymer (H7) (the end polymer 2 obtained in Synthesis Example 2) in place of the polymer (H1) in the composition for forming the hole-transporting layer in Example 1.

[Ka 37]

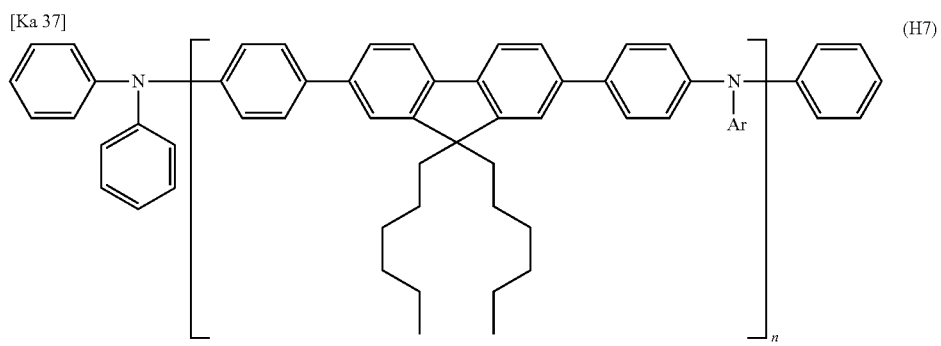

-continued

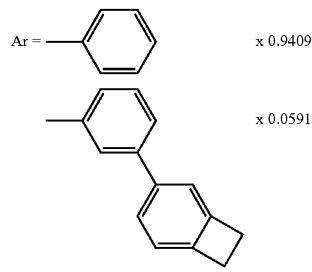

It was confirmed that a blue light of 465 nm in EL peak wavelength was obtained from this element. Light-emitting characteristic properties of the thus-obtained element are shown in Table 1.

TABLE 1

|  | Voltage at 1000 cd/m² [V] | Voltage at 2500 cd/m² [V] |
| --- | --- | --- |
| Example 1 | 6.4 | 7.4 |
| Comparative Example 1 | 7.2 | 8.2 |

As is apparent from Table 1, it is seen that the organic electroluminescent element prepared by using the compound in the invention functions at a low voltage.

Example 2

An organic electroluminescent element was prepared in the same manner as in Example 1 except for forming the luminescent layer 5 in the following manner.

A coating liquid for forming a luminescent layer containing a compound (C2), a compound (C3), and a compound (D2) respectively represented by the following structural formulae was prepared, and spin-coated under the following conditions to form a film, followed by heating to form a luminescent layer 5 having a film thickness of 60 nm.

[Ka 38]

(C2)

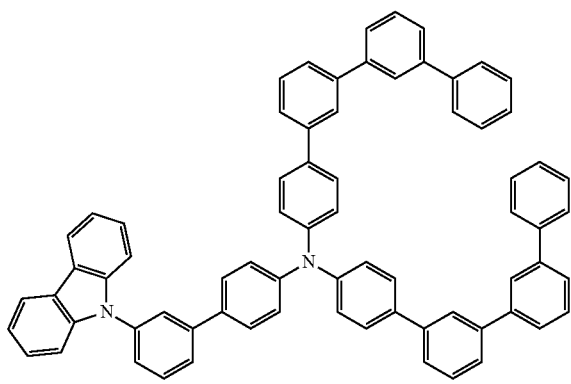

-continued

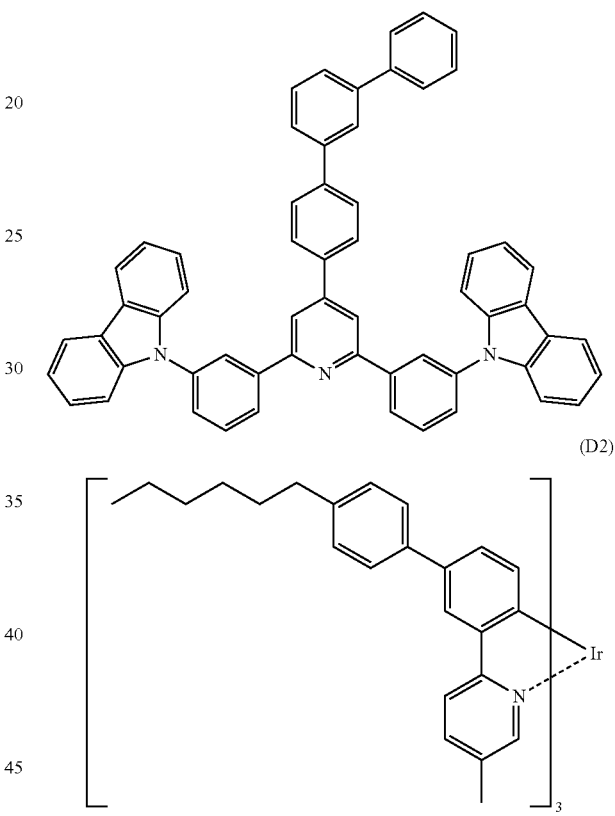

<Coating Liquid for Forming Luminescent Layer>

Solvent: cyclohexylbenzene

Concentrations in coating liquid: (C2): 3.75% by weight (C3): 1.25% by weight (D2): 0.50% by weight <Conditions for Forming Luminescent Layer 5>

Spinner rotation speed: 1,500 rpm

Spinner rotation period: 120 sec

Spin coating atmosphere: in nitrogen

Heating conditions: 130° C.; 10 min

It was confirmed that a green light of 521 nm in EL peak wavelength was obtained from this element. Characteristic properties of the organic electroluminescent elements obtained in this Example and Comparative Example 2 to be described hereinafter will be shown in Table 2.

Comparative Example 2

An organic electroluminescent element was prepared in the same manner as in Example 2 except for using a comparative polymer (H7) in place of the polymer (H1) in the composition for forming the hole-transporting layer in Example 2. It was confirmed that a green light of 522 nm in EL peak wavelength was obtained from this element. Light-emitting characteristic properties of the thus-obtained element are shown in Table 2.

TABLE 2

|  | Voltage at 2500 cd/m² | Current Efficiency at 2500 cd/m² |
| --- | --- | --- |
| Example 2 | 7.3 V | 59.4 cd/A |
| Comparative Example 2 | 8.0 V | 54.3 cd/A |

As is apparent from Table 2, it is seen that the organic electroluminescent element prepared by using the compound in the invention functions at a low voltage with high efficiency.

Example 3

An organic electroluminescent element was prepared in the same manner as in Example 1 except for forming the luminescent layer 5 in the following manner.

A coating liquid for forming a luminescent layer containing a compound (C4), a compound (C5), a compound (D2), and a compound (D3) respectively represented by the following structural formulae was prepared, and spin-coated under the following conditions to form a film, followed by heating to form a luminescent layer 5 having a film thickness of 60 nm.

[Ka 39]

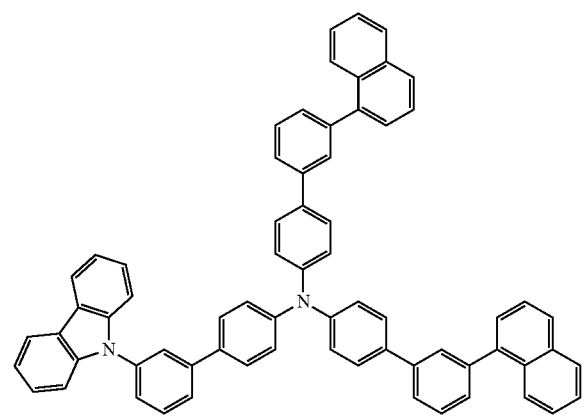

(C4)

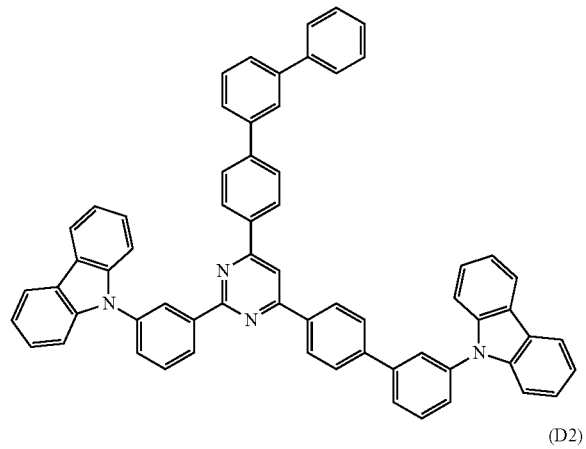

(C5)

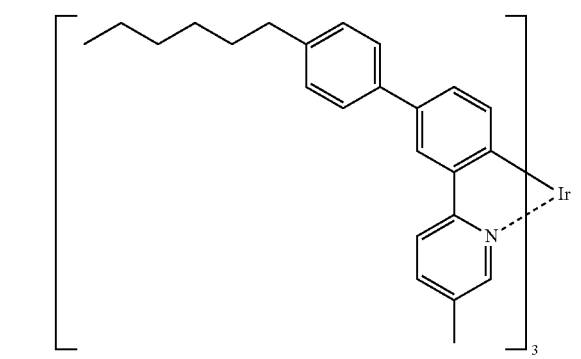

(D2)

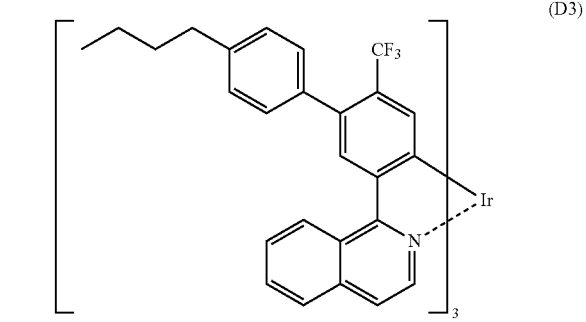

(D3)

<Coating Liquid for Forming Luminescent Layer>
Solvent: cyclohexylbenzene
Concentrations in coating liquid: (C4): 3.75% by weight
 (C5): 1.25% by weight
 (D2): 0.25% by weight
 (D3): 0.35% by weight
<Conditions for Forming Luminescent Layer 5>
Spinner rotation speed: 1,500 rpm
Spinner rotation period: 120 sec
Spin coating atmosphere: in nitrogen
Heating conditions: 130° C.; 10 min It was confirmed that a red light of 615 nm in EL peak wavelength was obtained from this element. Characteristic properties of the organic electroluminescent elements obtained in this Example and Comparative Example 3 to be described hereinafter will be shown in Table 3.

Comparative Example 3

An organic electroluminescent element was prepared in the same manner as in Example 2 except for using a comparative polymer (H7) in place of the polymer (H1) in the composition for forming the hole-transporting layer in Example 3. It was confirmed that a green light of 615 nm in EL peak wavelength was obtained from this element. Light-emitting characteristic properties of the thus-obtained element are shown in Table 3.

TABLE 3

| | Voltage at 1000 cd/m$^2$ | Current Efficiency at 1000 cd/m$^2$ |
|---|---|---|
| Example 3 | 8.8 V | 10.6 cd/A |
| Comparative Example 3 | 9.4 V | 10.4 cd/A |

As is apparent from Table 3, it is seen that the organic electroluminescent element prepared by using the compound in the invention functions at a low voltage with high efficiency.

Synthesis of Various Monomers

[Ka 40]

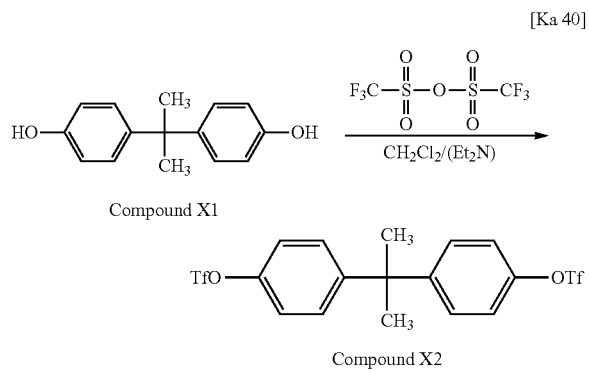

Compound X1

Compound X2

The compound X1 (10.0 g) was dissolved in methylene chloride (150 ml) and triethylamine (20.8 g) at −5° C., and a solution of trifluoromethanesulfonic acid anhydride (37.1 g) in 50 ml of methylene chloride was gradually dropwise added thereto. After stirring the reaction mixture for 2 hours, it was poured into ice water, followed by extracting with methylene chloride. The organic layer was dried over magnesium sulfate, and was concentrated. Further, the concentrate was purified by silica gel column chromatography (hexane:methylene chloride=3:1) to obtain the compound X2 (15.7 g).

[Ka 41]

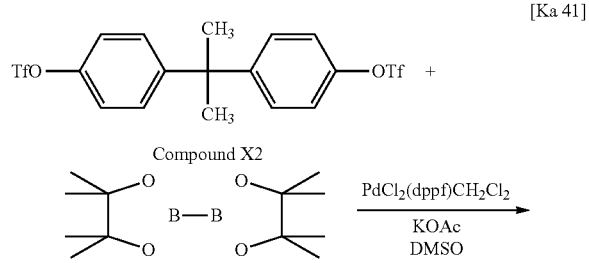

Compound X2

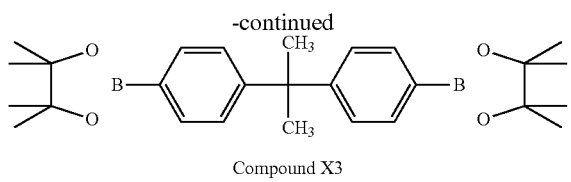

Compound X3

A suspension of the compound X2 (15.7 g), bispinacolatodiborane (19.4 g), and potassium acetate (18.8 g) in dehydrated dimethylsulfoxide (150 ml) was heated to 60° C. under nitrogen atmosphere, the mixture was stirred for 40 minutes, and a dichloromethane adduct of dichloro[1,1'-bis(diphenylphosphino)ferrocene]palladium (II) (1.3 g) was added thereto, followed by stirring at 80° C. for 12 hours. After allowing the reaction mixture to cool to room temperature, toluene (100 ml) and water (120 ml) were added to the reaction solution, and the aqueous layer was extracted with toluene (100 ml×2 times). The extract was combined with the organic layer and, after drying over magnesium sulfate, concentrated. Further, the concentrate was purified by silica gel column chromatography (hexane:ethyl acetate)=1:4) to obtain a compound X3 (5.7 g).

[Ka 42]

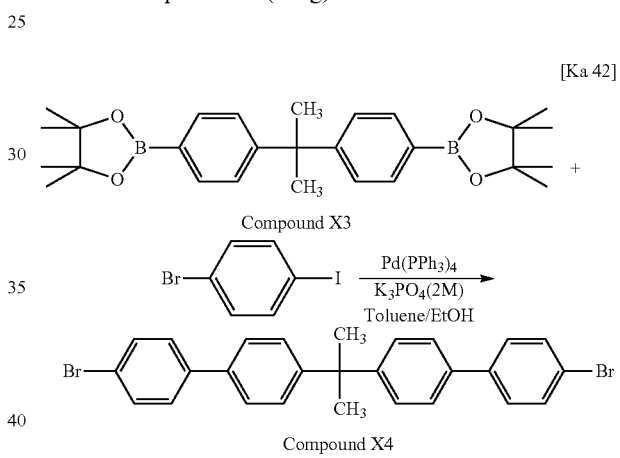

Compound X4

To a solution of the compound X3 (5.7 g) and 4-bromoiodobenzene (9.0 g) in a mixture of toluene and ethanol (70 ml:35 ml) was added, under nitrogen stream, an aqueous solution (2M) of tripotassium phosphate (12.7 g), and the resulting mixture was heated to 60° C., followed by stirring for 40 minutes. Then, tetrakis(triphenylphosphine)palladium (0) (0.44 g) was added thereto, followed by refluxing for 6 hours. After allowing the reaction mixture to cool to room temperature, toluene (200 ml) and water (120 ml) were added thereto and, after stirring, the aqueous layer was extracted with toluene (100 ml×2 times). The extract was combined with the organic layer, and was dried over magnesium sulfate, and was concentrated. Further, the concentrate was purified by silica gel column chromatography (hexane:methylene chloride=4:1) to obtain a compound X4 (2.8 g).

[Ka 43]

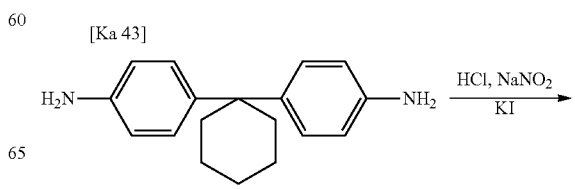

-continued

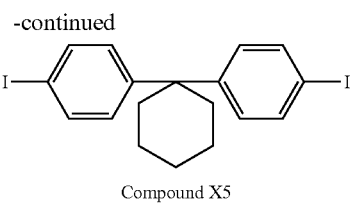
Compound X5

Concentrated hydrochloric acid (32 g) was dropwise added to 1,1-bis(4-aminophenyl)cyclohexane (20.0 g) at room temperature under stirring and, after 30 minutes, 100 ml of water was added thereto, and an aqueous solution of sodium nitrite (10.88 g) cooled to 0° C. was dropwise added thereto, followed by reacting for 1 hour in this state. This reaction solution was added to a 60° C. solution of potassium iodide (37.4 g), and the precipitated viscous product was dissolved in methylene chloride. The organic layer was dried over magnesium sulfate, and concentrated. Further, the concentrate was purified by silica gel column chromatography (n-hexane/methylene chloride=10/1) to obtain a compound X5 (13.2 g).

[Ka 44]

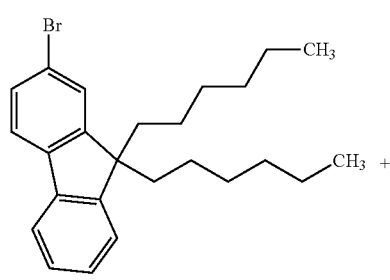
Compound X6

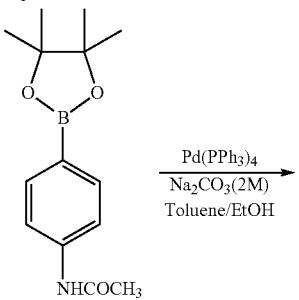
Compound X7

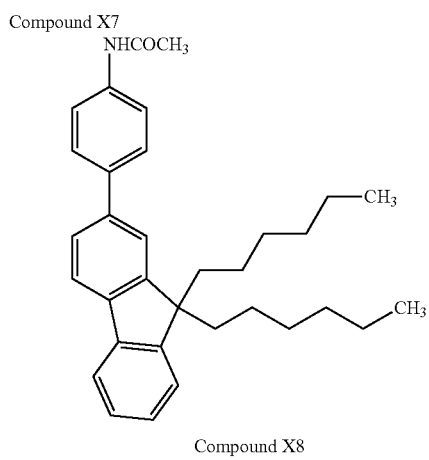
Compound X8

The compound X6 (33.62 mmol), compound X7 (38.297 mmol), 60 mL of toluene, and 30 mL of ethanol were charged in a flask under a nitrogen stream, and the mixture was stirred at room temperature. To this mixture was added 30 mL of a 2M sodium carbonate aqueous solution, and nitrogen bubbling was conducted at room temperature for 30 minutes. Subsequently, tetrakis(triphenylphosphine)palladium (1.68 mmol) was charged therein, and the mixture was refluxed under heating for 4 hours under nitrogen. After allowing to cool, the organic layer was concentrated, washed with methanol, and dried at 60° C. under reduced pressure to obtain a compound X8 (yield: 77%).

[Ka 45]

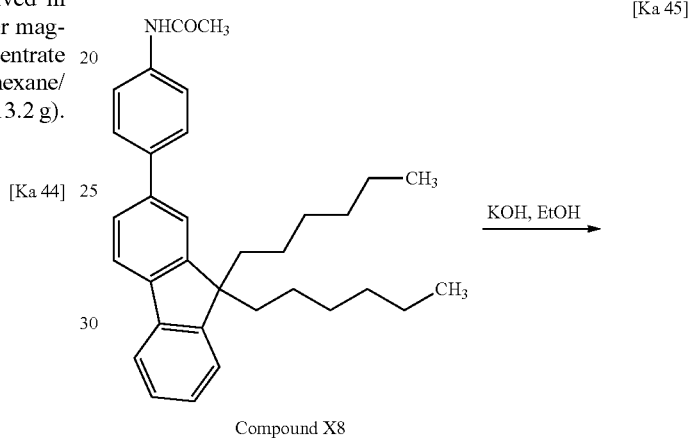
Compound X8

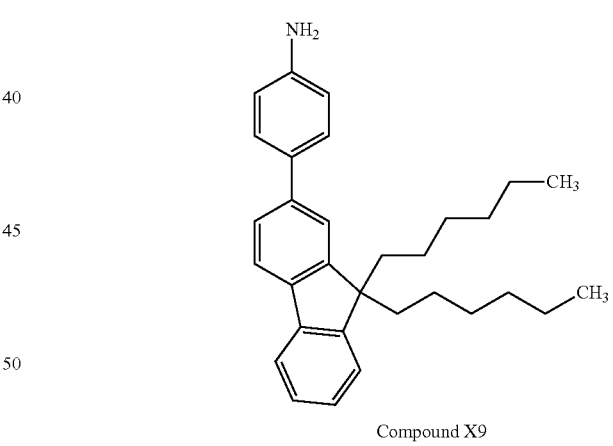
Compound X9

The compound X8 (11.97 mmol) was dissolved in ethanol at 75° C. under a nitrogen stream, and then 27 ml of an aqueous solution of potassium hydroxide (0.479 mol) was dropwise added thereto, followed by reacting for 7 hours at 80° C. under nitrogen. Water was added to the reaction solution, and the mixture was extracted with ethyl acetate. The organic layer was concentrated, and the concentrate was purified by column chromatography (developing solution: hexane/ethyl acetate=5/1). The purified product was dried under reduced pressure at 40° C. to obtain a compound X9 (4.9 g; yield: 96%).

[Ka 46]

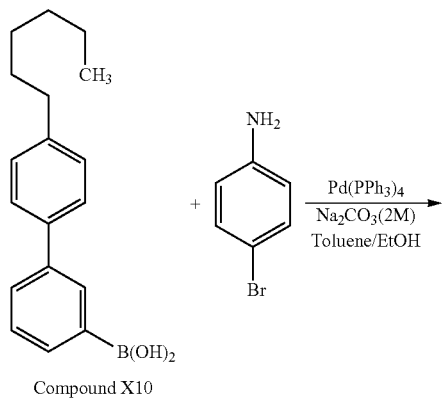

Compound X10

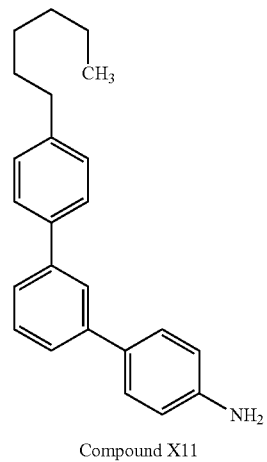

Compound X11

The compound X10 (25.16 mmol), 4-bromoaniline (22.87 mmol), 60 mL of toluene, and 30 mL of ethanol were charged in a flask under a nitrogen stream, and the mixture was stirred at room temperature. To this mixture was added 30 mL of a 2M sodium carbonate aqueous solution, and nitrogen bubbling was conducted at room temperature for 30 minutes. Subsequently, tetrakis(triphenylphosphine)palladium (0.686 mmol) was charged therein, and the mixture was refluxed under heating for 5 hours under nitrogen. After allowing to cool, the organic layer was concentrated and purified by column chromatography (developing solution: hexane/ethyl acetate=5/1). The purified product was dried at 60° C. under reduced pressure to obtain a compound X11 (4.3 g; yield: 57%).

[Ka 47]

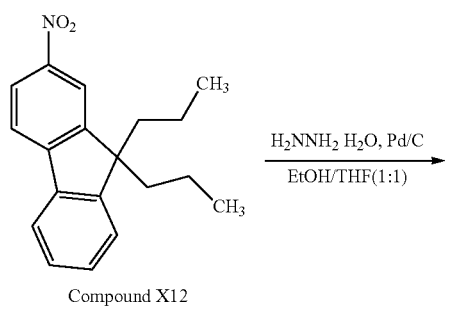

Compound X12

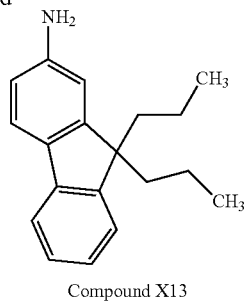

Compound X13

To a solution of the compound X12 (7.97 g) in ethanol:tetrahydrofuran (1:1; 50 mL) was added 10% by weight palladium carbon (1.60 g), and the mixture was stirred at 50° C. for 90 minutes. Hydrazine monohydrate (13 mL) was gradually added dropwise to this suspension, and the mixture was stirred at 60° C. for 3 hours. After allowing the mixture to cool to room temperature, celite filtration was conducted, and the filtrate was extracted with ethyl acetate. The organic phase was washed with a saturated aqueous solution of sodium chloride and dried overs magnesium sulfate, and the organic layer was concentrated. The concentrate was purified by column chromatography to obtain a compound X13 (2.11 g, 29%).

[Ka 48]

Compound X14

Carbazole (16.64 g, 99.5 mmol), p-n-byxylbenzene bromide (20 g, 82.9 mmol), sodium t-butoxide (15.9 g, 165.4 mmol), and toluene (450 ml) were charged, and the atmosphere inside the system was sufficiently purged with nitrogen, followed by heating the mixture to 60° C. (solution A). Tri-t-butylphosphine (1.35 g, 6.6 mmol) was added to a solution of tris(dibenzylideneacetone)dipalladium-chloroform complex (0.858 g, 0.8 mmol) in 50 ml of toluene, and the resulting mixture was heated to 60° C. (solution B). The solution B was added to the solution A in a nitrogen stream, followed by refluxing under heating for 2.0 hours to react. After confirming that carbazole disappeared, the mixture was allowed to cool. Water was added to the reaction solution, and the resulting solution was extracted with toluene. The organic layer was further purified by silica gel column chromatography (hexane:methylene chloride=8:1) to obtain a compound X14 (17.8 g).

[Ka 49]

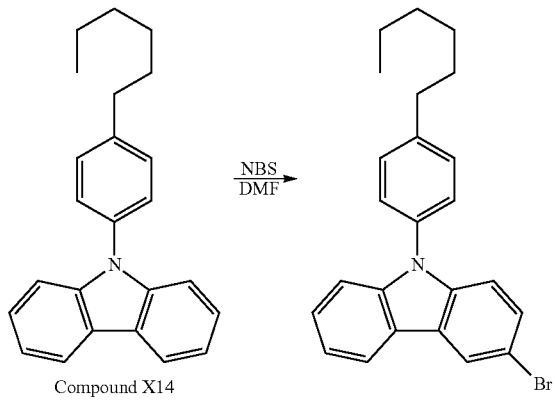

Compound X14    Compound X15

Dimethylformamide (80 ml) was added to the compound X14 (10.3 g, 31.45 mmol), followed by cooling in an ice bath. To this was dropwise added a solution of N-bromosuccinimide (56.2 g, 265.11 mmol) in DMF (20 ml), and the temperature of the resulting solution was raised to room temperature in 4 hours under stirring. Water was added to the reaction solution, and the solution was extracted with ethyl acetate. The organic layer was concentrated, and the concentrate was purified by column chromatography (developing solution: THF/acetonitrile=9/1). The purified product was dried at 40° C. under reduced pressure to obtain a compound X15 (8.5 g, yield: 66.5%).

[Ka 50]

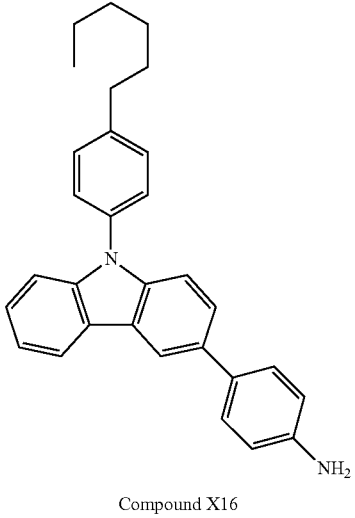

Compound X16

The compound X15 (8.4 g, 20.67 mmol), 4-4,4,5,5-tetramethyl-1,3,2-dioxaborolan-2-yl)aniline (5.43 g, 24.80 mmol), sodium carbonate (10.95 g, 103.30 mmol), toluene (90 ml), ethanol (45 ml), and water (45 ml) were charged in a flask, and the atmosphere inside the system was sufficiently purged with nitrogen, followed by heating the mixture to 100° C. Tetrakis(triphenylphosphine)palladium (240 mg, 206 μmol mop was added thereto, followed by stirring at 100° C. for 5 hours. Water was added to the reaction solution, and the resulting mixture was extracted with toluene. The organic layer was concentrated, and the concentrate was purified by column chromatography (developing solution: hexane/ethyl acetate=4/1). Subsequently, the purified product was again purified by column chromatography (developing solution: THF/acetonitrile=1/9). The purified product was dried at 40° C. under reduced pressure to obtain a compound X16 (6.74 g, yield: 78.1%).

[Ka 51]

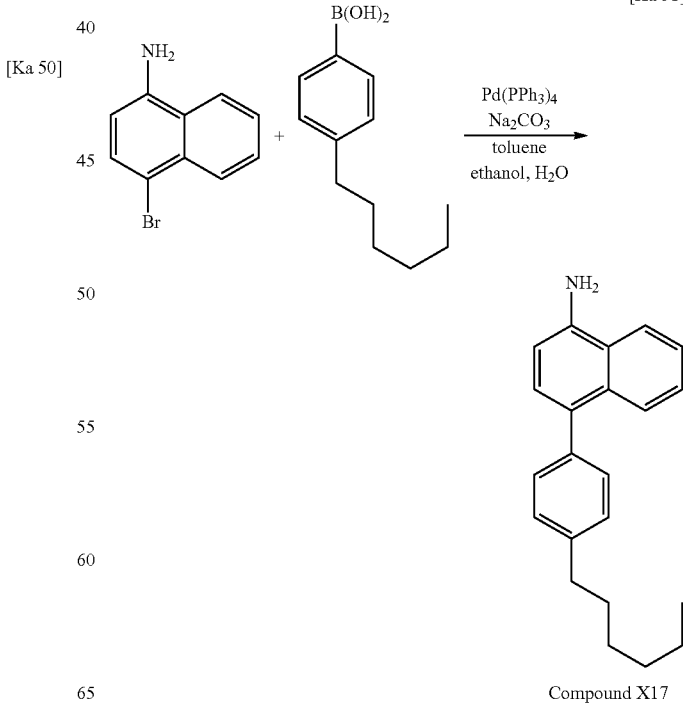

Compound X17

1-amino-4-bromonapahthalene (13.7 g, 61.8 mmol), p-n-hexylphenylboronic acid (14.0 g, 67.9 mmol), sodium carbonate (32.75 g, 309.0 mmol), toluene (220 ml), ethanol (110 ml), and water (150 ml) were charged in a flask, and the atmosphere inside the system was sufficiently purged with nitrogen, followed by heating the mixture to 100° C. Tetrakis(triphenylphosphine)palladium (1.0 g, 865 μmol) was added thereto, followed by stirring at 100° C. for 2 and a half hours. Water was added to the reaction solution, and the resulting mixture was extracted with toluene. The organic layer was concentrated, and the concentrate was purified by column chromatography (developing solution: hexane/ethyl acetate=4/1). Subsequently, part of the purified product was again purified by column chromatography (developing solution: THF/acetonitrile=2/8). The purified product was dried at 40° C. under reduced pressure to obtain a compound X17 (6.3 g).

A suspension of the compound X18 (5.0 g, 9.12 mmol), bispinacolatodiborane (5.56 g, 21.9 mmol), and potassium acetate (4.56 g, 46.5 mmol) in dehydrated dimethylsulfoxide (100 ml) was heated to 60° C. under nitrogen atmosphere, then a dichloromethane adduct of dichloro[1,1'-bis(diphenylphosphino)ferrocene]palladium (II) (0.372 g, 0.456 mmol) was added thereto. The temperature of the mixture was raised to 80° C., followed by stirring for 14 hours. After allowing the reaction mixture to cool to room temperature, water was added thereto, and crystals precipitated were collected by filtration and dissolved in toluene. Magnesium sulfate and white clay were added thereto and, after stirring, the mixture was filtered. The filtrate was concentrated, and the

[Ka 52]

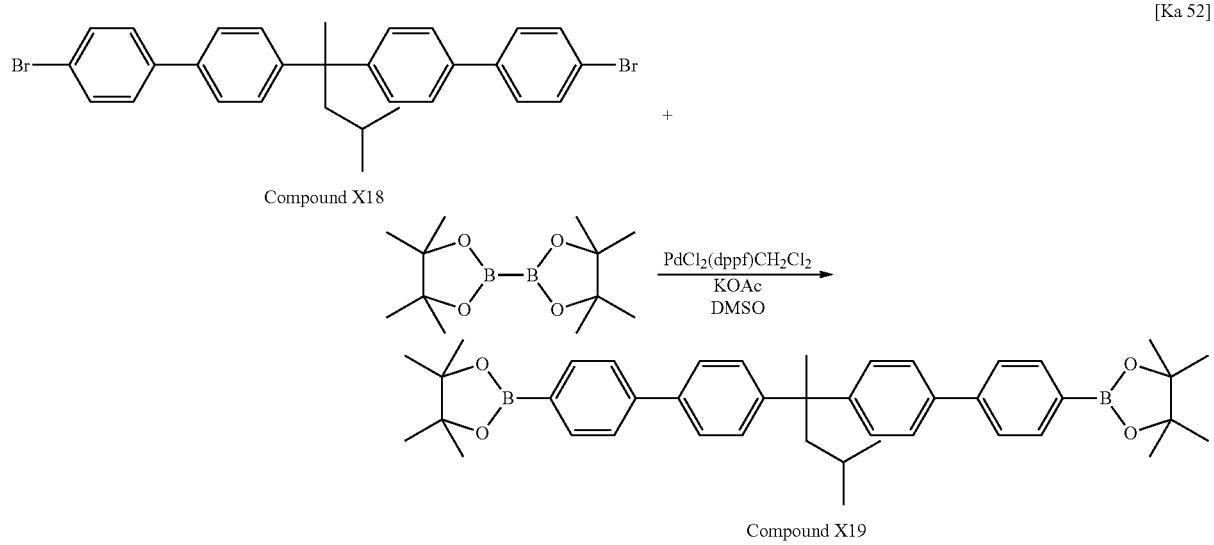

residue was purified by silica gel column chromatography to obtain a compound X19 (4.4 g, yield: 75%).

[Ka 53]

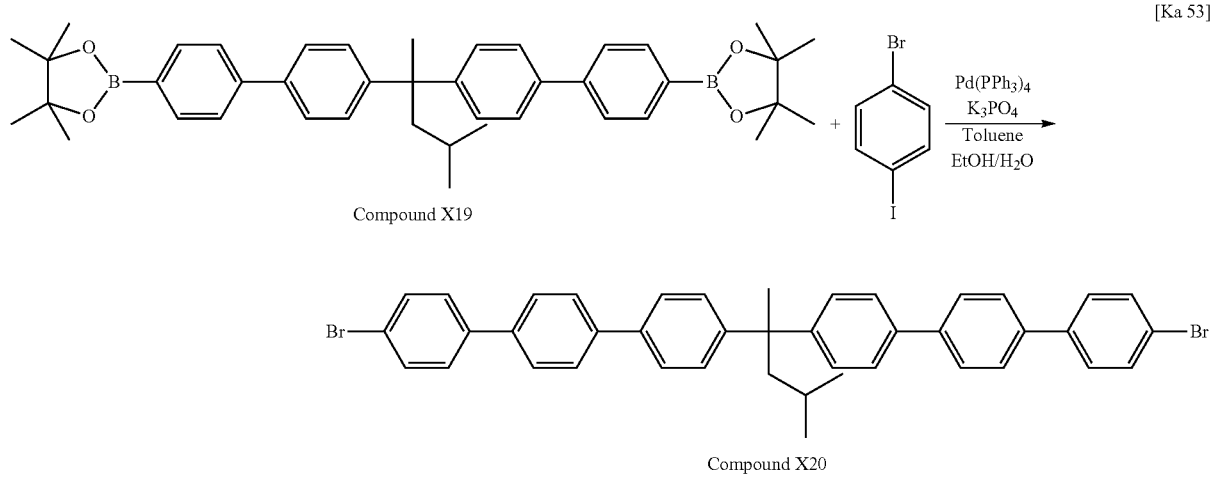

To a solution of the compound X19 (3.40 g, 5.29 mmol), 4-bromoiodobenzene (3.89 g, 13.8 mmol), toluene (34 mL), and ethanol (17 mL) were added, under nitrogen atmosphere, tetrakis(triphenylphosphine)palladium (0) (3.06 g, 0.265 mmol) and a 2M potassium triphosphate aqueous solution (8.5 mL) at room temperature, followed by refluxing for 8 and a half hours. After allowing the reaction mixture to cool to room temperature, the reaction mixture was extracted with toluene. The organic layer was washed with water and dried over magnesium sulfate, followed by concentrating under reduced pressure. The residue was purified by silica gel column chromatography and, after concentrating, a small amount of hexane was added thereto to precipitate crystals, thus a compound X20 (1.9 g, yield: 51%) being obtained.

Synthesis Example 3

Synthesis of Polymer 3

[Ka 54]

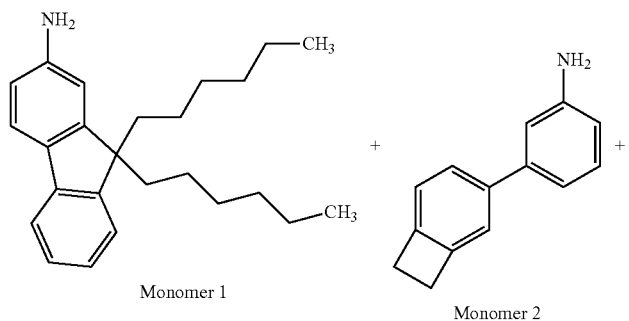

Monomer 1

Monomer 2

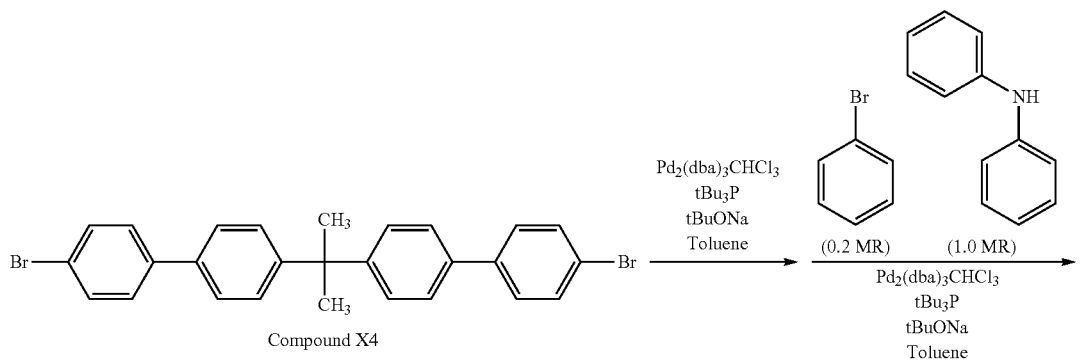

Compound X4

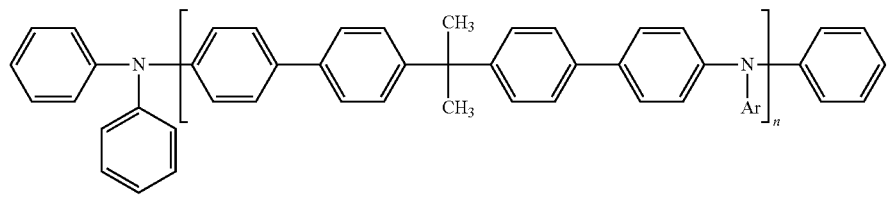

Polymer 3

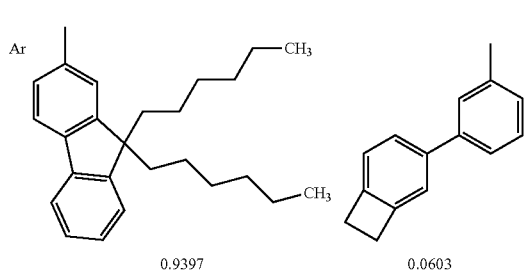

0.9397   0.0603

The monomer 1 (1.427 g, 4.0835 mmol), the monomer 2 (0.0512 g, 0.2620 mmol), the compound X4 (1.1 g, 2.1728 mmol), sodium tert-butoxide (1.42 g, 14.78 mmol), and toluene (60 mL) were charged, and the atmosphere inside the system was sufficiently purged with nitrogen, followed by heating the mixture to 60° C. (solution A). Tri-t-butylphosphine (0.07 g, 0.35 mmol) was added to a solution of tris(dibenzylideneacetone)dipalladium-chloroform complex (0.046 g, 0.0435 mmol) in 3 ml of toluene, and the resulting mixture was heated to 60° C. (solution B). The solution B was added to the solution A in a nitrogen stream, followed by refluxing under heating for 2.0 hours to react. The compound X4 (1.06 g) was additionally added thereto. The mixture was refluxed for 1.5 hours under heating, and the reaction mixture was allowed to cool, followed by dropwise adding the reaction solution to 300 ml of ethanol to crystallize a crude polymer 3.

The thus-obtained crude polymer 3 was dissolved in 100 ml of toluene, and bromobenzene (0.14 g) and sodium tert-butoxide (0.7 g) were charged therein and, after sufficiently purging the atmosphere with nitrogen, the mixture was heated to 60° C. (solution C). Tri-t-butylphosphine (0.07 g) was added to a solution of tris(dibenzylideneacetone)dipalladium-chloroform complex (0.046 g) in 3 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (0.37 g) in toluene (3 ml), and the mixture was further refluxed under heating for 4 hours to react. The reaction solution was allowed to cool, and was dropwise added to an ethanol/water (300 ml/20 ml) solution to obtain an end-capped crude polymer 3.

This end-capped crude polymer 3 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 3 (0.97 g).

Weight-average molecular weight (Mw)=85,900

Number-average molecular weight (Mn)=54,025

Degree of dispersion (Mw/Mn)=1.59

Synthesis Example 4

Synthesis of Polymer 4

Polymer 4

[Ka 55]

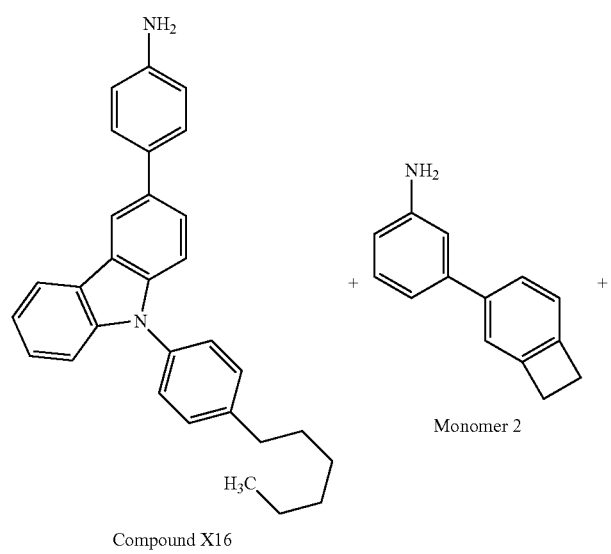

Compound X16

Monomer 2

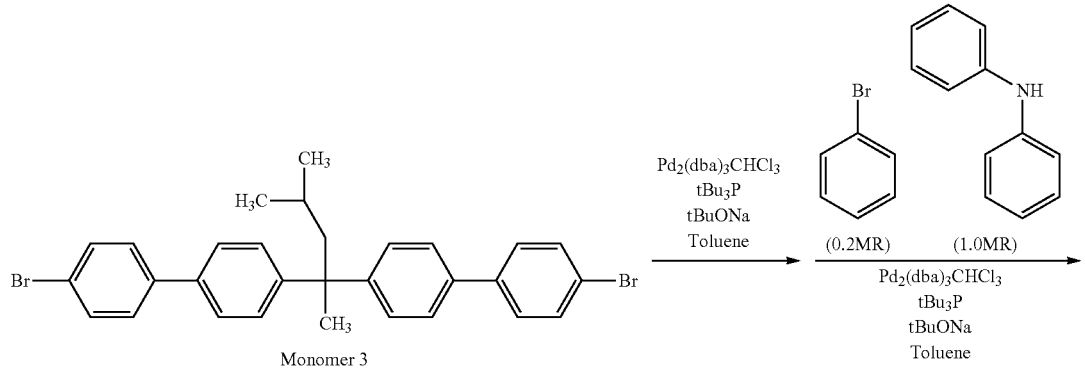

Monomer 3

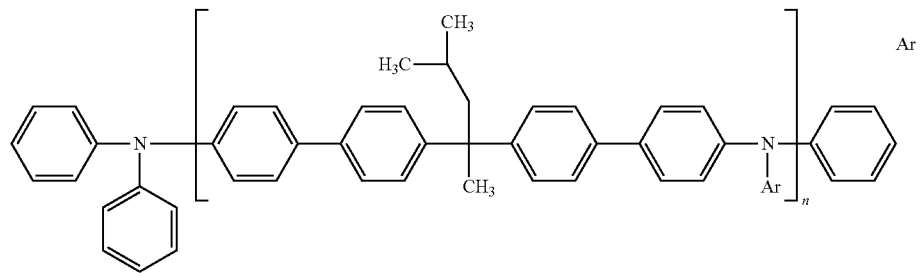

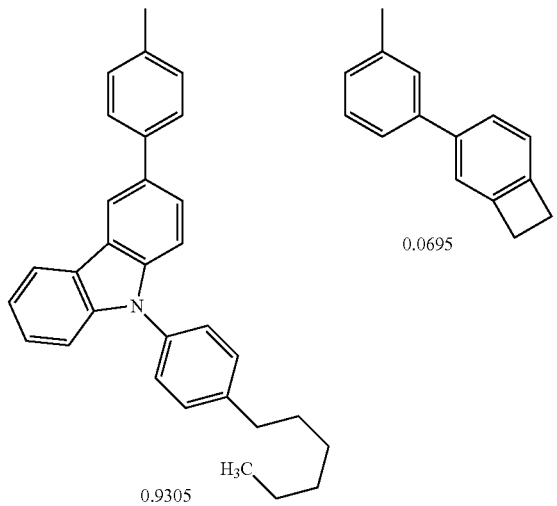

The compound X16 (2.6 g, 6.2116 mmol), the monomer 2 (0.0906 g, 0.4638 mmol), the monomer 3 (1.83 g, 3.3377 mmol), sodium tert-butoxide (2.18 g, 22.70 mmol), and toluene (20 ml) were charged, and the atmosphere inside the system was sufficiently purged with nitrogen, followed by heating the mixture to 60° C. (solution A). Tri-t-butylphosphine (0.108 g, 0.534 mmol) was added to a solution of tris(dibenzylideneacetone)dipalladium-chloroform complex (0.07 g, 0.067 mmol) in 5 ml of toluene, and the resulting mixture was heated to 60° C. (solution B). The solution B was added to the solution A in a nitrogen stream, followed by refluxing under heating for 2.0 hours to react. The monomer 3 (1.72 g) was additionally added thereto. The mixture was refluxed for 1.0 hour under heating, and the reaction mixture was allowed to cool, followed by dropwise adding the reaction solution to 300 ml of ethanol to crystallize a crude polymer 4.

The thus-obtained crude polymer 4 was dissolved in 120 ml of toluene, and bromobenzene (0.21 g) and sodium tert-butoxide (2.18 g) were charged therein and, after sufficiently purging the atmosphere with nitrogen, the mixture was heated to 60° C. (solution C). Tri-t-butylphosphine (0.108 g) was added to a solution of tris(dibenzylideneacetone)dipalladium-chloroform complex (0.07 g) in 5 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (1.13 g) in toluene (5 ml), and the mixture was further refluxed under heating for 4 hours to react. The reaction solution was allowed to cool, and was dropwise added to an ethanol/water (400 ml/30 ml) solution to obtain an end-capped crude polymer 4.

This end-capped crude polymer 4 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 4 (2.75 g).

Weight-average molecular weight (Mw)=75,000

Number-average molecular weight (Mn)=46,000

Degree of dispersion (Mw/Mn)=1.63

Synthesis Example 5
Synthesis of Polymer 5
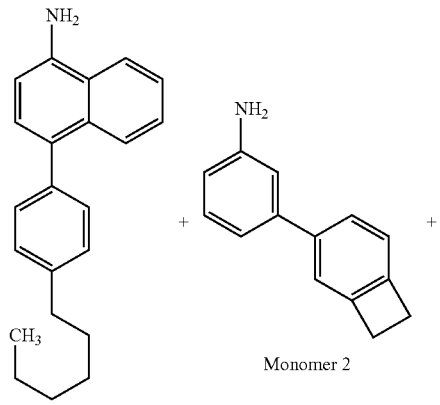
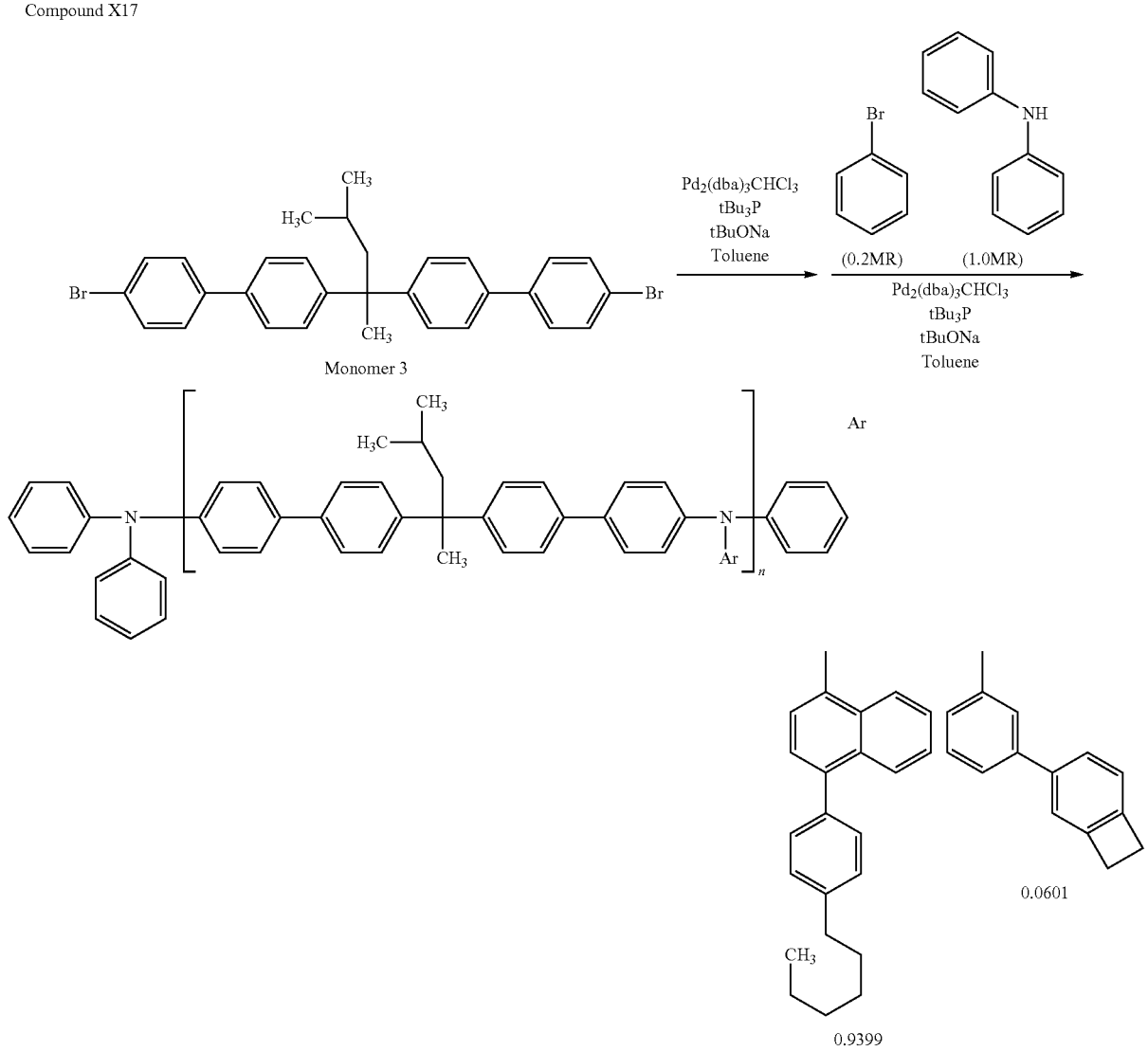

The compound X17 (3.0 g, 9.8866 mmol), the monomer 2 (0.1235 g, 0.6326 mmol), the monomer 3 (2.884 g, 5.2596 mmol), sodium tert-butoxide (3.44 g, 35.77 mmol), and toluene (30 ml) were charged, and the atmosphere inside the system was sufficiently purged with nitrogen, followed by heating the mixture to 60° C. (solution A). Tri-t-butylphosphine (0.17 g, 0.84 mmol) was added to a solution of tris(dibenzylideneacetone)dipalladium-chloroform complex (0.11 g, 0.105 mmol) in 8 ml of toluene, and the resulting mixture was heated to 60° C. (solution B). The solution B was added to the solution A in a nitrogen stream, followed by refluxing under heating for 2.0 hours to react. The monomer 3 (2.88 g) was additionally added thereto. The mixture was refluxed for 1.5 hours under heating, and the reaction mixture was allowed to cool, followed by dropwise adding the reaction solution to 300 ml of ethanol to crystallize a crude polymer 5.

The thus-obtained crude polymer 5 was dissolved in 100 ml of toluene, and bromobenzene (0.33 g) and sodium tert-butoxide (3.44 g) were charged therein and, after sufficiently purging the atmosphere with nitrogen, the mixture was heated to 60° C. (solution C). Tri-t-butylphosphine (0.17 g) was added to a solution of tris(dibenzylideneacetone)dipalladium-chloroform complex (0.11 g) in 8 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (1.78 g) in toluene (5 ml), and the mixture was further refluxed under heating for 4 hours to react. The reaction solution was allowed to cool, and was dropwise added to an ethanol/water (400 ml/30 ml) solution to obtain an end-capped crude polymer 5.

This end-capped crude polymer 5 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 5 (1.35 g).

Weight-average molecular weight (Mw)=51,000

Number-average molecular weight (Mn)=33,100

Degree of dispersion (Mw/Mn)=1.54

Synthesis Example 6

Synthesis of Polymer 6

[Ka 57]

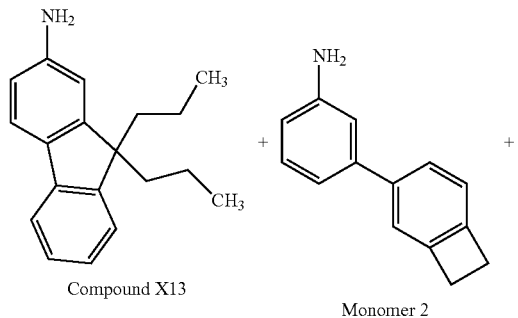

Compound X13

Monomer 2

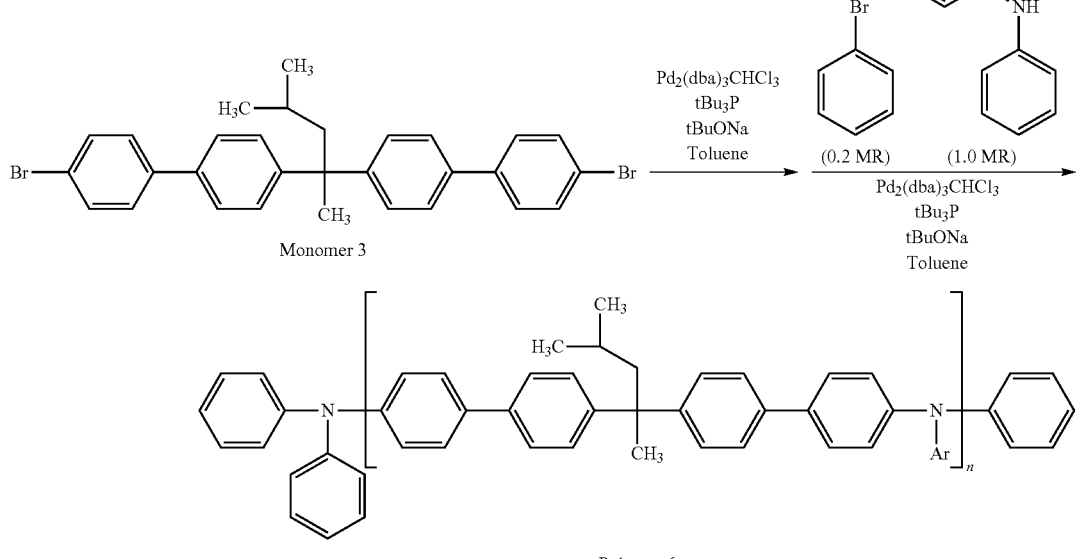

Polymer 6

-continued

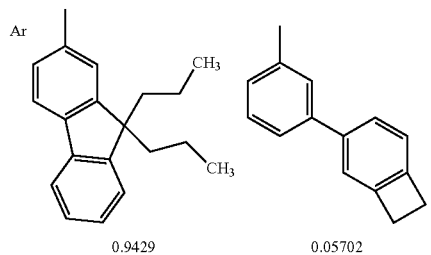

The compound X13 (1.37 g, 5.1586 mmol), the monomer 2 (0.061 g, 0.3124 mmol), the monomer 3 (1.5 g, 2.7355 mmol), sodium tert-butoxide (1.8 g, 18.6 mmol), and toluene (15 ml) were charged, and the atmosphere inside the system was sufficiently purged with nitrogen, followed by heating the mixture to 60° C. (solution A). Tri-t-butylphosphine (0.089 g, 0.438 mmol) was added to a solution of tris(dibenzylideneacetone)dipalladium-chloroform complex (0.057 g, 0.055 mmol) in 5 ml of toluene, and the resulting mixture was heated to 60° C. (solution B). The solution B was added to the solution A in a nitrogen stream, followed by refluxing under heating for 2.0 hours to react. The monomer 3 (1.38 g) was additionally added thereto. The mixture was refluxed for 1.0 hour under heating, and the reaction mixture was allowed to cool, followed by dropwise adding the reaction solution to 250 ml of ethanol to crystallize a crude polymer 6.

The thus-obtained crude polymer 6 was dissolved in 70 ml of toluene, and bromobenzene (0.17 g) and sodium tert-butoxide (1.8 g) were charged therein and, after sufficiently purging the atmosphere with nitrogen, the mixture was heated to 60° C. (solution C). Tri-t-butylphosphine (0.089 g) was added to a solution of tris(dibenzylideneacetone)dipalladium-chloroform complex (0.057 g) in 8 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (0.93 g) in toluene (5 ml), and the mixture was further refluxed under heating for 4 hours to react. The reaction solution was allowed to cool, and was dropwise added to an ethanol/water (300 ml/20 ml) solution to obtain an end-capped crude polymer 6.

This end-capped crude polymer 6 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 6 (1.5 g).

Weight-average molecular weight (Mw)=56,000

Number-average molecular weight (Mn)=38,800

Degree of dispersion (Mw/Mn)=1.44

Synthesis Example 7

Synthesis of Polymer 7

[Ka 58]

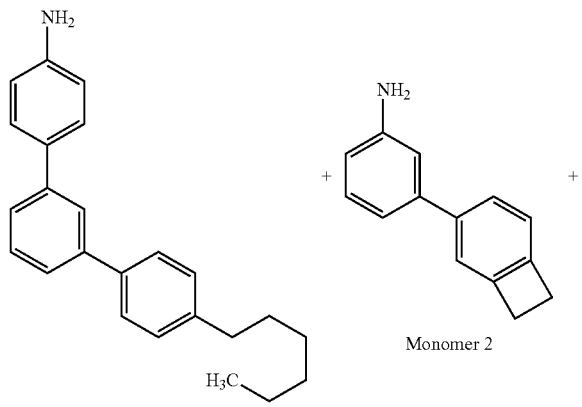

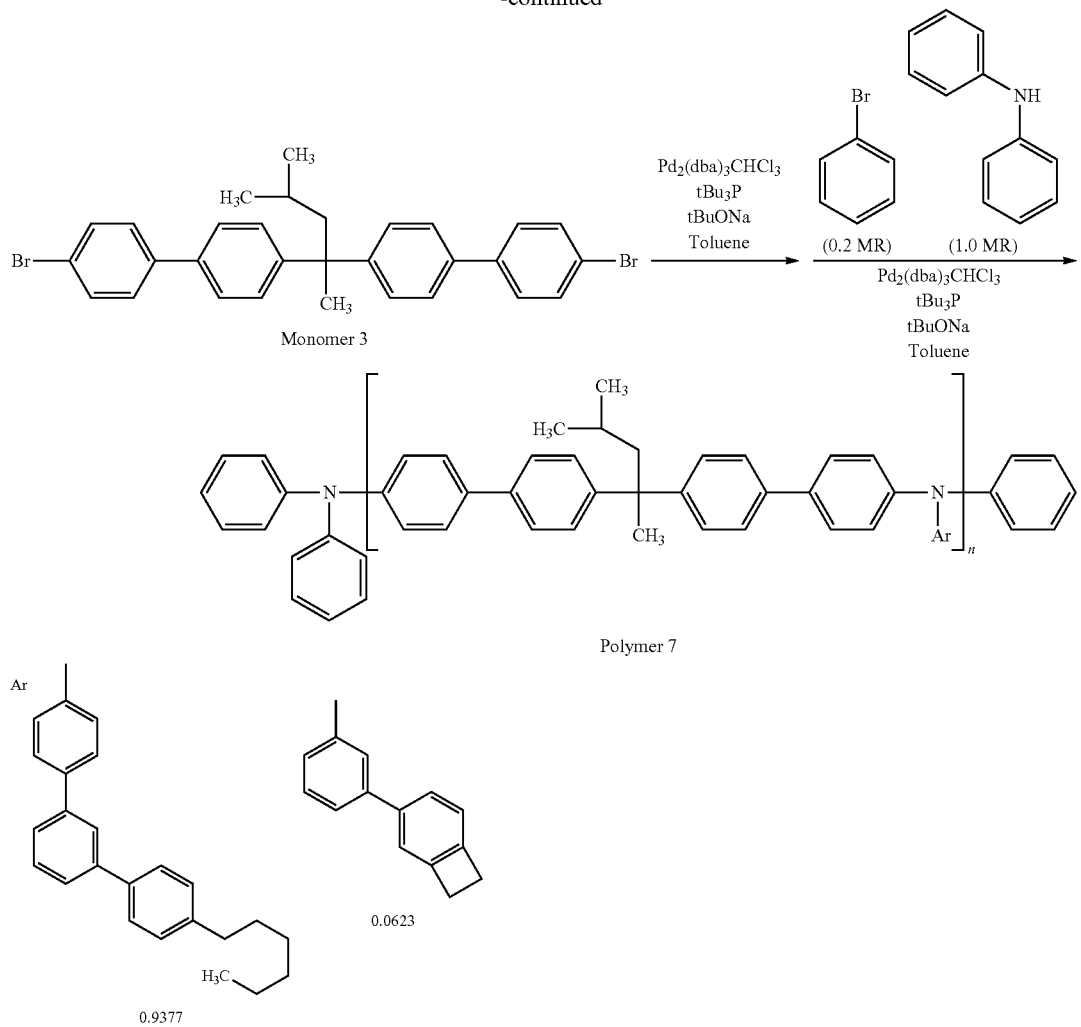

Polymer 7

The compound X11 (2.0 g, 6.0702 mmol), the monomer 2 (0.078 g, 0.4031 mmol), the monomer 3 (1.775 g, 3.2367 mmol), sodium tert-butoxide (2.2 g, 22.0 mmol), and toluene (20 ml) were charged, and the atmosphere inside the system was sufficiently purged with nitrogen, followed by heating the mixture to 60° C. (solution A). Tri-t-butylphosphine (0.105 g, 0.52 mmol) was added to a solution of tris(dibenzylideneacetone)dipalladium-chloroform complex (0.068 g, 0.065 mmol) in 5 ml of toluene, and the resulting mixture was heated to 60° C. (solution B). The solution B was added to the solution A in a nitrogen stream, followed by refluxing under heating for 2.0 hours to react. The monomer 3 (1.669 g) was additionally added thereto. The mixture was refluxed for 1.0 hour under heating, and the reaction mixture was allowed to cool, followed by dropwise adding the reaction solution to 250 ml of ethanol to crystallize a crude polymer 7.

The thus-obtained crude polymer 7 was dissolved in 100 ml of toluene, and bromobenzene (0.21 g) and sodium tert-butoxide (2.2 g) were charged therein and, after sufficiently purging the atmosphere with nitrogen, the mixture was heated to 60° C. (solution C). Tri-t-butylphosphine (0.105 g) was added to a solution of tris(dibenzylideneacetone)dipalladium-chloroform complex (0.068 g) in 5 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (1.1 g) in toluene (5 ml), and the mixture was further refluxed under heating for 4 hours to react. The reaction solution was allowed to cool, and was dropwise added to an ethanol/water (300 ml/20 ml) solution to obtain an end-capped crude polymer 7.

This end-capped crude polymer 7 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 7 (2.37 g).

Weight-average molecular weight (Mw)=53,600

Number-average molecular weight (Mn)=34,800

Degree of dispersion (Mw/Mn)=1.54

Synthesis Example 8
Synthesis of Polymer 8
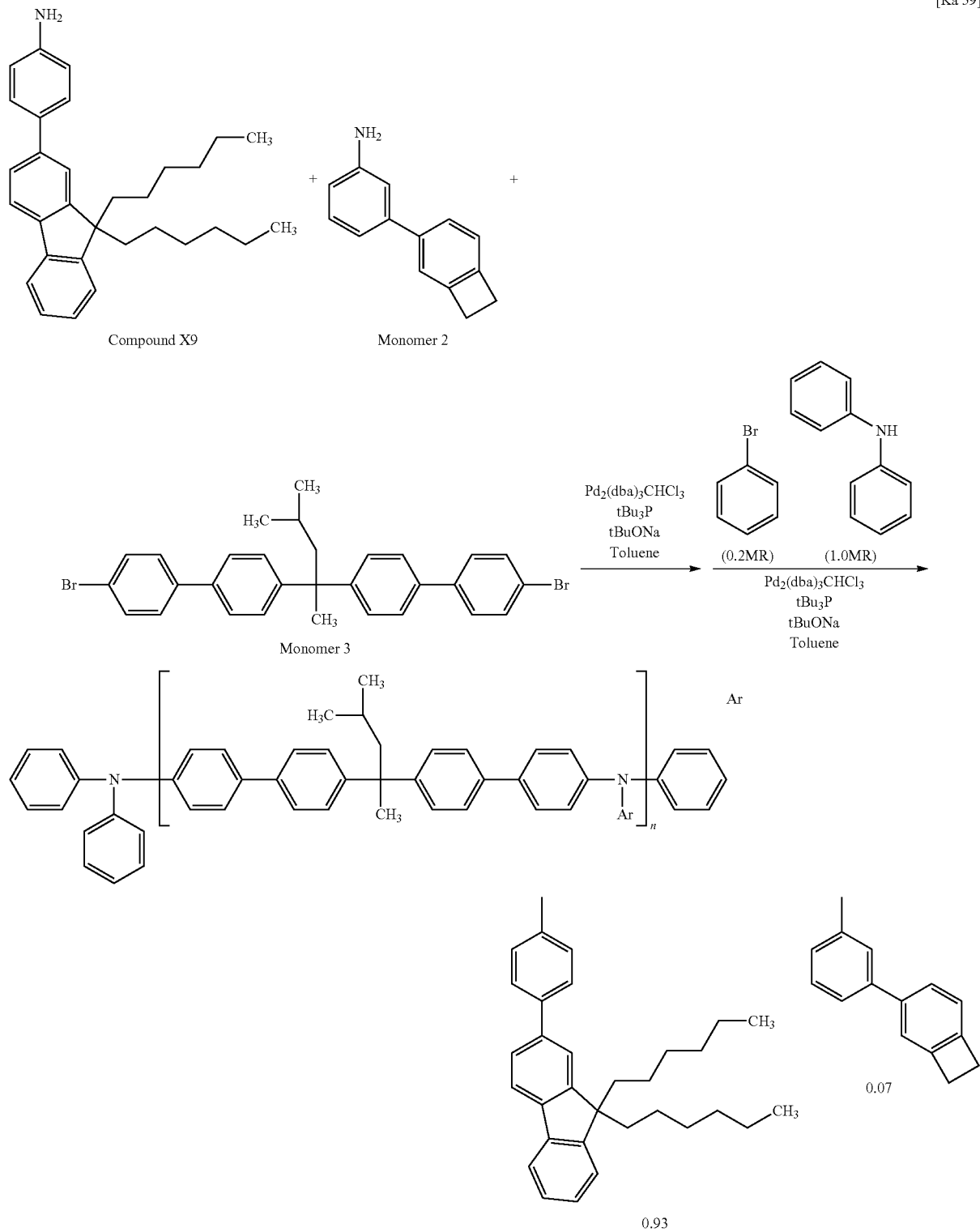

The compound X9 (2.3 g, 5.4035 mmol), the monomer 2 (0.079 g, 0.407 mmol), the monomer 3 (1.593 g, 2.9053 mmol), sodium tert-butoxide (1.9 g, 19.76 mmol), and toluene (20 ml) were charged, and the atmosphere inside the system was sufficiently purged with nitrogen, followed by heating the mixture to 60° C. (solution A). Tri-t-butylphosphine (0.094 g, 0.465 mmol) was added to a solution of tris(dibenzylideneacetone)dipalladium-chloroform complex (0.061 g, 0.058 mmol) in 5 ml of toluene, and the resulting mixture was heated to 60° C. (solution B). The solution B was added to the solution A in a nitrogen stream, followed by refluxing under heating for 2.0 hours to react. The monomer 3 (1.566 g) was additionally added thereto. The mixture was refluxed for 1.0 hour under heating, and the reaction mixture was allowed to cool, followed by dropwise adding the reaction solution to 250 ml of ethanol to crystallize a crude polymer 8.

The thus-obtained crude polymer 8 was dissolved in 50 ml of toluene, and bromobenzene (0.18 g) and sodium tert-butoxide (1.9 g) were charged therein and, after sufficiently purging the atmosphere with nitrogen, the mixture was heated to 60° C. (solution C). Tri-t-butylphosphine (0.094 g) was added to a solution of tris(dibenzylideneacetone)dipalladium-chloroform complex (0.061 g) in 5 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (0.98 g) in toluene (5 ml), and the mixture was further refluxed under heating for 4 hours to react. The reaction solution was allowed to cool, and was dropwise added to an ethanol/water (300 ml/20 ml) solution to obtain an end-capped crude polymer 8.

This end-capped crude polymer 8 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 8 (0.9 g).

Weight-average molecular weight (Mw)=37,000

Number-average molecular weight (Mn)=27,600

Degree of dispersion (Mw/Mn)=1.34

Synthesis Example 9

Synthesis of Polymer 9

Polymer 9

[Ka 60]

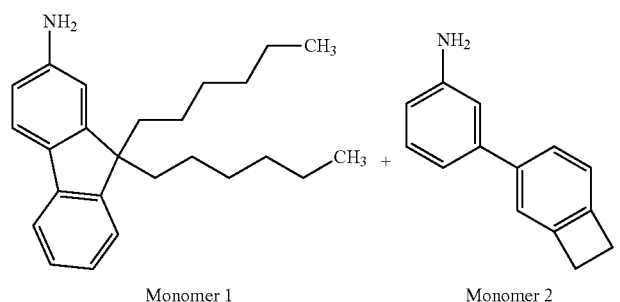

Monomer 1    Monomer 2

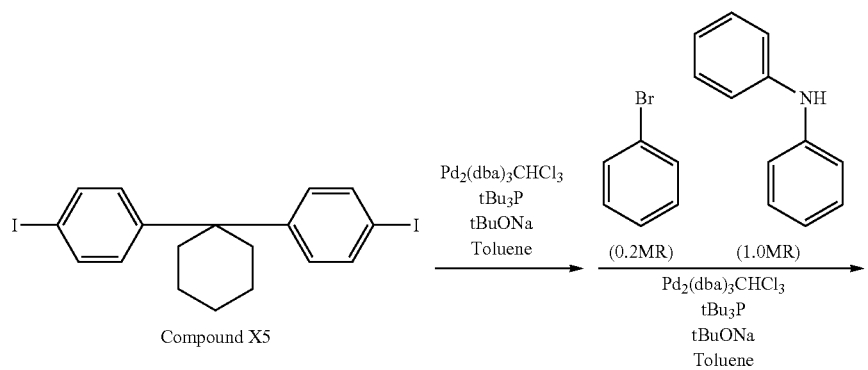

Compound X5

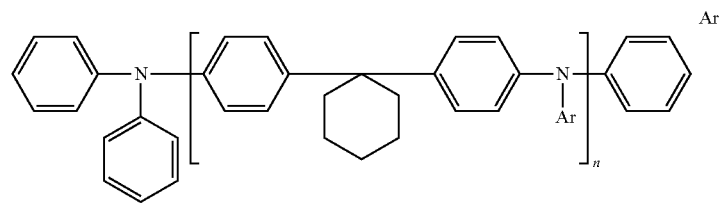

-continued

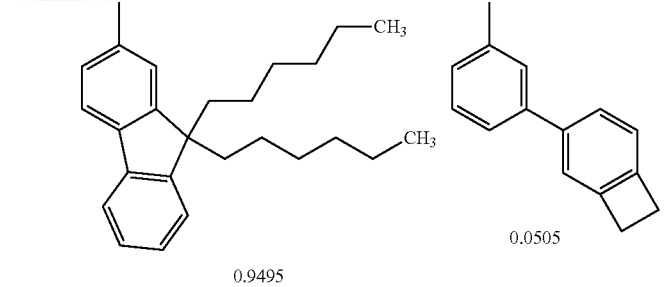

The compound X5 (1.9 g, 3.8924 mmol), the monomer 1 (2.58 g, 7.3915 mmol), the monomer 2 (0.077 g, 0.3932 mmol), sodium tert-butoxide (2.54 g, 26.47 mmol), and toluene (15 ml) were charged, and the atmosphere inside the system was sufficiently purged with nitrogen, followed by heating the mixture to 60° C. (solution A). Tri-t-butylphosphine (0.126 g, 0.624 mmol) was added to a solution of tris(dibenzylideneacetone)dipalladium-chloroform complex (0.082 g, 0.078 mmol) in 5 ml of toluene, and the resulting mixture was heated to 60° C. (solution B). The solution B was added to the solution A in a nitrogen stream, followed by refluxing under heating for 2.0 hours to react. The compound X5 (1.9 g) was additionally added thereto. The mixture was refluxed for 1.0 hour under heating, and the reaction mixture was allowed to cool, followed by dropwise adding the reaction solution to 250 ml of ethanol to crystallize a crude polymer 9.

The thus-obtained crude polymer 9 was dissolved in 40 ml of toluene, and bromobenzene (0.25 g) and sodium tert-butoxide (2.54 g) were charged therein and, after sufficiently purging the atmosphere with nitrogen, the mixture was heated to 64° C. (solution C). Tri-t butylphosphine (0.126 g) was added to a solution of tris(dibenzylideneacetone)dipalladium-chloroform complex (0.082 g) in 5 ml of toluene, and the resulting mixture was heated to 60° C. (solution D). The solution D was added to the solution C in a nitrogen stream, and the mixture was refluxed under heating for 2 hours to react. To this reaction solution was added a solution of N,N-diphenylamine (1.3 g) in toluene (5 ml), and the mixture was further refluxed under heating for 4 hours to react. The reaction solution was allowed to cool, and was dropwise added to an ethanol/water (200 ml/10 ml) solution to obtain an end-capped crude polymer 9.

This end-capped crude polymer 9 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 9 (1.93 g).

Weight-average molecular weight (Mw)=26,000

Number-average molecular weight (Mn)=17,800

Degree of dispersion (Mw/Mn)=1.46

Synthesis Example 10

Synthesis of Polymer 10

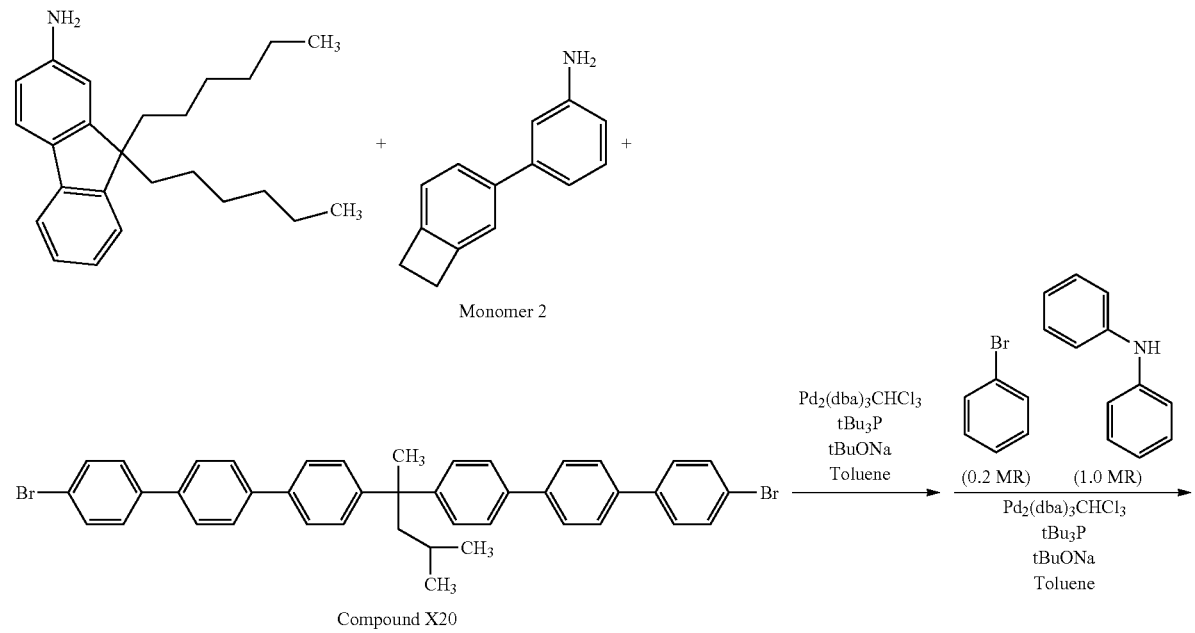

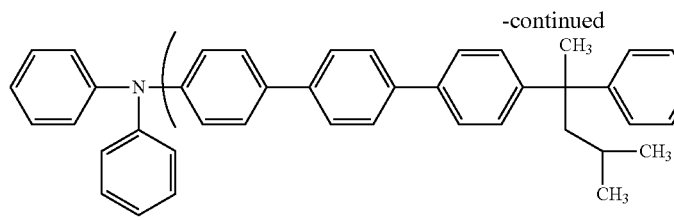
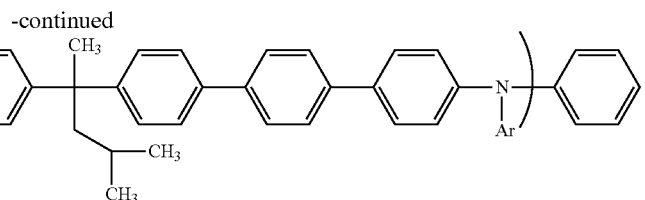

Polymer 10

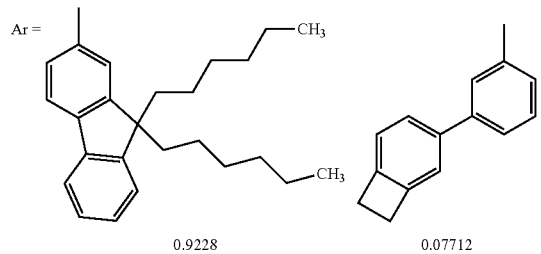

0.9228      0.07712

The monomer 1 (0.5526 g, 1.581 mmol), the monomer 2 (0.0258 g, 0.1320 mmol), the compound X20 (0.6000 g, 0.856 mmol), sodium tert-butoxide (0.5597 g, 5.824 mmol), and toluene (6 ml) were charged, and the atmosphere inside the system was sufficiently purged with nitrogen, followed by heating the mixture to 60° C. (solution A). Tri-t-butylphosphine (0.0277 g, 0.137 mmol) was added to a solution of tris(dibenzylideneacetone)dipalladium-chloroform complex (0.0177 g, 0.0171 mmol) in 3 ml of toluene, and the resulting mixture was heated to 65° C. (solution B). The solution B was added to the solution A in a nitrogen stream, followed by refluxing under heating for 2.0 hours to react. The compound $X^{20}$ (0.5436 g) was additionally added thereto. The mixture was refluxed for 1.5 hours under heating, and the reaction mixture was allowed to cool, followed by dropwise adding the reaction solution to 300 ml of ethanol to crystallize a crude polymer 10.

The thus-obtained crude polymer 10 was dissolved in 80 ml of toluene, and bromobenzene (0.53 g) and sodium tert-butoxide (0.62 g) were charged therein and, after sufficiently purging the atmosphere with nitrogen, the mixture was heated to 65° C. (solution C). Tri-t-butylphosphine (0.014 g) was added to a solution of tris(dibenzylideneacetone)dipalladium-chloroform complex (0.088 g) in 3 ml of toluene, and the resulting mixture was heated to 60° C. (solution D). The solution D was added to the solution C in a nitrogen stream, and the mixture was refluxed under heating for 2 hours to react. To this reaction solution were added a solution of N,N-diphenylamine (0.144 g) and a newly prepared solution D, and the mixture was further refluxed under heating for 4 hours to react. The reaction solution was allowed to cool, and was dropwise added to an ethanol/water (600 ml/60 ml) solution to obtain an end-capped crude polymer 10.

This end-capped-crude polymer 10 was dissolved in toluene and reprecipitated from acetone, and the precipitated polymer was collected by filtration. The thus-obtained polymer was dissolved in toluene, washed with dilute hydrochloric acid, and reprecipitated with ammonia-containing ethanol. The polymer obtained by filtration was purified by column chromatography to obtain an end polymer 10 (0.685 g).

Weight-average molecular weight (Mw)=57,100

Number-average molecular weight (Mn)=36,100

Degree of dispersion (Mw/Mn)=1.58

Synthesis Example 11

Synthesis of Polymer 11

[Ka 62]

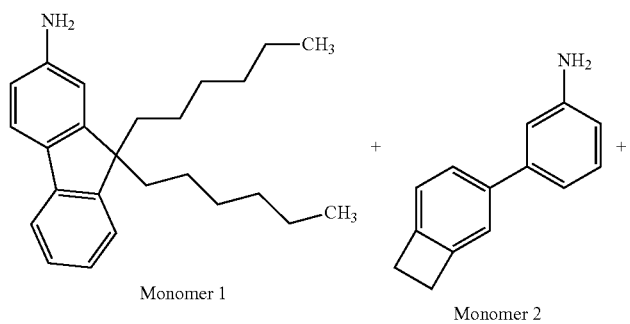

Monomer 1      Monomer 2

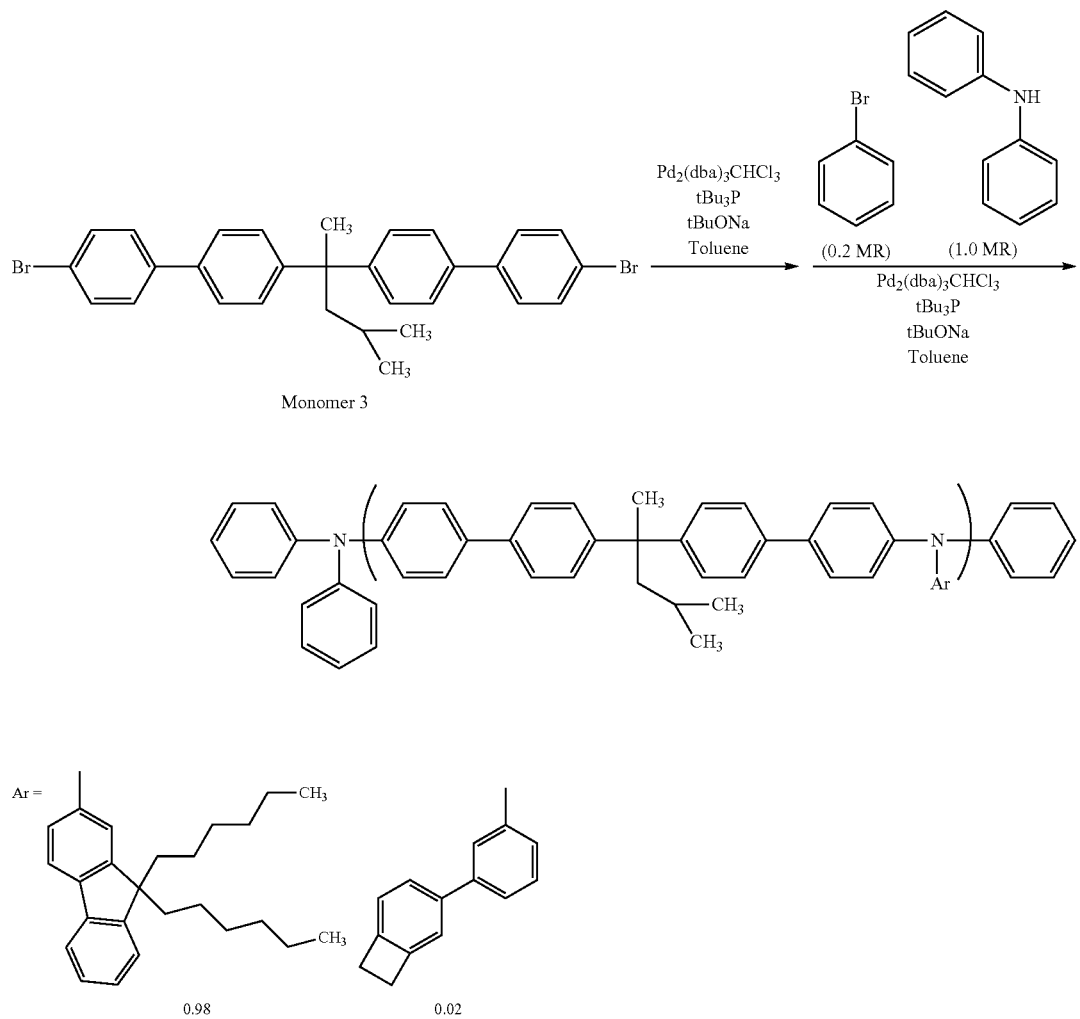

The monomer 1 (2.488 g, 7.149 mmol), the monomer 2 (0.0285 g, 0.146 mmol), the monomer 3 (2.000 g, 3.647 mmol), sodium tert-butoxide (2.383 g, 24.8 mmol), and toluene (20 ml) were charged, and the atmosphere inside the system was sufficiently purged with nitrogen, followed by heating the mixture to 65° C. (solution A). Tri-t-butylphosphine (0.1180 g, 0.584 mmol) was added to a solution of tris(dibenzylideneacetone)dipalladium-chloroform complex (0.0755 g, 0.0729 mmol) in 3 ml of toluene, and the resulting mixture was heated to 65° C. (solution B). The solution B was added to the solution A in a nitrogen stream, followed by refluxing under heating for 2.0 hours to react. The monomer 3 (1.96 g) was additionally added thereto. The mixture was refluxed for 1.5 hours under heating, and the reaction mixture was allowed to cool, followed by dropwise adding the reaction solution to a solution of ethanol/water (500 ml/50 ml) to crystallize a crude polymer 11.

The thus-obtained crude polymer 11 was dissolved in toluene, and reprecipitated from acetone, followed by collecting a precipitated polymer. The thus-obtained crude polymer 11 was dissolved in 100 ml of toluene, and bromobenzene (0.229 g) and sodium tert-butoxide (2.24 g) were charged therein and, after sufficiently purging the atmosphere with nitrogen, the mixture was heated to 65° C. (solution C). Tri-t-butylphosphine (0.059 g) was added to a solution of tris(dibenzylideneacetone)dipalladium-chloroform complex (0.0377 g) in 3 ml of toluene, and the resulting mixture was heated to 65° C. (solution D). The solution D was added to the solution C in a nitrogen stream, and the mixture was refluxed under heating for 2 hours to react. To this reaction solution were added a solution of N,N-diphenylamine (0.617 g) and a newly prepared solution D, and the mixture was further refluxed under heating for 4 hours to react. The reaction solution was allowed to cool, and was dropwise added to an ethanol/water (300 ml/30 ml) solution to obtain an end-capped crude polymer 11.

This end-capped crude polymer 11 was dissolved in toluene, washed with dilute hydrochloric acid, and reprecipitated with ammonia-containing ethanol. The polymer obtained by filtration was purified by column chromatography to obtain an end polymer 11 (0.89 g).

Weight-average molecular weight (Mw)=146,000

Number-average molecular weight (Mn)=91,800

Degree of dispersion (Mw/Mn)=1.59

Synthesis Example 12

Synthesis of Polymer 12

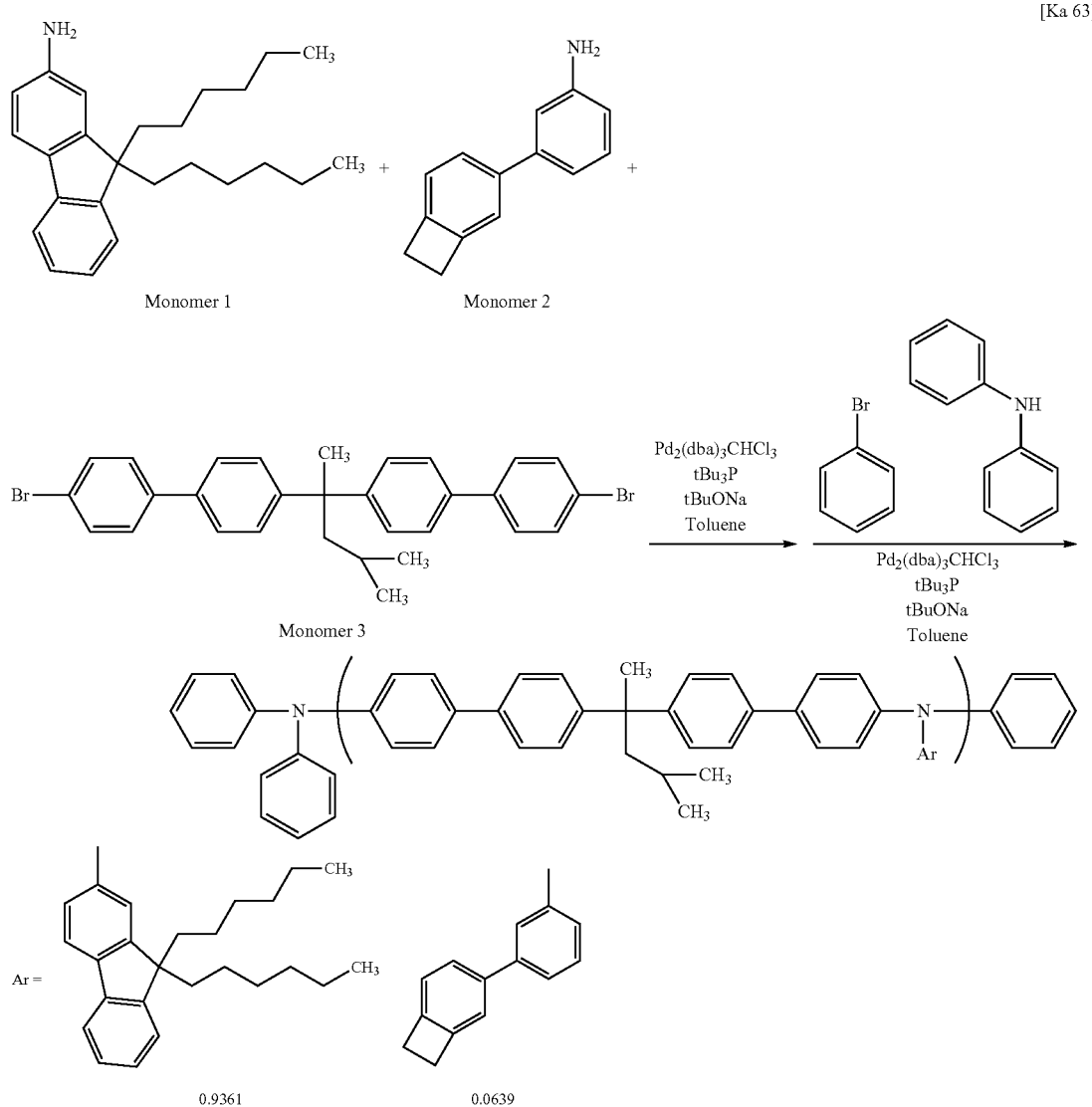

The monomer 1 (5.980 g, 16.85 mmol), the monomer 2 (0.2246 g, 1.15 mmol), the monomer 3 (4.935 g, 9.00 mmol), sodium tert-butoxide (5.88 g, 61.2 mmol), and toluene (50 ml) were charged, and the atmosphere inside the system was sufficiently purged with nitrogen, followed by heating the mixture to 65° C. (solution A). Tri-t-butylphosphine (0.175 g, 0.864 mmol) was added to a solution of tris(dibenzylidene-acetone)dipalladium-chloroform complex (0.112 g, 0.108 mmol) in 5 ml of toluene, and the resulting mixture was heated to 65° C. (solution B). The solution B was added to the solution A in a nitrogen stream, followed by refluxing under heating for 2.0 hours to react. The monomer 3 (4.639 g, 8.46 mmol) was additionally added thereto. The mixture was refluxed for 2.5 hours under heating, and the reaction mixture was allowed to cool, followed by dropwise adding the reaction solution to 750 ml of ethanol solution to crystallize a crude polymer 12.

The thus-obtained crude polymer 12 was dissolved in 140 ml of toluene, and bromobenzene (0.565 g) and sodium tert-butoxide (2.94 g) were charged therein and, after sufficiently purging the atmosphere with nitrogen, the mixture was heated to 65° C. (solution C). Tri-t-butylphosphine (0.088 g) was added to a solution of tris(dibenzylideneacetone)dipalladium-chloroform complex (0.056 g) in 5 ml of toluene, and the resulting mixture was heated to 65° C. (solution D). The solution D was added to the solution C in a nitrogen stream, and the mixture was refluxed under heating for 2 hours to react. To this reaction solution were added a solution of N,N-diphenylamine (3.042 g) and a newly prepared solution D, and the resulting mixture was further refluxed under heating for 4 hours to react. The reaction solution was allowed to cool, and was dropwise added to ethanol (750 ml) solution to obtain an end-capped crude polymer 12.

This end-capped crude polymer 12 was dissolved in toluene, washed with dilute hydrochloric acid, and reprecipitated with ammonia-containing ethanol. The polymer obtained by filtration was purified by column chromatography to obtain an end polymer 12 (6.53 g).

Weight-average molecular weight (Mw)=76,400

Number-average molecular weight (Mn)=52,500

Degree of dispersion (Mw/Mn)=1.45

Synthesis Example 13

Synthesis of Polymer 13

[Ka 64]

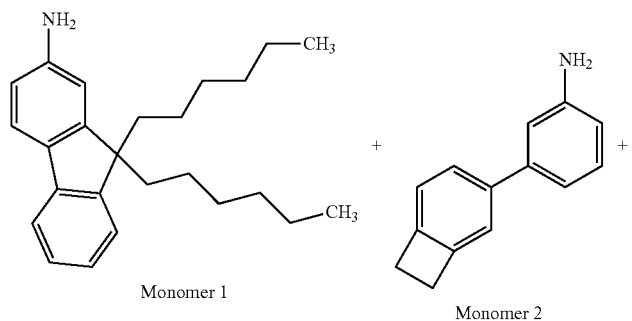

Monomer 1    Monomer 2

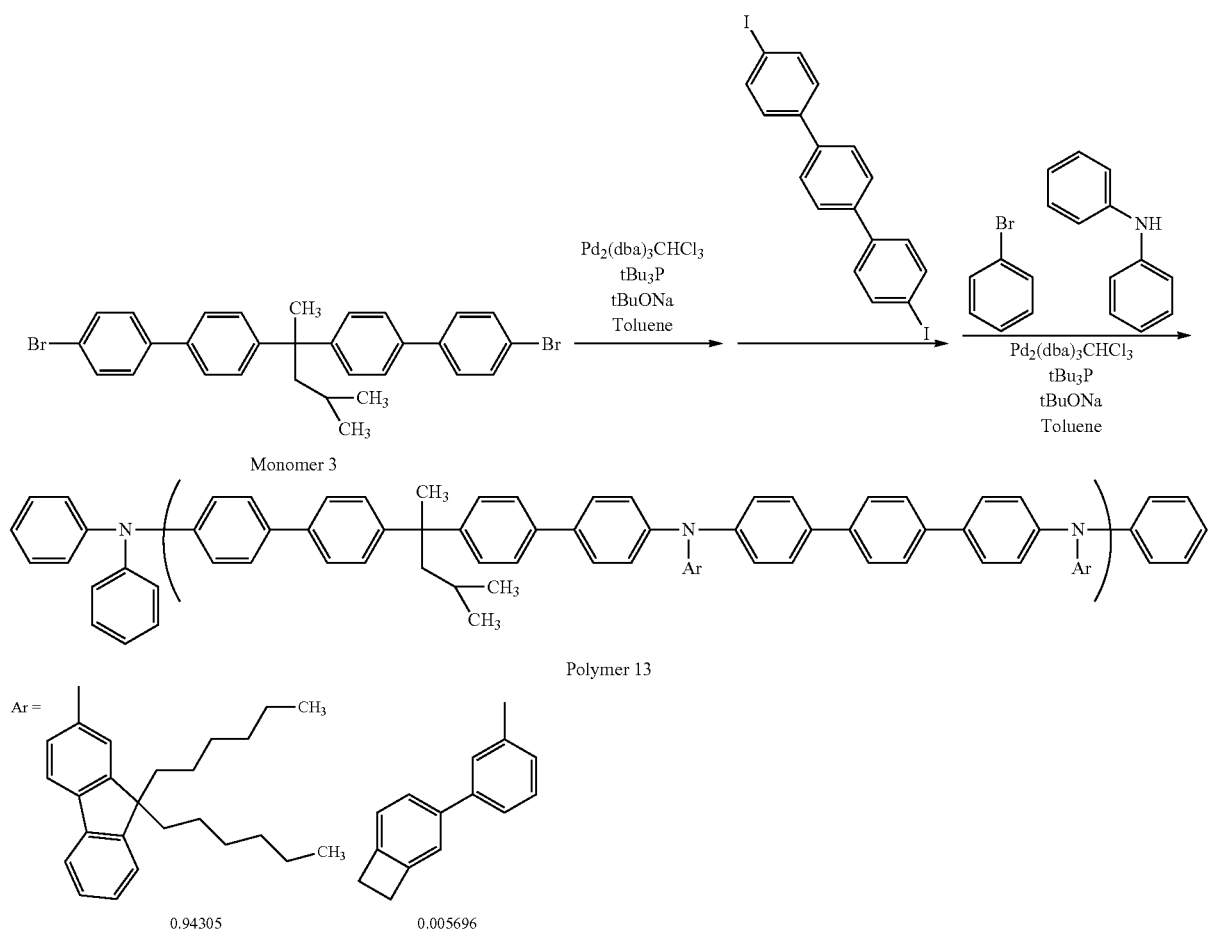

Polymer 13

The monomer 1 (1.803 g, 5.159 mmol), the monomer 2 (0.0608 g, 0.312 mmol), the monomer 3 (1.500 g, 2.735 mmol), sodium tert-butoxide (1.788 g, 18.6 mmol), and toluene (15 ml) were charged, and the atmosphere inside the system was sufficiently purged with nitrogen, followed by heating the mixture to 65° C. (solution A). Tri-t-butylphosphine (0.088 g, 0.438 mmol) was added to a solution of tris(dibenzylideneacetone)dipalladium-chloroform complex (0.057 g, 0.0547 mmol) in 3 ml of toluene, and the resulting mixture was heated to 65° C. (solution B). The solution B was added to the solution A in a nitrogen stream, followed by refluxing under heating for 2.0 hours to react. Diiodo-terphenyl (1.239 g) was added thereto. The mixture was refluxed for 1.5 hours under heating, and the reaction mixture was allowed to cool, followed by dropwise adding the reaction solution to 500 ml of ethanol to crystallize a crude polymer 13.

The thus-obtained crude polymer 13 was dissolved in 120 ml of toluene, and bromobenzene (0.080 g) and sodium tert-butoxide (1.61 g) were charged therein and, after sufficiently purging the atmosphere with nitrogen, the mixture was heated to 65° C. (solution C). Tri-t-butylphosphine (0.045 g) was added to a solution of tris(dibenzylideneacetone)dipalladium-chloroform complex (0.028 g) in 3 ml of toluene, and the resulting mixture was heated to 65° C. (solution D). The solution D was added to the solution C in a nitrogen stream, and the mixture was refluxed under heating for 2 hours to react. To this reaction solution were added a solution of N,N-diphenylamine (0.462 g) and a newly prepared solution D, and the mixture was further refluxed under heating for 4 hours to react. The reaction solution was allowed to cool, and was dropwise added to 500 ml of ethanol to obtain an end-capped crude polymer 13.

This end-capped crude polymer 13 was dissolved in toluene, reprecipitated from acetone, and a precipitated polymer was collected by filtration. The crude polymer was dissolved in toluene, washed with dilute hydrochloric acid, and reprecipitated with ammonia-containing ethanol. The polymer obtained by filtration was purified by column chromatography to obtain an end polymer 13 (1.55 g).

Weight-average molecular weight (Mw)=74,000

Number-average molecular weight (Mn)=48,600

Degree of dispersion (Mw/Mn)=1.52

Synthesis Example 14

Synthesis of Polymer 14

Polymer 14

[Ka 65]

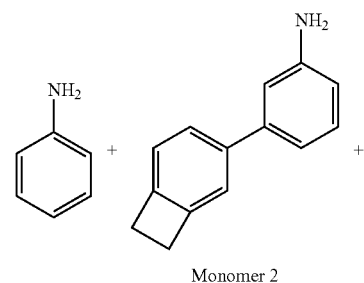

Monomer 2

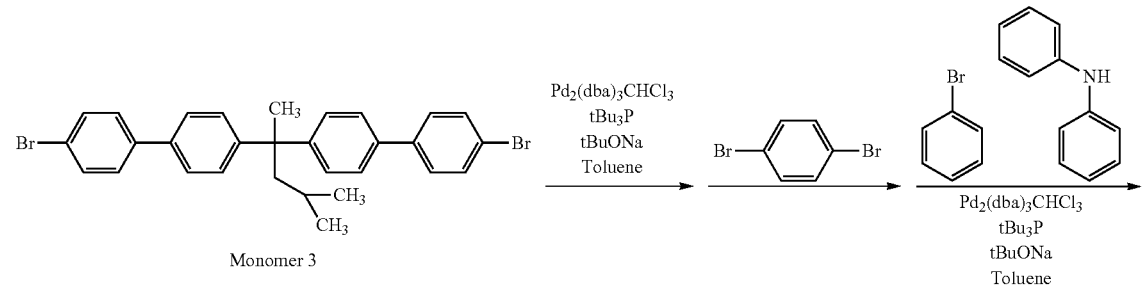

Monomer 3

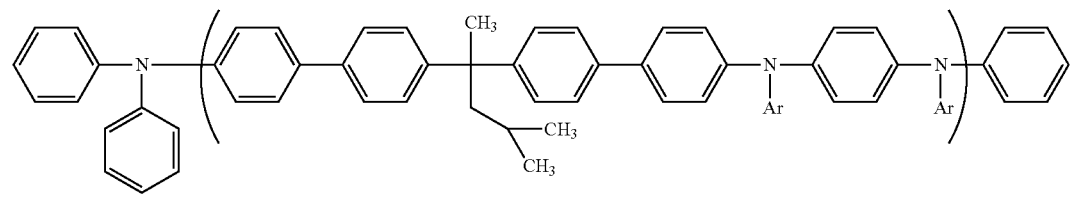

Ar = 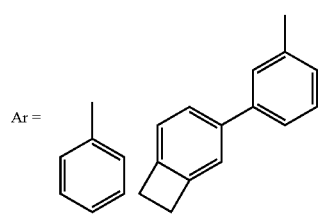

Aniline (0.9533 g, 10.23 mmol), the monomer 2 (0.5208 g, 2.667 mmol), the monomer 3 (3.538 g, 6.452 mmol), sodium tert-butoxide (3.968 g, 41.29 mmol), and toluene (35 ml) were charged, and the atmosphere inside the system was sufficiently purged with nitrogen, followed by heating the mixture to 65° C. (solution A). Tri-t-butylphosphine (0.209 g, 1.032 mmol) was added to a solution of tris(dibenzylideneacetone)dipalladium-chloroform complex (0.134 g, 0.129 mmol) in 3 ml of toluene, and the resulting mixture was heated to 65° C. (solution B). The solution B was added to the solution A in a nitrogen stream, followed by refluxing under heating for 2.0 hours to react. Dibromobenzene (1.46 g) was additionally added thereto. The mixture was refluxed for 2.0 hours under heating, and the reaction mixture was allowed to cool, followed by dropwise adding the reaction solution to 500 ml of ethanol to crystallize a crude polymer 14.

The thus-obtained crude polymer 14 was dissolved in 100 ml of toluene, and bromobenzene (0.405 g) and sodium tert-butoxide (3.968 g) were charged therein and, after sufficiently purging the atmosphere with nitrogen, the mixture was heated to 65° C. (solution C). Tri-t-butylphosphine (0.104 g) was added to a solution of tris(dibenzylideneacetone)dipalladium-chloroform complex (0.066 g) in 3 ml of toluene, and the resulting mixture was heated to 65° C. (solution D). The solution D was added to the solution C in a nitrogen stream, and the mixture was refluxed under heating for 2 hours to react. To this reaction solution were added a solution of N,N-diphenylamine (1.09 g) and a newly prepared solution D, and the mixture was further refluxed under heating for 4 hours to react. The reaction solution was allowed to cool, and was dropwise added to 500 ml of ethanol to obtain an end-capped crude polymer 14.

This end-capped crude polymer 14 was dissolved in toluene, reprecipitated from acetone, and a precipitated polymer was collected by filtration. The crude polymer was dissolved in toluene, washed with dilute hydrochloric acid, and reprecipitated with ammonia-containing ethanol. The polymer obtained by filtration was purified by column chromatography to obtain an end polymer 14 (1.56 g).

Weight-average molecular weight (Mw)=78,500

Number-average molecular weight (Mn)=54,100

Degree of dispersion (Mw/Mn)=1.45

Although the invention has been described in detail and by reference to specific embodiments, it is apparent to those skilled in the art that it is possible to add various alterations and modifications insofar as the alterations and modifications do not deviate from the spirit and the scope of the invention. This application is based on a Japanese patent application filed on Feb. 10, 2010 (Japanese Patent Application No. 2010-027585), and the contents thereof are incorporated herein by reference.

INDUSTRIAL APPLICABILITY

The present invention can suitably be used in various field where organic electroluminescent elements are used, for example, in the fields of flat panel displays (e.g., displays for Office Automation (OA), computers, and wall-mounted TV receivers), light sources taking advantage of the feature of a surface light emitter (e.g., the light source of a copier and the backlight of a liquid-crystal display or instrument), display panels, marker lights, and the like.

DESCRIPTION OF REFERENCE NUMBERS AND SIGNS

1: Substrate
2: Anode
3: Hole injection layer
4: Hole-transporting layer
5: Luminescent layer
6: Hole-blocking layer
7: Electron-transporting layer
8: Electron injection layer
9: Cathode

The invention claimed is:

1. A polymer, which has a weight-average molecular weight (Mw) of 20,000 or more and a degree of dispersion (Mw/Mn) of 2.5 or less, comprising a repeating unit represented by the following general formula (1) and a cross-linkable group:

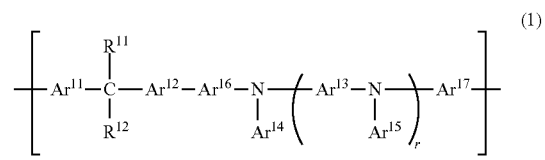

wherein:
Ar$^{11}$ is a biphenylene group or a terphenylene group,
Ar$^{12}$ and Ar$^{13}$ each independently represents a divalent aromatic group which may have a substituent,
Ar$^{14}$ and Ar$^{15}$ each independently represents an aromatic group which may have a substituent,
Ar$^{16}$ and Ar$^{17}$ each independently represents a direct bond or a divalent aromatic group which may have a substituent, with the proviso that at least one of Ar$^{16}$ and Ar$^{17}$ represents a divalent aromatic group which may have a substituent,
R$^{11}$ and R$^{12}$ each independently represents a hydrogen atom, an alkyl group which may have a substituent, or an alkoxy group which may have a substituent,
r represents an integer of from 0 to 5, and
R$^{11}$ and R$^{12}$ may be connected to each other to form a ring structure,
wherein the repeating unit represented by the above-described general formula (1) may contain the cross-linkable group, and wherein the cross-linkable group is at least one group selected from the group T of the following cross-linkable groups:

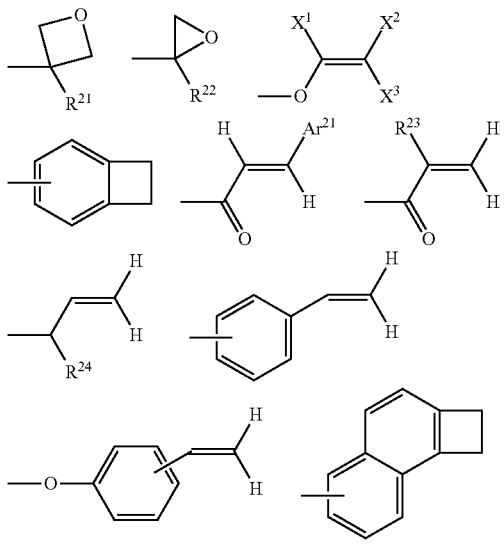

wherein:
R²¹ to R²³ each independently represents a hydrogen atom or an alkyl group which may have a substituent,
Ar²¹ represents an aromatic group which may have a substituent,
X¹, X², and X³ each independently represents a hydrogen atom or a halogen atom, and
R²⁴ represents a hydrogen atom or a vinyl group,
wherein the benzocyclobutene ring may have substituent(s), and the substituents may be connected to each other to form a ring.

2. An organic electroluminescent element material comprising the polymer of claim 1.

3. An organic electroluminescent element composition comprising the polymer of claim 1.

4. An organic electroluminescent element comprising, on a substrate, an anode, a cathode, and one or more organic layers provided between these two electrodes, wherein at least one of the organic layers contains a network polymer formed by cross-linking the polymer of claim 1.

5. The organic electroluminescent element according to claim 4, wherein the layer containing the network polymer is a hole injection layer or a hole-transporting layer.

6. The organic electroluminescent element according to claim 4, wherein the layer containing the network polymer is a hole-transporting layer.

7. The organic electroluminescent element according to claim 5, which further comprises a luminescent layer, and all of the hole injection layer, the hole-transporting layer, and the luminescent layer are formed by a wet film formation method.

8. A display device comprising the organic electroluminescent element of claim 4.

9. A lighting device comprising the organic electroluminescent element of claim 4.

10. The polymer according to claim 1, wherein the number of the cross-linkable groups which the polymer has per 1000 molecular weight, is from 0.01 to 3.0.

11. The polymer according to claim 1, wherein the number of the cross-linkable groups which the polymer has per 1000 molecular weight, is from 0.01 to 2.0.

12. The polymer according to claim 1, wherein the number of the cross-linkable groups which the polymer has per 1000 molecular weight, is from 0.05 to 1.0.

13. The polymer according to claim 1, wherein the cross-linkable group is a group represented by formula (II-a):

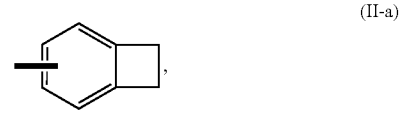

(II-a)

wherein the benzocyclobutene ring in formula (II-a) may have substituent(s), and the substituents may be connected to each other to form a ring.

14. The polymer according to claim 1, wherein Ar¹¹ is a biphenylene group.

15. The polymer according to claim 1, wherein Ar¹¹ is a terphenylene group.

* * * * *